(12) United States Patent
Ooishi et al.

(10) Patent No.: US 6,424,582 B1
(45) Date of Patent: *Jul. 23, 2002

(54) SEMICONDUCTOR MEMORY DEVICE HAVING REDUNDANCY

(75) Inventors: Tsukasa Ooishi; Hideto Hidaka, both of Hyogo (JP)

(73) Assignee: Mitsubishi Denki Kasbushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/433,747

(22) Filed: Nov. 4, 1999

Related U.S. Application Data

(63) Continuation of application No. 09/192,462, filed on Nov. 16, 1998, now Pat. No. 6,011,735.

(30) Foreign Application Priority Data

May 27, 1998 (JP) ............................................ 10-146275

(51) Int. Cl.$^7$ ................................................ G11C 7/00
(52) U.S. Cl. .................................. 365/200; 365/230.06
(58) Field of Search ........................... 365/200, 230.03, 365/230.06, 233

(56) References Cited

U.S. PATENT DOCUMENTS

| 5,452,251 A | 9/1995 | Takao et al. ................. 365/200 |
| 5,487,040 A | 1/1996 | Sukegawa et al. ........... 365/200 |
| 5,548,555 A | 8/1996 | Lee et al. ..................... 365/200 |
| 5,652,725 A | 7/1997 | Suma et al. .................. 365/200 |
| 5,798,973 A | 8/1998 | Satoshi et al. ............... 365/200 |
| 6,011,735 A | * 1/2000 | Ooishi et al. ................. 365/200 |

FOREIGN PATENT DOCUMENTS

| JP | 2-201800 | 8/1990 |
| JP | 2-210686 | 8/1990 |
| JP | 9-162308 | 6/1997 |

* cited by examiner

*Primary Examiner*—Richard Elms
*Assistant Examiner*—Hien Nguyen
(74) *Attorney, Agent, or Firm*—McDermott, Will & Emery

(57) ABSTRACT

A redundancy determination circuit receiving an address signal from an address bus outputs a replacement signal when a set address matches the received address. A multiplexer activates any spare activation signal line that activates respective redundant memory arrays provided in the row direction and column direction in a memory bank at a predetermined timing. The redundancy determination circuit can set the address to use a redundant memory array in either the row direction or the column direction. Therefore, the number of redundancy determination circuits can be reduced.

18 Claims, 37 Drawing Sheets

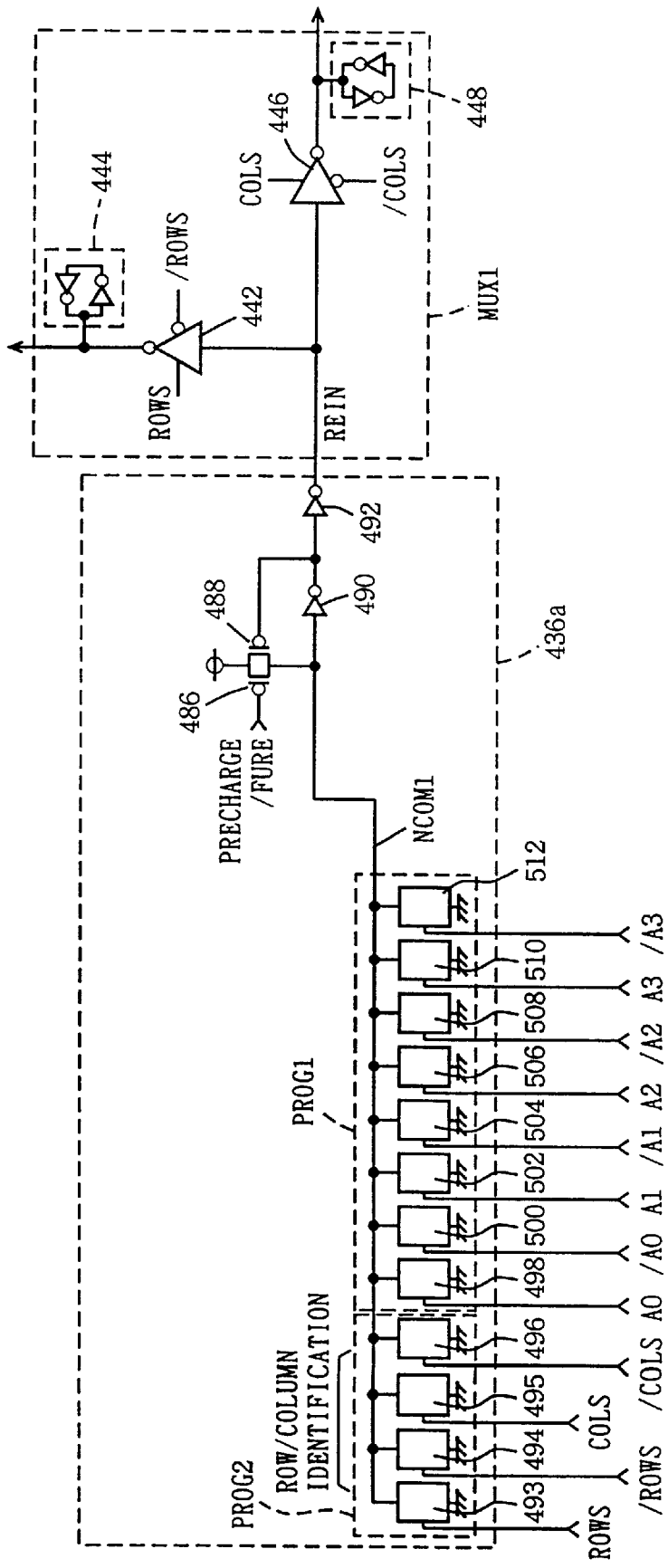
F I G. 14

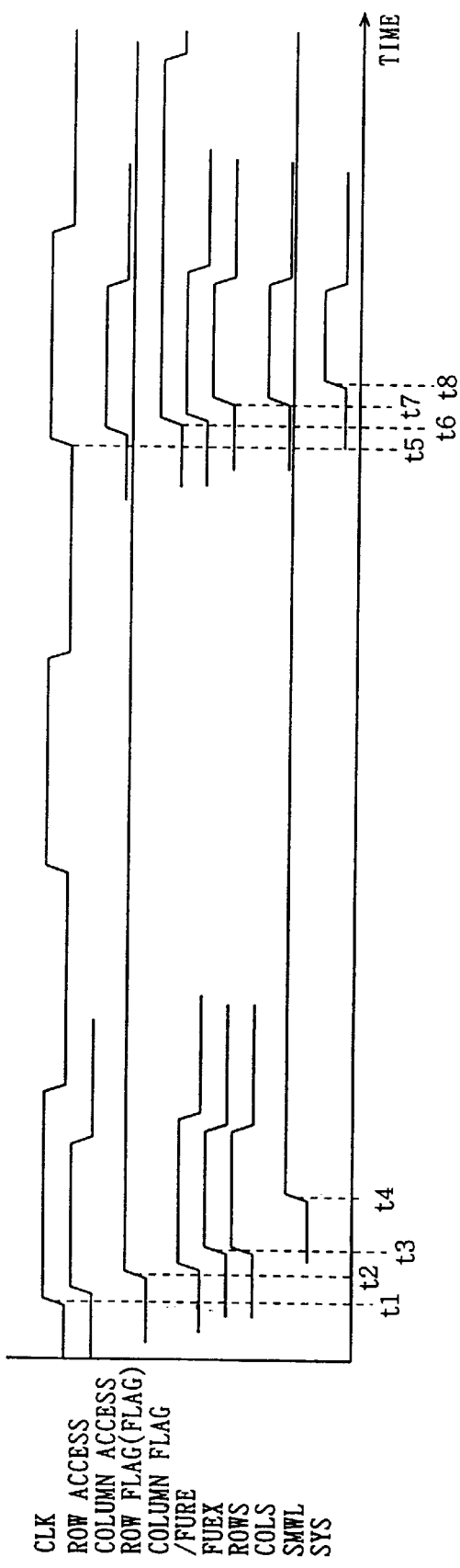

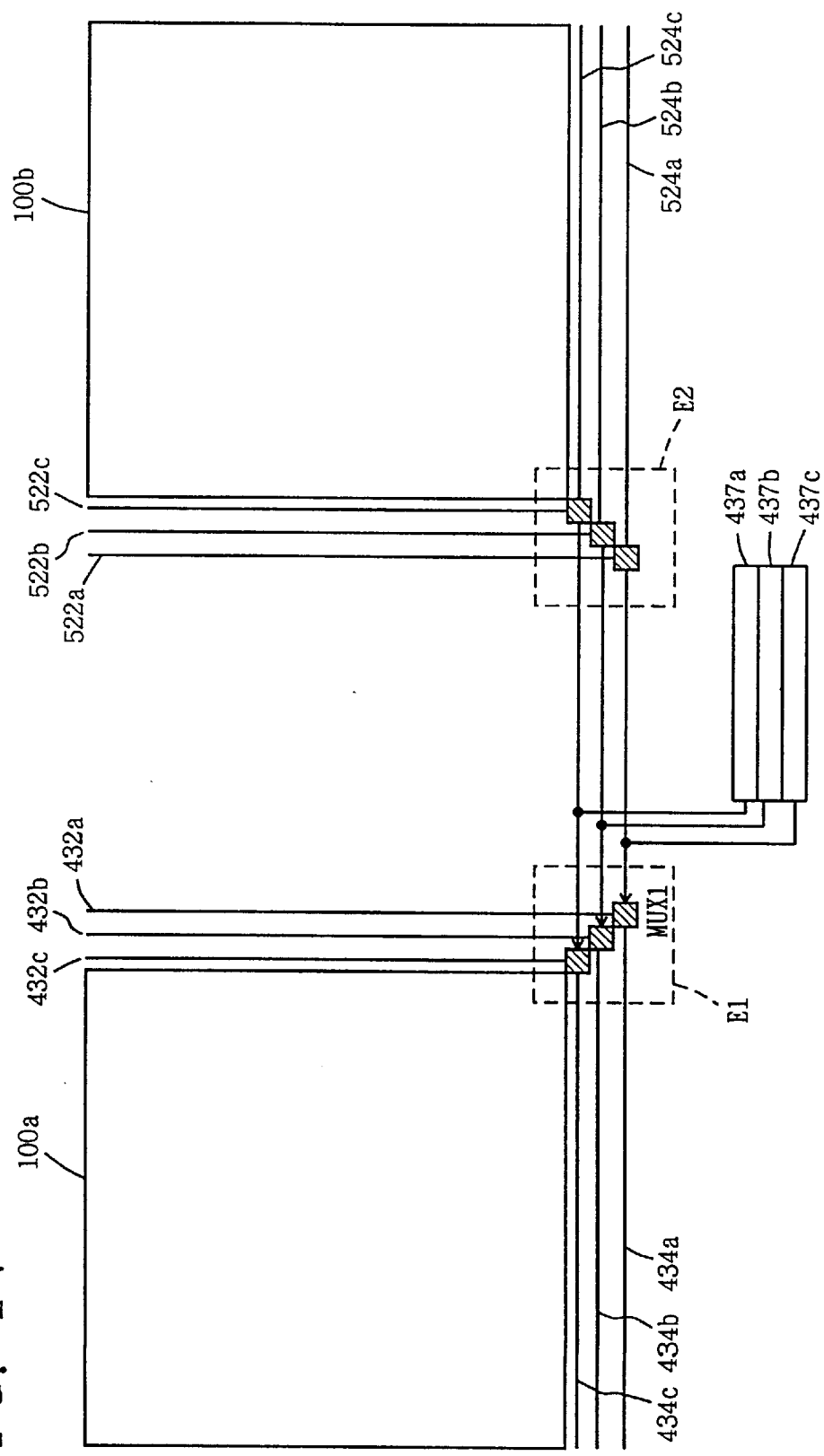
F I G. 17

SEMICONDUCTOR MEMORY DEVICE HAVING REDUNDANCY

This application is a continuation of application Ser. No. 09/192,462 filed Nov. 16, 1998, now a U.S. Pat. No. 6,011,735.

BACKGROUND OF THE INVENTION

1. Field of the Invention

The present invention relates to synchronous semiconductor memory devices, and more particularly, to a synchronous semiconductor memory device that allows replacement of a defective memory cell by a redundant memory array.

2. Description of the Background Art

Recently, it is general for a semiconductor memory device to include a redundant memory array to repair a partial defect in memory cells by replacing the memory array in the neighborhood of the defective memory cell with a redundant memory array during the manufacturing stage.

In the conventional redundancy system, a memory device includes a row-related redundant memory array and a column-related redundant memory array with a redundancy determination unit corresponding in number to the plurality of redundant memory arrays for setting the replacement address of these redundant memory arrays.

A redundancy determination circuit includes a fuse element and the like used to set the address. This fuse element requires a certain size in order to be reliably burned out by a laser beam or the like. This means that the area on the chip occupied by the redundancy determination circuits becomes greater as more redundant memory arrays are provided.

It is possible to suppress the area occupied by the redundancy determination circuit unit on the chip by using in common the circuit associated with the redundant memory arrays.

FIG. 42 is a first example of a semiconductor memory device including a conventional redundant memory cell disclosed in Japanese Patent Laying-Open No. 2-201800.

When a defective cell is found in a mask ROM cell array 906 in the semiconductor, memory device M (mask ROM) of FIG. 42, the address of this defective cell is set at a redundancy determination circuit 903. Data identical to the data written in that defective cell is applied to a write control circuit 900, whereby this data is written into a PROM cell array 913.

When the input address signal matches any redundancy address, a select circuit 915 selects the data output from a second memory unit 914. This data is output from an output circuit 916.

By providing a plurality of sets of the second memory unit 914 with respect to the first memory unit 908, replacement of a plurality of rows or columns can be effected.

FIG. 43 shows a second example of a semiconductor memory device with a conventional redundant memory cell, disclosed in Japanese Patent Laying-Open No. 2-210686.

This second example corresponds to a SRAM.

Consider the case where seven word lines WL and one bit line are defective in a normal cell array 923 in the SRAM of FIG. 43. In this event, defective word lines WL of normal cell array 923 are repaired by spare word lines RWL0–RWL6 in a redundant memory array 936. Also, defective bit line BL of normal cell array 923 is repaired by a spare word line RWL7. Repair of defective bit line BL with spare word line RWL7 is carried out by sending the row address that should be applied to a redundant X decoder 935X to a redundant Y decoder 935Y.

Thus, both the defective word and bit lines can be repaired with one redundant memory array 936 without having to provide a redundant memory array solely for each of word lines WL and bit lines BL.

FIG. 44 shows a third example of a semiconductor memory device with a conventional redundant memory cell disclosed in Japanese Patent Laying-Open No. 9-162308.

This third example teaches the achievement of repair in the row direction and column direction of the main memory cell with a redundant memory cell provided only in the row direction.

In the event that there is a defective memory cell in a main memory cell array 951 in FIG. 44, the row address that selects the row (word line) in which the defective memory cell resides is stored in a row address memory circuit 957.

It is assumed that four memory cells 941–944 connected to a word line WL2 is replaced with the redundant memory cells. When a memory cell in the row direction is to be repaired, a transistor group AA is at a nonconductive state whereas a transistor group BB is at a conductive state. The data of output signals $\phi A1$, $\phi A2$, $\phi B1$, and $\phi B2$ selecting word line WL2 are stored in row address memory circuit 957. Upon supply of output signals $\phi A1$, $\phi A2$, $\phi B1$ and $\phi B2$ from the row predecoder, row address memory circuit 957 determines whether output signals $\phi A1$, $\phi A2$, $\phi B1$ and $\phi B2$ select word line WL2 or not.

When the output signal are those that selects word line WL2, a disconnect circuit 952 disconnects main memory cell array 951 from a sense amplifier 955. A redundant memory cell array 953 is activated, whereby the data therein is applied through a column decoder 954 to a sense amplifier 955. The amplified signal is output outside.

Consider repair of a memory cell in the column direction. It is assumed that four memory cells A–D connected to a column line COL2 are replaced with redundant memory cells. The data of output signals CA1, CA2, CB1, and CB2 selecting column line COL2 are stored in a column address memory circuit 958. Transistor group AA is set conductive whereas transistor group BB is set nonconductive.

When the output signals are those that select column line COL2, disconnect circuit 952 disconnects main memory cell array 951 from sense amplifier 955. Redundant memory cell array 953 is activated.

The data of the redundant memory cell corresponding to the word line that is activated is sent via column decoder 954 to which signals $\phi A1$, $\phi A2$, $\phi B1$ and $\phi B2$ output from the row predecoder are applied to sense amplifier 955 to be amplified and output.

Thus, repair of a main memory cell in the row direction and the column direction can be achieved with a redundant memory cell provided only in the row direction.

As described above, the approach of using in common a redundant memory cell for the replacement of a defective memory cell in both the word line direction and the bit line direction has been developed.

In the high speed dynamic random access memory (DRAM hereinafter) of great capacity, the memory array is divided into a plurality of banks to render the control more complex. From the standpoint of the operating speed, it is desirable to employ a structure in which a redundant memory array and a regular memory cell use in common a word line/bit line. This is because signal delay of the word line or the bit line does not have to be taken into account.

The defect of a memory cell is mainly attributed to a defective bit line or a defective word line. The possibility of a defective chip that cannot be repaired is high if the redundant memory cell is limited to either the bit line direction or the word line direction.

It is therefore desirable to provide a row-related redundant memory array for row replacement and a column-related redundant memory array for column replacement respectively for each memory bank.

However, the redundancy determination circuit used in fault repair when there is actually a defective location corresponds to only a small portion of one chip. As mentioned before, the redundancy determination circuit provided in each redundant memory array includes a fuse element and the like that occupies a large area for setting the address. Therefore, there was a problem that redundancy determination circuits that are not used occupy a great area on the chip.

At the early stage of development in which the production step is not stable, it is desirable that the DRAM includes a redundancy determination circuit for each redundant memory array so that many redundant memory arrays can be used. In contrast, at the mass production stage, the production step is stabilized so that the frequency of using a redundant memory array becomes lower. It is therefore desirable for the DRAM to have a smaller area for the redundant memory arrays than having many redundant memory arrays from the standpoint of reducing the cost. However, the issue of increasing or decreasing the number of redundancy determination circuits in the conventional DRAM was not taken into account.

SUMMARY OF THE INVENTION

In view of the foregoing, an object of the present invention is to suppress increase in the chip area occupied by a redundancy determination circuit unit by reducing the number of redundancy determination circuits through the common usage of the redundancy determination circuit unit.

Another object of the present invention is to provide a synchronous semiconductor memory device of a structure that can easily include an appropriate number of redundancy determination circuits corresponding to an early stage of development and to a mass production stage.

A further object of the present invention is to provide a high-speed operating synchronous semiconductor memory device of complex control with a redundancy system that transmits a redundancy determination result to each bank.

According to an aspect of the present invention, a synchronous semiconductor memory device receiving an externally applied address signal and control signal in synchronization with an external clock to input and output stored data includes a plurality of memory cell blocks, an address bus, a redundancy determination circuit, and a switch circuit. Each of the plurality of memory cell blocks includes a plurality of memory cells arranged in rows and columns. Each memory cell block includes a plurality of regular memory cells, a redundant memory cell row provided in the row direction, and a redundant memory cell column provided in the column direction. The address bus is provided common to the plurality of memory cell blocks for transmitting a row address and a column address included in an address signal in a time-divisional manner. The redundancy determination circuit is provided corresponding to a memory cell block for detecting whether the address signal from the address bus is a row address or a column address according to a control signal to activate a replacement designating signal when the address signal matches the preset address of a defective cell (called "defective address" hereinafter) in the plurality of regular memory cells. The switch circuit responds to activation of the replacement designating signal to activate a select operation of either a corresponding redundant memory cell row or a corresponding redundant memory cell column.

According to another aspect of the present invention, a synchronous semiconductor memory device receiving an externally applied address signal and control signal in synchronization with an external clock to input and output stored data includes a plurality of memory cell blocks, an address bus, and a redundancy determination circuit. Each of the plurality of memory cell blocks includes a plurality of memory cells, arranged in rows and columns. Each memory cell block includes a plurality of regular memory cells, and a redundant memory cell. The address bus is provided common to the plurality of memory cell blocks to transmit a row address and a column address included in an address signal in a time-divisional manner. The redundancy determination circuit is provided common to at least two of the plurality of memory cell blocks to detect which one of the corresponding memory blocks incorporating the regular memory cell does the address signal from the address bus according to the control signal correspond to, and activates the select operation of a redundant memory cell of the corresponding memory cell block when the address signal matches the preset defective address in the plurality of regular memory cells.

According to a further aspect of the present invention, a synchronous semiconductor memory device receiving an externally applied address signal and control signal in synchronization with an external clock includes a plurality of memory cell blocks, a redundancy determination unit, an encoder, a bus for a replacement designating signal, and a plurality of decoders. Each of the plurality of memory cell blocks includes a plurality of memory cells arranged in rows and columns. Each memory cell block includes a plurality of regular memory cells, a redundant memory cell row provided in the row direction, and a redundant memory cell column provided in the column direction. The redundancy determination unit includes a plurality of redundancy determination circuits for activating a replacement designating signal when an address signal matches a preset defective address in the plurality of regular memory cell. The encoder encodes the replacement designating signal output from the plurality of redundancy determination circuits. The replacement designating signal bus receives the output from the encoder. The plurality of decoders are provided corresponding to each memory cell block for decoding the output of the encoder through the replacement designating signal bus. The plurality of decoders activate the select operation of either a redundant memory cell row or a redundant memory cell column included in each memory block.

A main advantage of the present invention is that a redundancy determination circuit including a fuse element and the like occupying a great area can be used in common by a redundant memory array provided in the row direction and a redundant memory array provided in the column direction to reduce the chip area.

Another advantage of the present invention is that a redundancy determination circuit including a fuse element and the like occupying a large area can be used in common by a plurality of memory blocks to reduce the chip area.

A further advantage of the present invention is that when a redundancy determination unit and a memory bank are located far away, the number of lines of the bus used for replacement and that transmits the determination result to the memory bank can be reduced to result in a smaller chip area.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a circuit diagram for describing a structure of a redundancy determination circuit 436a of FIG. 11.

FIG. 16 is an operation waveform diagram for describing redundant address transmission according to the structure of FIG. 11.

FIG. 17 is a schematic block diagram for describing an arrangement of a redundancy determination circuit according to a second embodiment of the present invention.

DESCRIPTION OF THE PREFERRED EMBODIMENTS

First Embodiment

Figure 1:
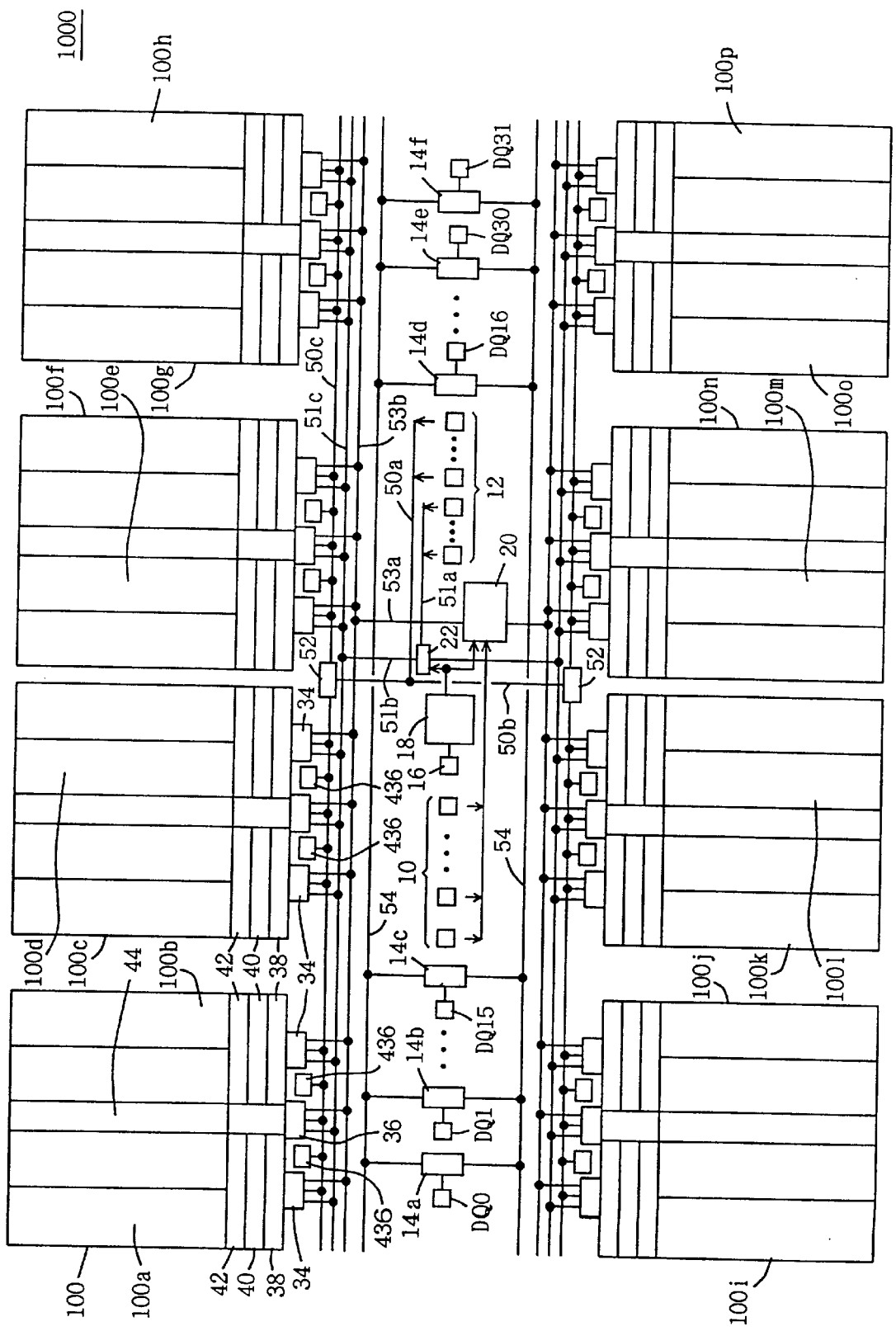
FIG. 1 is a block diagram schematically showing a structure of a semiconductor memory device 1000 according to a first embodiment of the present invention.

Embodiments of the present invention will be described hereinafter with reference to the drawings. In the drawings, the same reference characters denote the same or corresponding elements.

Referring to FIG. 1, a semiconductor memory device 1000 according to a first embodiment of the present invention includes a control circuit 20 receiving external control signal /RAS, /CAS, /W, /CS and the like applied via an external control signal input terminal group 10 and decoding the same to generate an internal control signal, command data buses 53a and 53b for transmitting an internal control signal output from control circuit 20, and a memory cell array 100 in which memory cells are arranged in matrix.

Memory cell array 100 is divided into a total of sixteen memory cell blocks 100a–100p as shown in FIG. 1. When the memory capacity of semiconductor memory device 1000 is 1 Gbits, for example, each memory cell block has a capacity of 64 Mbits. Each block has a structure operable as an independent bank.

Semiconductor memory device 1000 further includes an internal synchronizing signal generation circuit 18 receiving an external clock signal Ext.CLK applied to a clock signal input terminal 16 for initiating a synchronizing operation under control of control circuit 20 to output an internal clock signal int.CLK.

Internal synchronizing signal generation circuit 18 generates an internal clock signal int.CLK in synchronization with external clock signal Ext.CLK by, for example, a delay locked loop circuit (referred to as DLL circuit hereinafter).

Under control of control circuit 20, external address signals A0–Ai (i: natural number) applied via address signal input terminal group 12 are input to semiconductor memory device 1000 in synchronization with internal clock signal int.CLK.

Data of a predetermined number of bits of external address signals A0–Ai is applied to a bank decoder 22 via address bus 51a. Decoded bank addresses B0–B7 are transmitted from bank decoder 22 to each bank via address buses 51b and 51c.

The other external address signals applied to address signal input terminal group 12 are transmitted to an address driver 52 via address buses 50a and 50b. Address signals are further transmitted from address buffer 52 to each bank (memory cell block) via address bus 50c.

Semiconductor memory device 1000 further includes a row predecoder 36 provided for every pair of memory cell blocks to latch and predecode a row address transmitted from address bus 50c under control of control circuit 20, a row decoder 44 for selecting a corresponding row (word line) of a selected memory cell block according to the output from row predecoder 36, a column predecoder 34 provided for each memory cell block to latch and predecode a column address transmitted through address bus 50c under control of control circuit 20, a column predecoder line 40 for transmitting the output from column predecoder 34, a column decoder 42 for selecting a corresponding column (bit line pair) of a selected memory cell block according to the output from column predecoder line 40, and a redundancy determination circuit 436 for activating a select signal of a redundant memory cell column or row (not shown) when the address signal transmitted through address bus 50c matches the set defective address.

Semiconductor memory device 1000 further includes data input terminals DQ0–DQ15 and DQ16–DQ31 along the longitudinal direction at the center area of the chip and outside the region where external control signal input terminal group 10 and address signal input terminal group 12 are provided, input/output buffer circuits 14a–14f provided corresponding to data input/output terminals DQ0–DQ31, respectively, a data bus 54 for transferring data between the input/output buffer circuit and a corresponding memory cell block, and read/write amplifiers 38 provided corresponding to memory cell blocks 100a–100p, respectively, to transmit data between data bus 54 and a selected memory cell column.

Signal /RAS applied to external control signal input terminal group 10 is a row address strobe signal that initiates an internal operation of semiconductor memory device 1000 and that determines the active period of the internal operation. The circuit, for example row decoder 44, associated with the operation of selecting a row in memory cell array 100 is activated in response to activation of signal /RAS.

Signal /CAS applied to external control signal input terminal group 10 is a column address strobe signal to render the circuit that selects a column in memory cell array 100 active.

Signal /CS applied to external control signal input terminal group 10 is a chip select signal indicating selection of semiconductor memory device 1000. Signal /W is a signal designating a write operation of semiconductor memory device 1000.

The input operation of signals /CS, /RAS, /CAS and /W is carried out in synchronization with internal clock signal int.CLK.

The input operation of an address signal to address signal input terminal group 12 and the data transfer via data input/output terminals DQ0–DQ31 are also carried out in synchronization with internal clock signal int.CLK.

Figure 2:
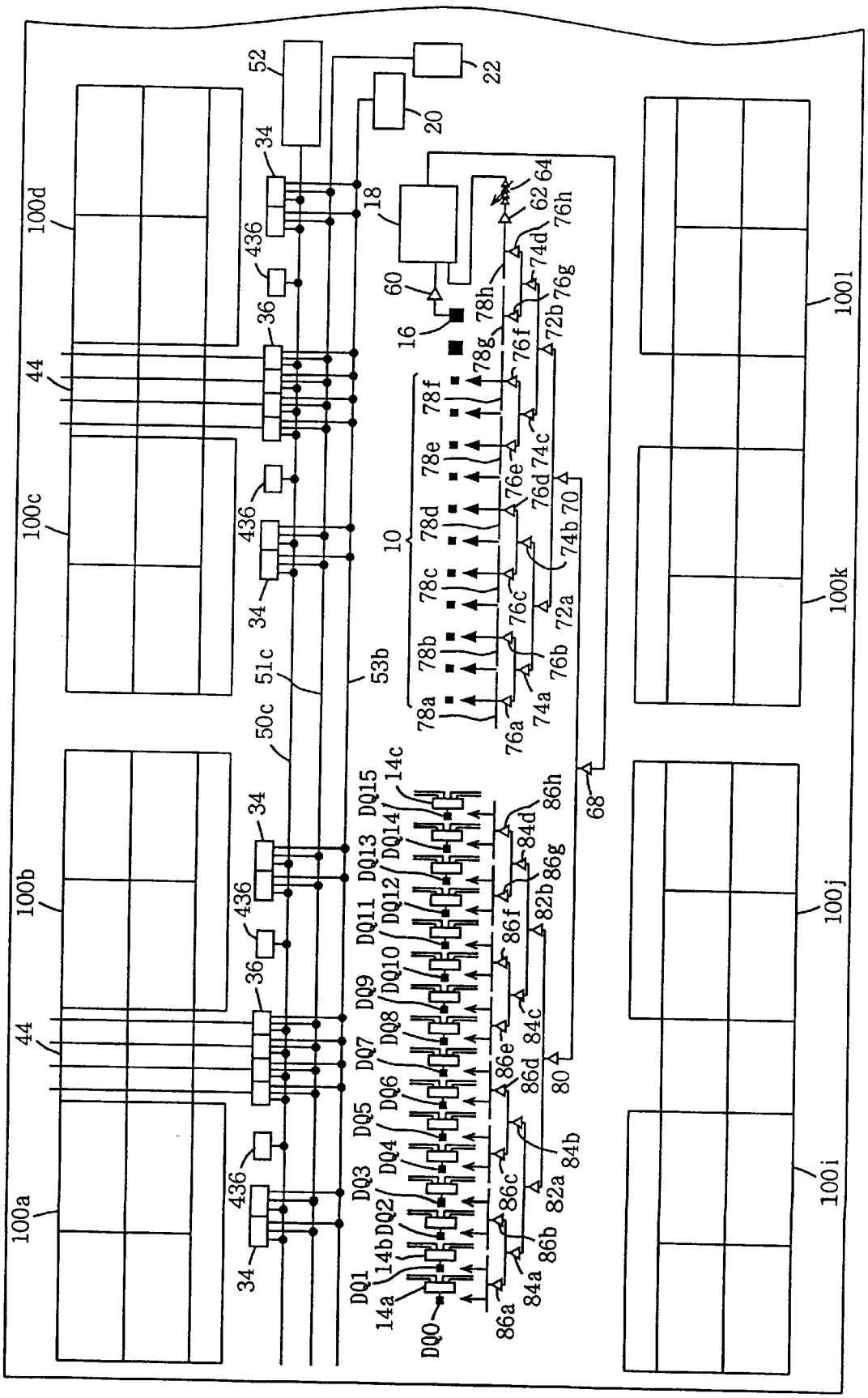
FIG. 2 shows the concept of a structure of distributing an internal clock signal int.CLK in semiconductor memory device 1000.

FIG. 2 shows the concept of a structure for distributing internal control signal int.CLK in semiconductor memory device 1000 of FIG. 1 to each input terminal in external control signal input terminal group 10 and to data input terminals DQ0–DQ15.

Referring to FIG. 2, external clock signal Ext.CLK applied to clock signal input terminal 16 is provided to internal synchronizing signal generation circuit 18 via buffer circuit 60.

Internal clock signal int.CLK output from internal synchronizing signal generation circuit 18 is first applied to buffer circuit 68. The output of buffer circuit 68 is divided into two, one which is provided to a buffer circuit 70 and the other to a buffer circuit 80.

The output of buffer circuit 70 is further divided into two to be applied respectively to buffer circuits 72a and 72b.

The output of buffer circuit 72a is further divided into two to be applied respectively to buffer circuits 74a and 74b.

The output of buffer circuit 72b is also divided into two to be respectively applied to buffer circuits 74c and 74d.

Buffer circuits 74a, 74b, 74c and 74d have each output divided into two to be respectively applied to buffer circuits 76a and 76b, buffer circuits 76c and 76d, buffer circuits 76e and 76f, and buffer circuits 76g and 76h.

In other words, buffer circuit 70 has its output sequentially divided into two to be eventually divided into eight clock signals. The eight clock signals are applied on lines 78a–78h, respectively. An external control signal is input from external control signal input terminal group 10 in synchronization with a clock signal applied from respective ends of lines 78a–78h.

The clock signal from the end of line 78h is applied to internal synchronizing signal generation circuit 18 via a replica buffer circuit 62 and a delay adjust circuit 64. Internal synchronizing signal generation circuit 18 generates internal clock signal int.CLK with the output from delay adjust circuit 64 in synchronization with the phase of external clock signal Ext.CLK applied from buffer circuit 60.

Considering the case where delay adjust circuit 64 is absent, adjustment is made so that the phase of external clock signal Ext.CLK applied to buffer circuit 60 is equal to that of the clock signal on line 78h applied to replica buffer circuit 62, since buffer circuit 60 and replica buffer circuit 62 have a similar structure. Here, the clock signal on line 78h has a phase equal to that of the signal on each of other lines 78a–78g.

In other words, the input operation of an external control signal is carried out in synchronization with external clock signal Ext.CLK.

It is to be noted that the amplitude level of external clock signal Ext.CLK, the ratio of the active period of a clock signal corresponding to that cycle and the like differ from those of internal clock signal int.CLK. Therefore, delay adjust circuit 64 is necessary to carry out adjustment therebetween.

The above description was provided corresponding to a structure of distributing internal clock signal int.CLK with respect to external control signal input terminal group 10. However, a similar structure is provided corresponding to data input/output terminal groups DQ0–DQ10, as shown in FIG. 2.

More specifically, the other output of buffer circuit 68 is applied to a buffer circuit 80 and sequentially divided into two to be eventually divided into the outputs of buffer circuits 86a–86h. Data transfer between data input/output terminal groups DQ0–DQ15 and an external source is carried out in synchronization with an internal clock signal output from buffer circuits 86a–86h.

In FIG. 2, description was provided for a structure of distributing internal clock signal int.CLK with respect to external control signal input terminal group 10 and data input/output terminal groups DQ0–DQ15. A similar structure is provided corresponding to address signal input terminal group 12 and data input/output terminal groups DQ16–DQ31. By such a structure, input of an address signal and transfer of a data signal will be carried out in synchronization with external clock signal Ext.CLK.

Figure 3:
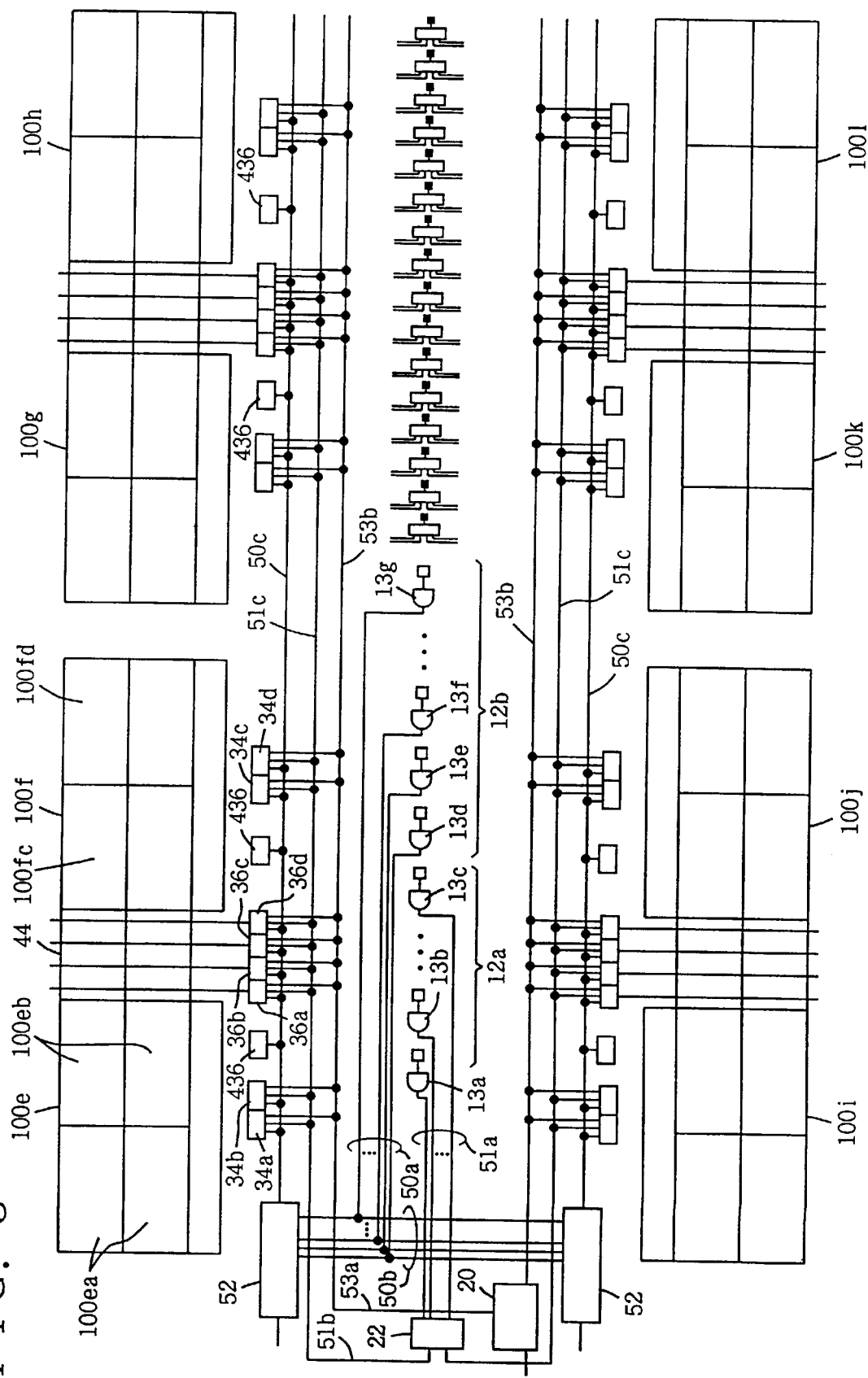
FIG. 3 is a block diagram schematically showing a structure of an address bus and a command data bus of semiconductor memory device 1000.

FIG. 3 is a schematic block diagram showing a structure of address signal input terminal group 12, address buses 50a, 50b, 50c, 51a, 51b and 51c, and command data buses 53a and 53b in semiconductor memory device 1000 of FIG. 1.

The more significant bits of data of the address signal applied to address signal input terminal group 12a are provided to bank address bus 51a by input buffers 13a–13c each operating in synchronization with internal clock signal int.CLK. Bank decoder 22 receives and decodes the data from bank address bus 51a to transmit the decoded signal to respective memory cell blocks (banks) via bank address buses 51b and 51c.

The less significant bits of data of the address signal applied to address signal input terminal group 12b out of address signal input terminal group 12 are provided to address driver 52 via address buses 50a and 50b by input buffers 13d–13g each operating in synchronization with internal clock signal int.CLK. Address driver 52 transmits the address signal to each bank (memory cell block) via address bus 50c.

Control circuit 20 receives and decodes the command data applied from control signal input terminal group 10 to send the decoded command data to each memory cell block (bank) via command data buses 53a and 53b.

In each bank, memory cell block 100e, for example, is further divided into memory cell subblocks 100ea and 100eb.

In row predecoder 36, a predecoder 36a corresponds to memory cell subblock 100ea, whereas row predecoder 36b corresponds to memory cell subblock 100eb. Row predecoder 36a senses selection of bank 100e according to the bank address transmitted through bank address bus 51c, and is rendered active upon sensing designation of a row related operation through command data bus 53b to receive the address data from address bus 50c and the command data from command data bus 53b. In response, row predecoder 36a provides the predecoded address signal to row decoder 44.

Each of row predecoders 36b–36d carries out a similar operation.

As to column predecoder 34, a column predecoder 34a provided corresponding to memory cell subblock 100ea senses selection of memory cell block 100e and activation of a column related operation through command data bus 53b according to the bank address transmitted via bank address bus 51c. In response, corresponding address data is received from address bus 50c.

Column predecoder 34a predecodes the input column address data to output a predecoded column address signal to a corresponding column predecoder line 40.

Figure 4:
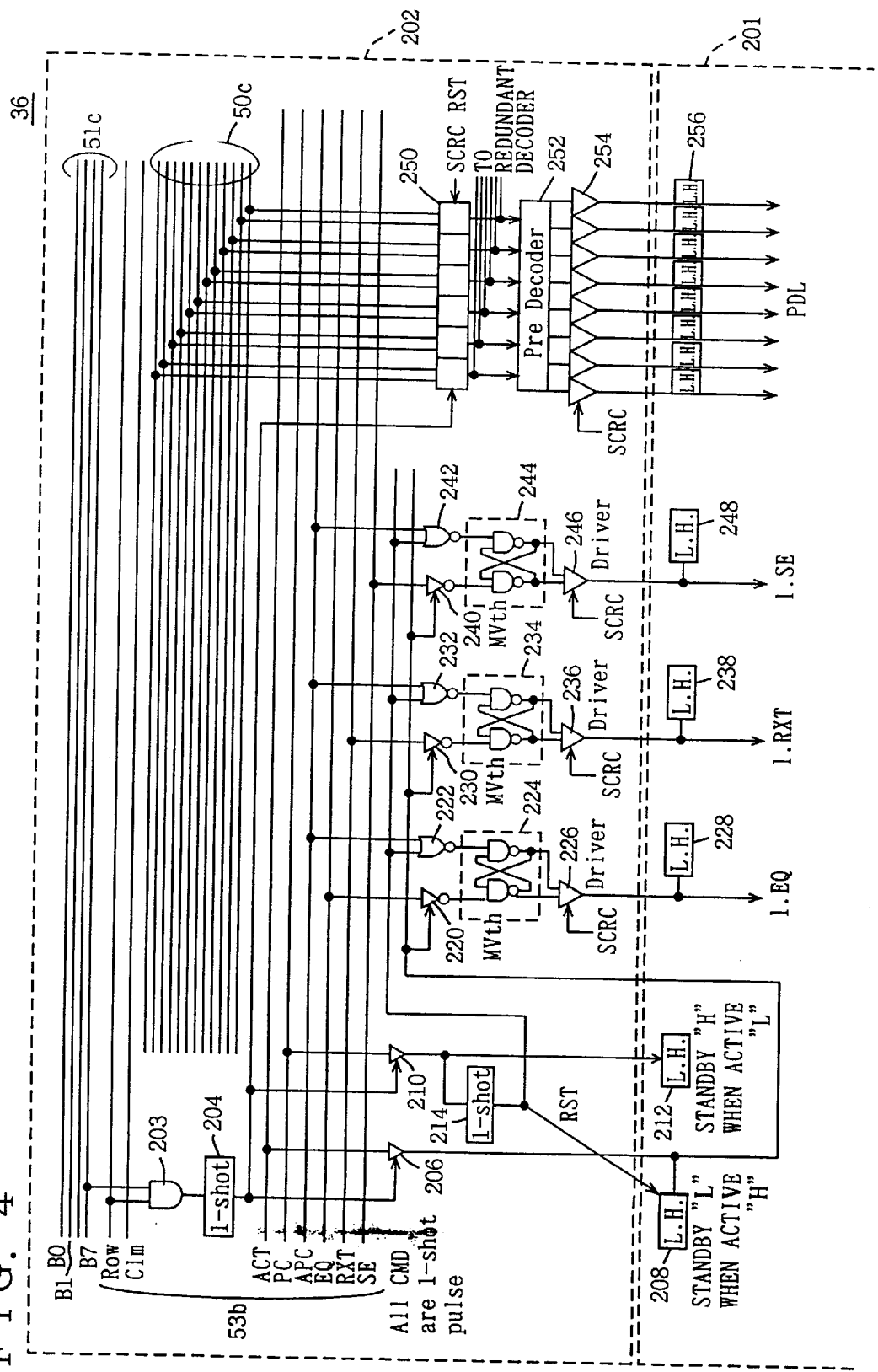
FIG. 4 is a block diagram schematically showing a structure of a row predecoder circuit 36 of the first embodiment.

FIG. 4 is a schematic block diagram for describing a structure of row predecoder 36 of the structure of FIG. 3.

Command data bus 53b transmits various signals such as a signal Row indicating activation of a row related circuit operation, a signal Clm indicating activation of a column related circuit operation, a signal ACT indicating activation of an internal circuit operation, a signal PC indicating bank reset (precharge), a signal APC indicating precharging of all banks, a signal EQ designating cancel of bit line equalizing or disconnecting an unused bit line from a sense amplifier, a signal RXT indicating activation of a word line, and a signal SE indicating activation of a sense amplifier.

Bank address bus 51c transmits bank address signals B0–B7 decoded by bank decoder 22. Address bus 50c transmits an address signal from address driver 52.

For example, when bit data B7 out of the bank address signal is rendered active and signal Row is rendered active, a signal of an active state is output from AND circuit 203. In response, an active one shot pulse is output from a one shot pulse generation circuit 204.

In response, driver circuit 206 is rendered active, whereby signal ACT is input and sent to a level holding circuit 208 to retain that level.

Similarly, in response to a signal from one shot pulse generation circuit 204, driver circuit 210 is rendered active, whereby signal PC is input and sent to level holding circuit 212 to retain that level. Also, in response to the output from driver circuit 210, one shot pulse generation circuit 214 provides a reset signal to level holding circuit 208. Inverter 220 is rendered active in response to an output signal from level holding circuit 208 to receive and output signal EQ. NOR circuit 222 receives signal APC and the signal from one shot pulse generation circuit 214 to output a NOR operation result. Flip-flop circuit 224 is set according to the output from inverter 220 and reset according to the output from NOR circuit 222. Driver circuit 226 that is activated by a hierarchical power supply control signal SCRC that will be described afterwards receives and provides the output of flip-flop circuit 224. Level holding circuit 228 retains the output level of driver circuit 226. The output of level holding circuit 228 is applied as a signal l.EQ to a corresponding memory cell block.

Similarly, flip-flop circuit 234 is activated in response to a signal from level holding circuit 208 to be set by the output of an inverter 230 that receives signal RXT via command data bus 53b as an input, and reset by the output of NOR circuit 232 that receives signal APC transmitted through command data bus 53b.

Driver circuit 236 receives the output of flip-flop circuit 234 to be rendered active by hierarchical power supply control signal SCRC. The level of the output of driver circuit 236 is retained by level holding circuit 238. The output of level holding circuit 238 is provided as a signal l.RXT to a corresponding memory cell block.

Flip-flop circuit 244 receives signal SE transmitted through command data bus 53b to be set by the output of inverter 240 rendered active according to the output level of level holding circuit 208 and reset by the output of NOR circuit 242 receiving the output of one shot pulse generation circuit 214 and signal APC transmitted via command data bus 53b. Driver circuit 246 receives the output of flip-flop circuit 244 to be rendered active by hierarchical power supply control signal SCRC. The level of the output of driver circuit 246 is retained by level holding circuit 248 to be provided to a corresponding memory cell block as a signal l.SE.

Latch circuit 250 is reset in response to activation of hierarchical power supply control signal SCRC, and is rendered active in response to activation of one shot pulse generation circuit 204 to retain the address signal transmitted via address bus 50c. The output of latch circuit 250 is applied to a redundant address decoder (not shown) and also to predecoder 252. The predecoded result is applied to driver circuit 254 that is rendered active in response to hierarchical power supply control signal SCRC.

The output from driver circuit 254 is retained by level holding circuit 256. The output of level holding circuit 256 is provided to respective corresponding row predecoder lines.

According to the structure of row predecoder 36 of FIG. 4, a region 201 including level holding circuits 208, 212, 228, 238 and 248 and level holding circuit 256 and also a corresponding memory cell block corresponds to the region that is not controlled by hierarchical power supply control SCRC. In this region, operation is carried out with power supply potential Vcc and ground potential Vss as the power supply potentials whether in an active state or a standby state.

A region 202 of row predecoder 36 is under control of hierarchical power supply control signal SCRC to operate with power supply potential Vcc and ground potential Vss as the power supply potentials during the active period of signal SCRC and operates with a potential lower than power supply potential Vcc and a potential higher than ground potential Vss as power supply potentials during an inactive period (L level) of signal SCRC.

Figure 5:
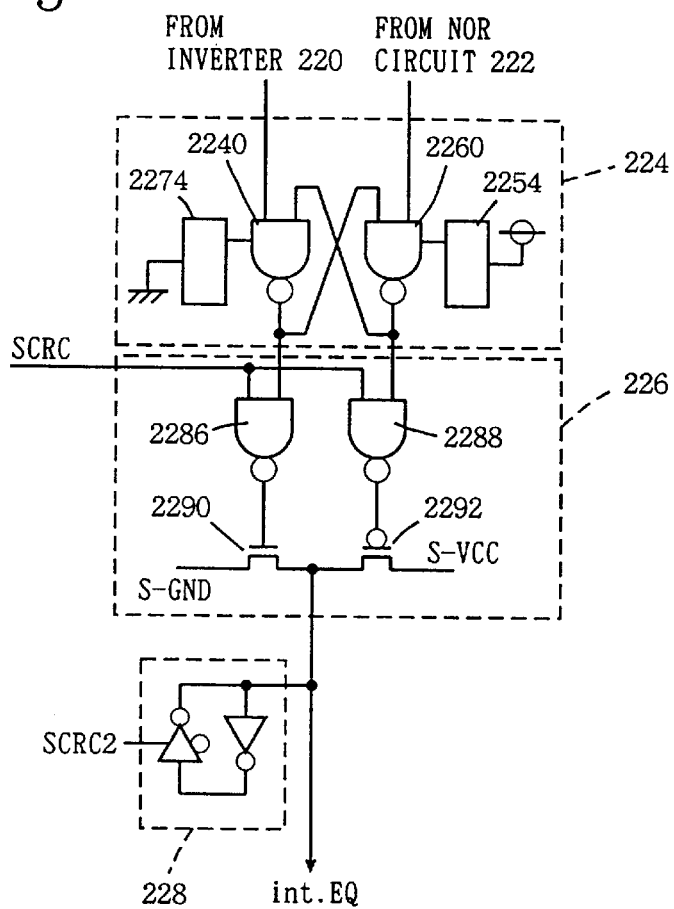
FIG. 5 is a schematic block diagram for describing a structure of a flip-flop circuit 224 of FIG. 4.

FIG. 5 is a schematic block diagram showing a structure of flip-flop circuit 224, driver circuit 226 and level holding circuit 228 of FIG. 4.

Referring to FIG. 5, flip-flop circuit 224 includes cross-connected NAND circuits 2240 and 2260, a switch circuit 2274 for switching the supply of ground potential to cross-connected NAND circuits 2240 and 2260, and a switch circuit 2254 for switching the supply of power supply potential Vcc to NAND circuits 2240 and 2260.

In other words, a hierarchical power supply is formed by switch circuits 2254 and 2274.

Driver circuit 226 includes a NAND circuit 2286 receiving signal SCRC at one input node and a first output signal of flip-flop circuit 224 at the other input node, a NAND circuit 2288 receiving signal SCRC at one input node and a second output signal of flip-flop circuit 224 at the other input node, an N channel MOS transistor 2290 having its gate potential controlled by the output of NAND circuit 2286, and receiving hierarchical power supply potential S-GND at its source, and a P channel MOS transistor 2292 receiving the output of NAND circuit 2288, and receiving hierarchical power supply potential S-Vcc at its source. N channel MOS transistor 2290 has its drain connected to the drain of P channel MOS transistor 2292. The level of the potential at this connection node corresponds to the potential level of the output of driver circuit 226.

Level holding circuit 228 is a latch circuit activated by a signal SCRC2. Signal SCRC2 is rendered active simultaneous to signal SCRC and rendered inactive in response to inactivation of signal SCRC at time t6 in FIG. 6.

Figure 6:
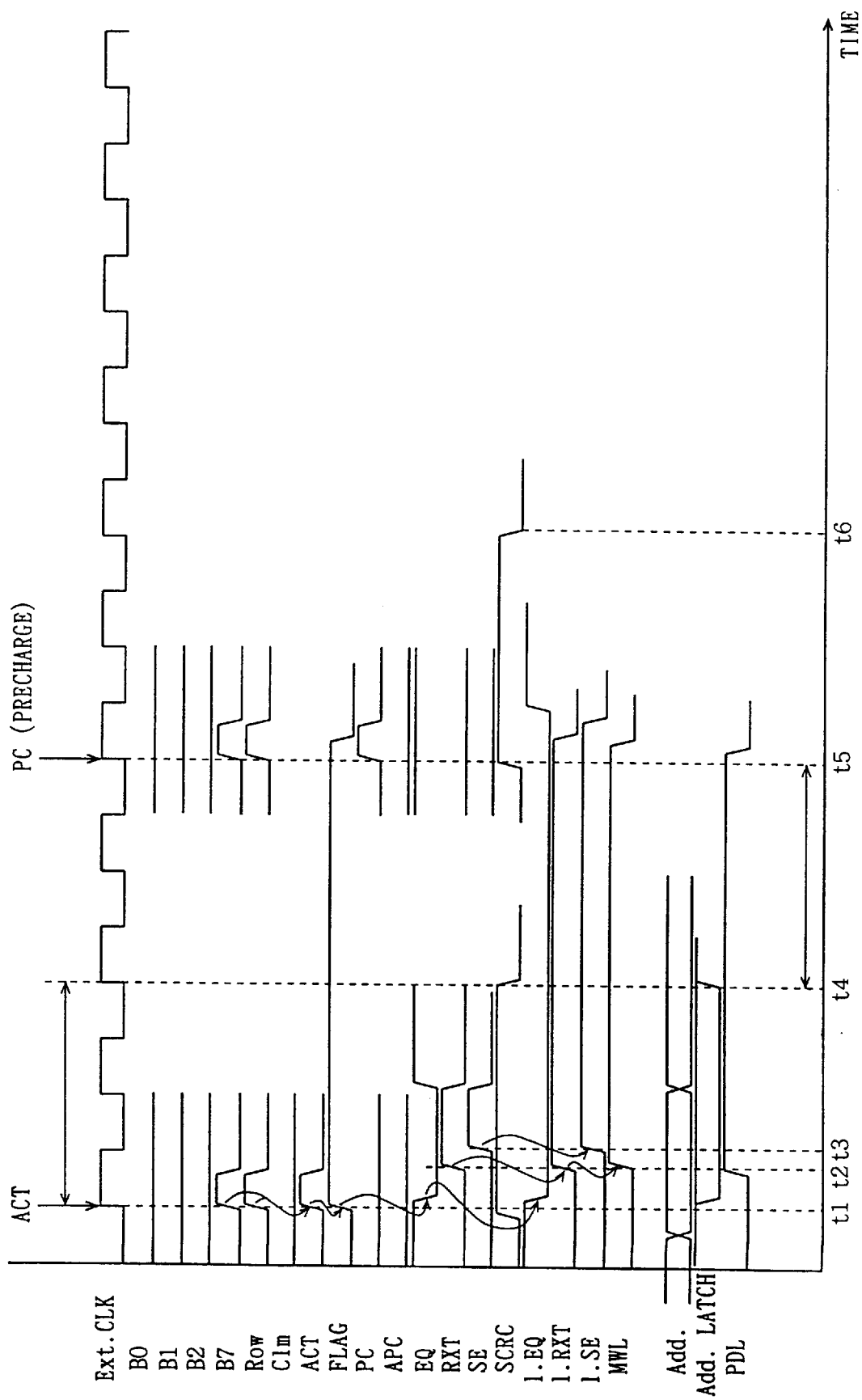
FIG. 6 is a timing chart for describing an operation of semiconductor memory device 1000.

FIG. 6 is a timing chart for describing an operation of row predecoder 36 of FIG. 4.

In FIG. 6, signals B0–B7 indicate a bank address. Signal Row is a row related access identification signal for designating activation of the operation of a row related circuit. Signal Clm is a column related access identification signal for designating activation of the operation of a column related circuit. Signal ACT is a bank activation signal transmitted from control circuit 20.

Also, a flag signal is retained by level holding circuit 208 in response to access of a bank. Signal PC is sent from control circuit 20 to designate a precharge operation of a selected bank. Signal APC is an all bank precharge signal sent from control circuit 20 to designate a precharge operation on all the banks.

Signal l.EQ is a local bit line equalize signal retained by level holding circuit 228. Signal l.RXT is a local word line activation signal retained by level holding circuit 238. Signal l.SE is a local sense amplifier activation signal retained by level holding circuit 248. Potential MWL is the potential of the main word line in a memory cell block (bank).

Signal Add. Latch is an address signal retained by level holding circuit 256.

The operation will be described hereinafter.

Referring to FIGS. 4 and 6, at the rising edge of external clock signal Ext.CLK at time t1, bit B7 of the decoded bank address is rendered active, whereby a corresponding bank is selected. Here, signal Row is at an active state. Therefore, an active one shot pulse is output from one shot pulse generation circuit 204. In response, an active signal ACT sent through command data bus 53b is driven by driver circuit 206, whereby the level of this active signal ACT is retained in level holding circuit 208 as a flag signal.

In response to activation of the flag signal, the level of signal EQ transmitted through command data bus 53b is retained at flip-flop circuit 224.

At time t1, hierarchical power supply control signal SCRC is rendered active (H level). All the circuits in region 202 receive power supply potential Vcc and ground potential Vss to operate.

The level of signal EQ input to flip-flop circuit 224 is driven by driver circuit 226 to be retained as local bit line equalize signal 1.EQ at level holding circuit 228.

At time t2, signal RXT sent through command data bus 53b is rendered active. This signal is input to flip-flop circuit 234. In response, level holding circuit 238 retains the level of local word line activation signal 1.RXT at an active state.

At time t3, signal SE transmitted through command data bus 53b is rendered active. This signal is input to flip-flop circuit 244.

In response, level holding circuit 248 retains local sense amplifier activation signal 1.SE at an active state.

In response to activation of local word line activation signal 1.RXT, the potential level of the main word line of the selected row is pulled up to an active state (H level).

The address signal transmitted via address bus 50c is latched by latch circuit 250 and predecoded by predecoder 252 to be driven by driver 254. As a result, the signal on row predecoder line PDL is driven to respective levels. At time t4, predecoder 252 renders signal SCRC to an inactive state (L level) according to the level of row predecoder line PDL.

In other words, the period from time t1 to time t4 is the period of time required for the operation of all the circuits of one bank.

In response to inactivation of signal SCRC, the circuit in region 202 exhibits transition to an operation mode where the leakage current becomes smaller.

In contrast, local bit line equalize signal 1.EQ, local word line activation signal 1.RXT and local sense amplifier activation signal 1.SE output from level holding circuits 228, 238 and 248, respectively, retain their levels.

At the rising edge of external clock signal Ext.CLK at time t5, bank signal B7 and signal Row attain an active state and precharge signal PC also attains an active state. In response, one shot pulse generation circuit 214 receives signal PC applied through driver circuit 210, whereby NOR circuits 222, 232 and 242 are driven. As a result, flip-flop circuits 224, 234 and 244 are reset.

Signal SCRC also attains an active state at time t5. In response, signals 1.EQ, 1.RXT and 1.SE have their levels reset. Also, in response to activation of signal SCRC, the level retained by latch circuit 250 is reset, whereby the level of row predecode line PDL is reset.

More specifically, during the period of time t4 to t5, the circuit in region 202 is reset to reduce the leakage current. However, the levels of signal 1.EQ, signal 1.RXT, signal 1.SE and the signal on row predecoder line PDL are retained.

According to the above-described structure, an address data bus is provided common to all the banks operating independently. Therefore, the area occupied by the address bus can be reduced.

[Transition of Address Bus]

The semiconductor memory device of the present invention has an address bus differing from that of a conventional one. The structure of this address bus will be described hereinafter with reference to the drawings of FIGS. 7–9.

Figure 7:
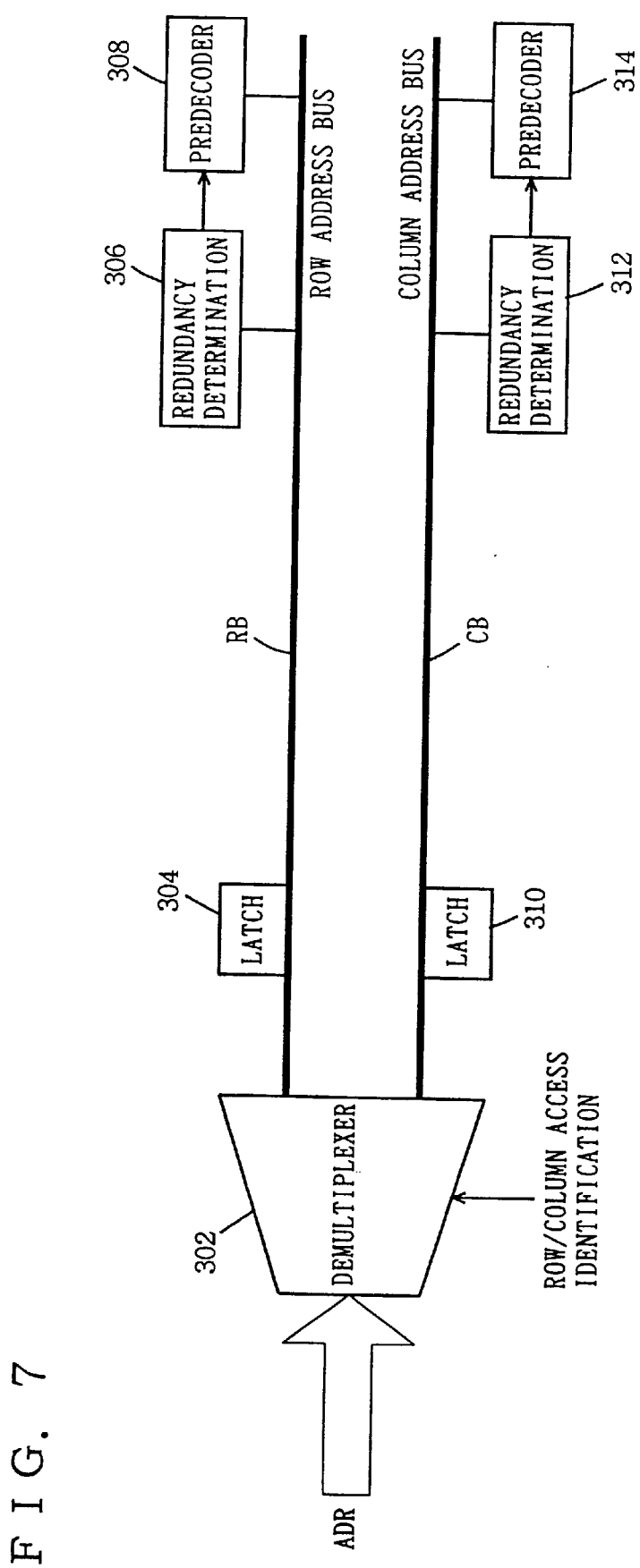
FIG. 7 shows a structure of an address bus in an initial DRAM.

FIG. 7 shows a structure of an address bus of a DRAM at an early stage. Referring to FIG. 7, this DRAM includes a demultiplexer 302 receiving an externally applied address ADR and responsive to a row/column access identification signal to output a row address to a row address bus RB and a column address to a column address bus CB, a latch circuit 304 for latching and retaining a row address signal, a redundancy determination circuit 306 receiving a row address signal to determine whether to replace with a redundant memory array, and a predecoder 308 for receiving and predecoding a row address signal to output a predecoded row address to a memory cell array. Redundancy determination circuit 306 outputs an inhibit signal that renders predecoder 308 inactive to inhibit access to a defective cell when replacement with a redundant memory array is to be effected (referred to as "hit signal" hereinafter).

The DRAM further includes a latch circuit 310 for latching and retaining a column address signal transmitted through column address bus CB, a redundancy determination circuit 312 for receiving a column address signal to determine whether to replace with a redundant memory array or not, and a predecoder 314 for receiving and predecoding a column address signal to send a predecoded column address to a memory cell array. Redundancy determination circuit 312 outputs a hit signal that renders predecoder 314 inactive when replacement with a redundant memory array is to be effected.

Figure 8:
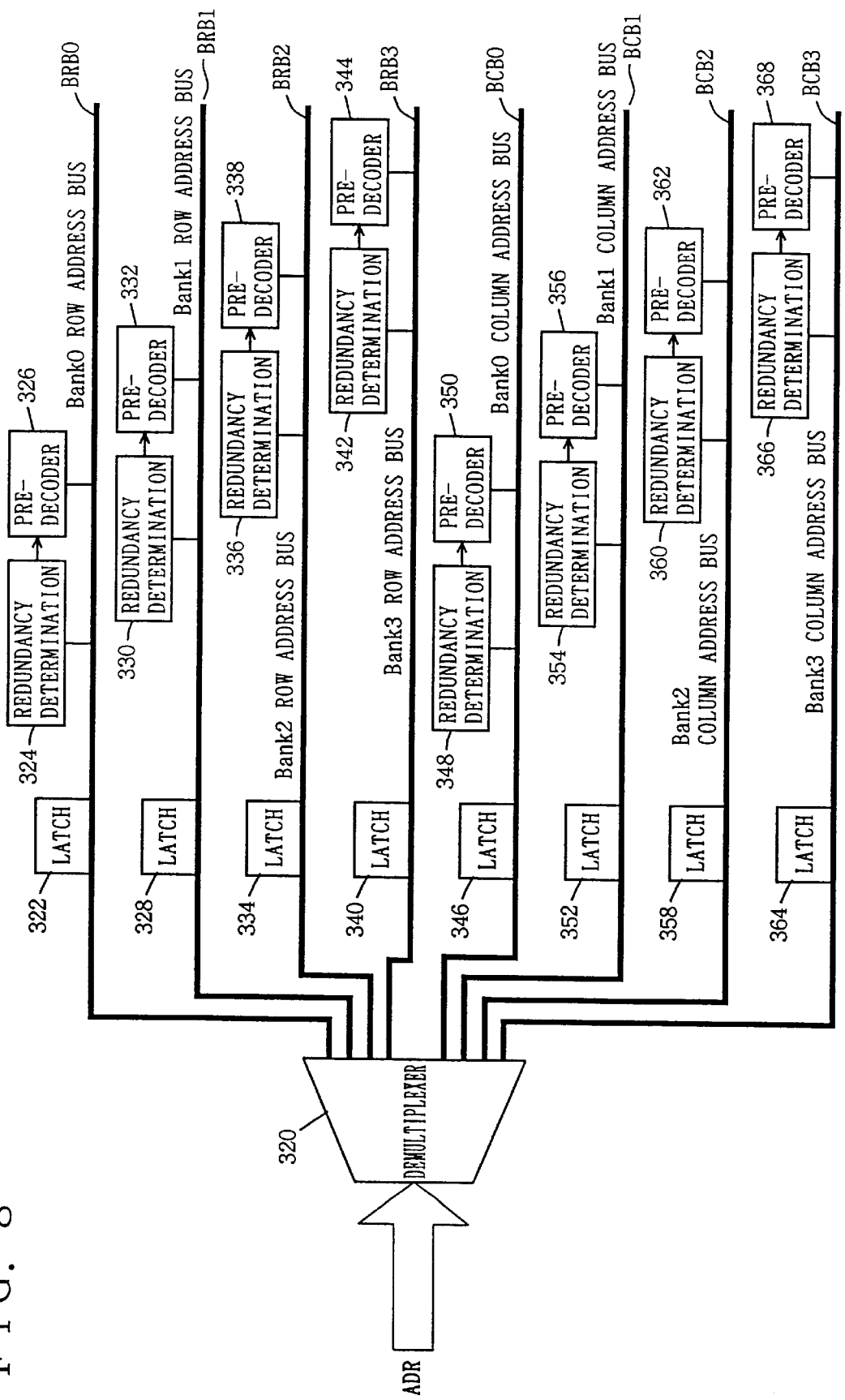
FIG. 8 shows a structure of an address bus in a DRAM of a multibank structure.

FIG. 8 shows a structure of an address bus in a DRAM of a multibank structure.

Referring to FIG. 8, this DRAM includes a demultiplexer 320 receiving an externally applied address ADR to output a row address corresponding to each bank to row address buses BRB0–BRB3, respectively, and to output a column address corresponding to each bank to respective column address buses BCB0–BCB3, latch circuits 322, 328, 334 and 340 for latching and retaining a row address signal output from row address buses BRB0–BRB3, redundancy determination circuits 324, 330, 336 and 342 receiving a row address signal output from row address buses BRB0–BRB3 to determine whether replacement with a redundant memory array is to be effected or not, and predecoders 326, 332, 338 and 344 receiving a row address signal output to row address buses BRB0–BRB3 to provide a predecoded row address to a memory cell array of banks 0–3.

Redundancy determination circuits 324, 330, 336 and 342 output a hit signal that renders predecoders 326, 332, 338 and 344 inactive, respectively, to inhibit access to a defective cell when replacement with a redundant memory array is to be effected.

The DRAM further includes latch circuits 346, 352, 358 and 364 for latching and retaining a column address signal output to column address buses BCB0–BCB3, redundancy determination circuits 348, 354, 360 and 366 receiving a column address signal output to column address buses BCB0–BCB3 to determine whether replacement with a redundant memory array is to be effected or not, and predecoders 350, 356, 362 and 368 receiving a row address signal output from column address signal buses BCB0–BCB3 to output a predecoded column address to a memory cell array of banks 0–3.

Redundancy determination circuits 348, 354, 360 and 366 output a hit signal that renders predecoders 350, 356, 362 and 368 inactive to inhibit access to a defective cell.

When the capacity of the semiconductor memory device becomes greater to increase the number of bits of the address and the number of banks, the number of address buses will be increased significantly according to the system shown in FIG. 8. Considering the case of a 1 G (Giga) bit DRAM having 16 banks, the total number of address buses is as many as 416 when the address is 13 bits, the address bus has two types for the row and column, and the number of banks is 16. These address buses will be located in the proximity of demultiplexer 320 that receives an input signal and distributes the same as a row address and a column address to each bank. Such a structure is extremely not efficient taking into consideration the entire arrangement of the chip.

By directly providing an externally applied address to each block and receiving a row address and a column address according to bank designation in each block, only 1 address bus including 13 address lines will be required basically. Accordingly, the inconvenience of a plurality of address buses gathering at one location of the chip can be eliminated.

Figure 9:
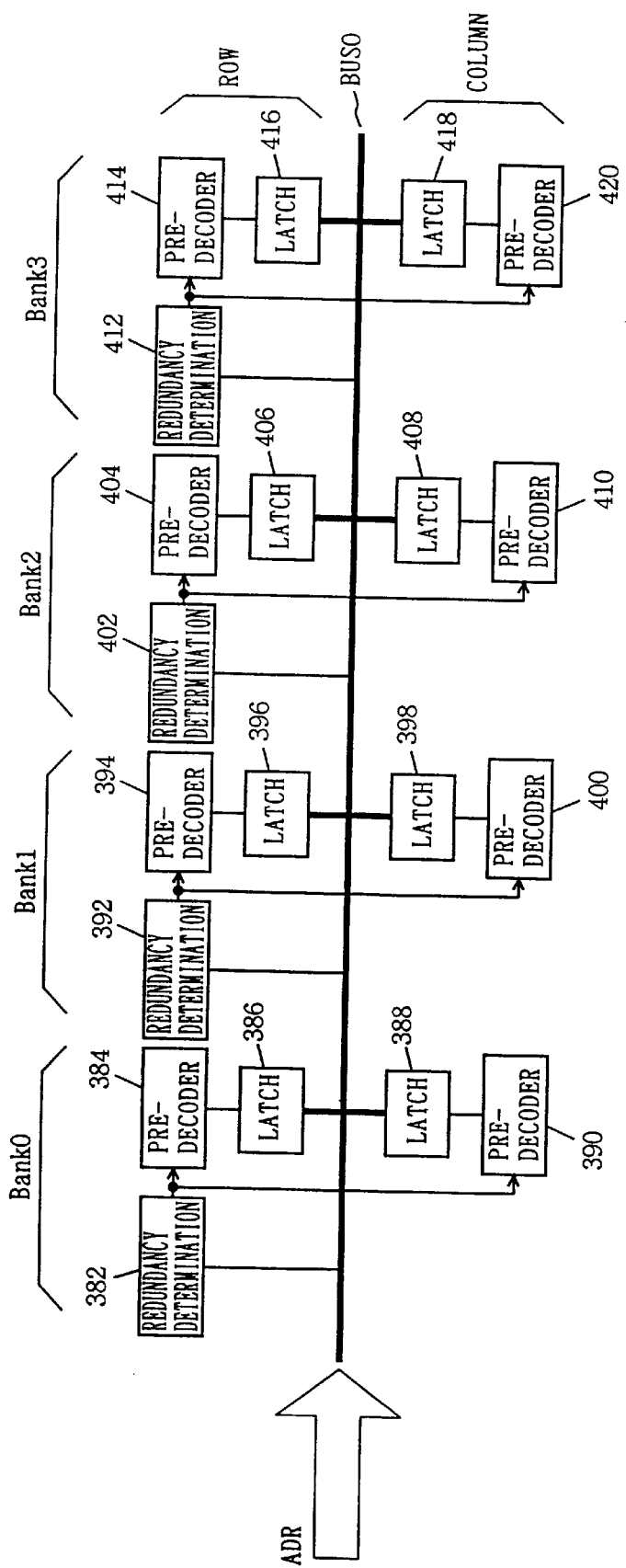
FIG. 9 shows a structure of an address bus of semiconductor memory device 1000 of the first embodiment.

FIG. 9 shows a structure of an address bus in semiconductor memory device 1000 according to the first embodiment of the present invention.

Referring to FIG. 9, semiconductor memory device 1000 according to the first embodiment of the present invention includes common address buses BUS0 for transmitting externally applied address signal ADR to each bank, redundancy determination circuits 382, 392, 402 and 412 receiving an address through common address bus BUS0 to carry out redundancy determination of a row or column corresponding to banks 0–3, latch circuits 386, 396, 406, and 416 for receiving an address from common address bus BUS0 to input and retain a row address corresponding to banks 0–3, respectively, and predecoders 384, 394, 404 and 414 for predecoding the row address retained in each of latch circuits 386, 396, 404 and 416 to output a predecoded row address to a memory cell array of banks 0–3.

Redundancy determination circuits 382, 392, 402 and 412 output a hit signal that renders predecoders 384, 394, 404 and 414 inactive to inhibit access to a defective cell when replacement with a row related redundant memory array is to be performed.

Semiconductor memory device 1000 of the first embodiment further includes latch circuits 388, 398, 408 and 418 receiving an address from common address bus BUS0 to receive and retain a column address corresponding to banks 0–3, respectively, and predecoders 390, 400, 410 and 420 for predecoding a column address retained in each of latch circuits 388, 398, 408 and 418 to output the predecoded column address to the memory cell array of banks 0–3.

Redundancy determination circuits 382, 392, 402 and 412 output a hit signal to render predecoders 390, 400, 410 and 420 inactive to inhibit access to a defective cell when replacement with a column related redundant memory array is to be performed.

In semiconductor memory device 1000 of the first embodiment, an externally applied address signal is received by an input buffer to be propagated to each bank in the chip. At this stage, there is no discrimination between a row and a column. Also, there is no discimination in the address of a bank. Since the address bus is shared by each bank, the area occupied by the address bus with respect to the entire chip can be set smaller.

The signal of the address bus will be described briefly now.

Figure 10:
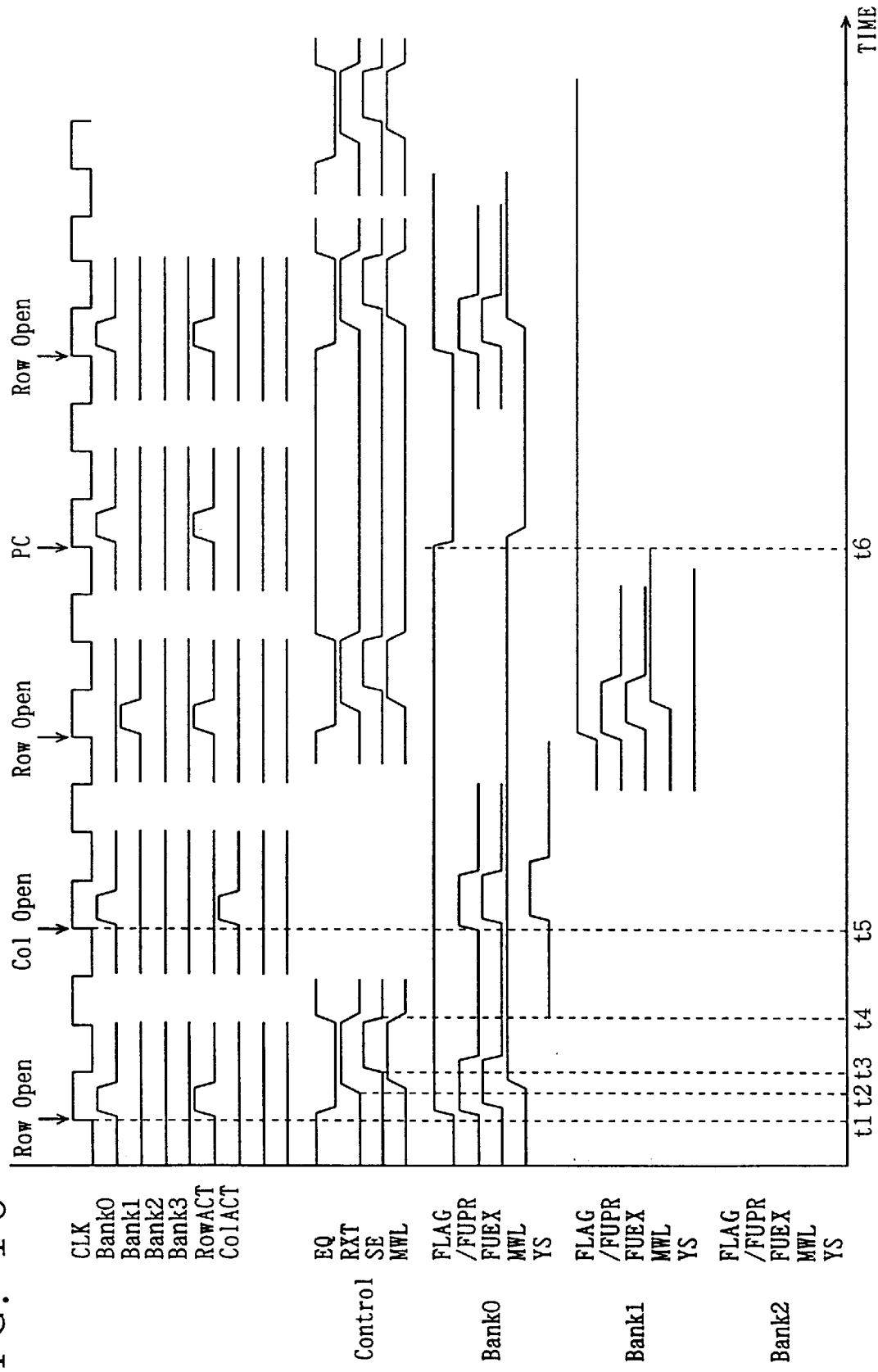
FIG. 10 is an operation waveform diagram for describing an operation of the address bus of semiconductor memory device 1000 of the first embodiment.

FIG. 10 is an operation waveform diagram for describing the operation at the address bus in semiconductor memory device 1000 of the first embodiment.

At time t1 in FIG. 10, selected bank 0 is activated. The equalized state of the bit line pair in the selected bank is cancelled according to inactivation of equalize signal EQ.

At time t2, word line activation signal RXT is rendered active. A select operation of a word line corresponding to a row address signal is effected. At time t3, the data from the selected plurality of memory cells are amplified as corresponding bit line potential according to activation of sense amplifier activation signal SE.

At time t4, word line activation signal RXT is rendered inactive, and also the activation signal of the main word line is rendered inactive. However, the address signal input to bank 0 is retained by the level holding circuit. Therefore, the main word line in bank 0 retains an activated state.

At time t5, in response to activation of signal ColACT corresponding to specification of a read out operation, a column address signal is received by the selected bank. Signal YS is rendered active, and the selected memory cell is connected to a sense amplifier. Data is read out from the bank and retained.

At time t6, the activation period of main word line activation signal MWL in bank 0 ends and signal PC is rendered active. Accordingly, the selected bank is precharged.

In the other banks, a select operation of a word line and the like is carried out independently according to the row bank address and the column bank address.

Figure 11:
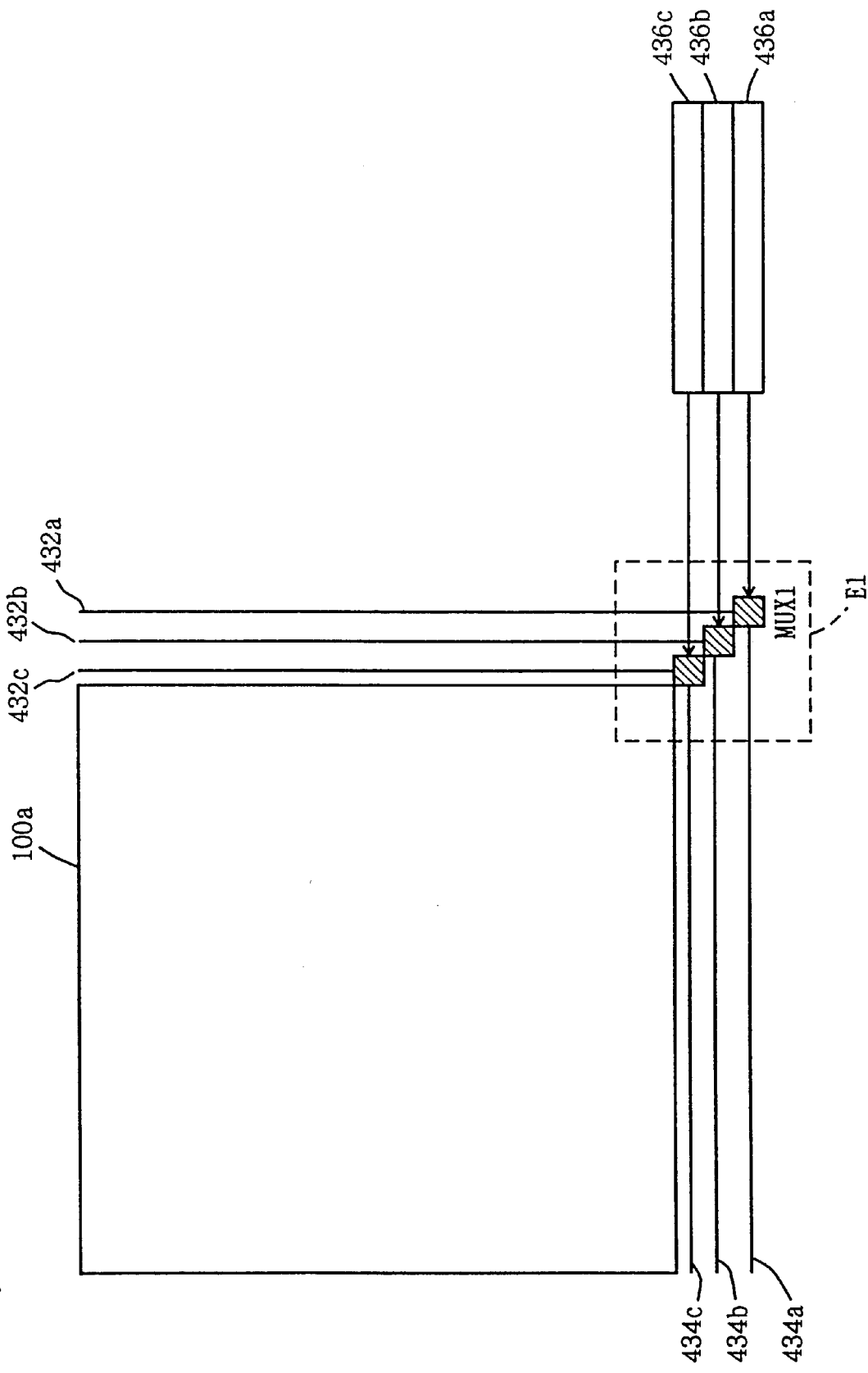
FIG. 11 is a schematic block diagram for describing an arrangement of a redundancy determination circuit of the first embodiment.

FIG. 11 is a block diagram for describing the arrangement of the redundancy determination circuit of the first embodiment.

Referring to FIG. 11, row related spare activation signal lines 432a–432c and column related spare activation signal lines 434a–434c are provided with respect to memory bank 100a. Redundancy determination circuits 436a–436c are assigned with replacement addresses. When a corresponding address is externally specified, one of the spare activation signal lines 432a–432c and 434a–434c is rendered active via a multiplexer unit E1.

Figure 12:
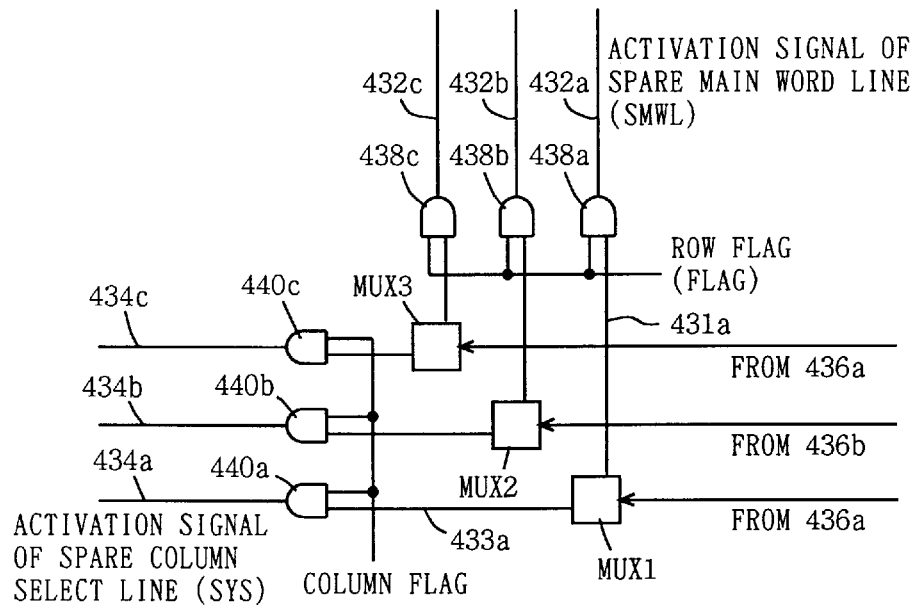
FIG. 12 is an enlarged view of the E1 portion of FIG. 11.

FIG. 12 is an enlargement of multiplexer unit E1 of FIG. 11. Referring to FIG. 12, multiplexer unit E1 includes multiplexers MUX1, MUX2, and MUX3 receiving a redundancy determination signal output from redundancy determination circuits 436a–436c, respectively, AND circuits 440a, 440b, and 440c receiving a column related replacement signal output from multiplexers MUX1, MUX2 and MUX3 at its first input and a column flag at its second input, respectively, and AND circuits 438a, 438b and 438c receiving a row related replacement signal output from multiplexers MUX1, MUX2 and MUX3, respectively, at its first input and a row flag FLAG at its second input.

AND circuits 440a, 440b, and 440c provide an activation signal rendering a spare column select line active to nodes 434a, 434b and 434c. AND circuits 438a, 438b and 438c provide an activation signal rendering a spare line active to nodes 432a, 432b and 432c.

Figure 13:
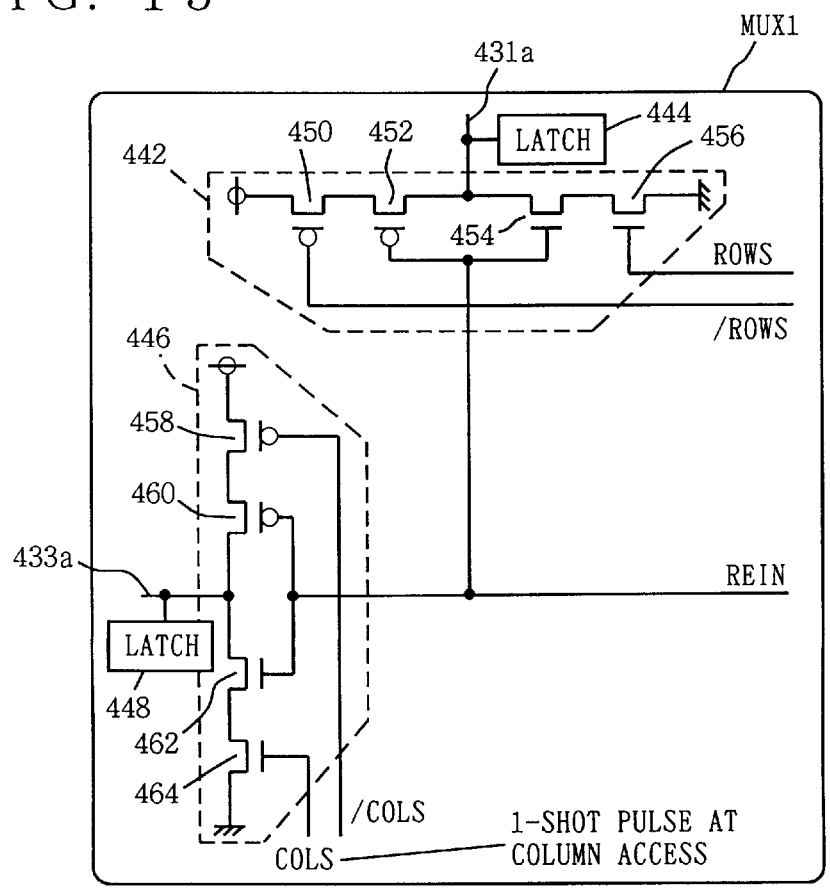
FIG. 13 is a circuit diagram showing a structure of a multiplexer MUX 1 of FIG. 12.

FIG. 13 is a circuit diagram showing a structure of multiplexer MUX1 of FIG. 12.

Referring to FIG. 13, multiplexer MUX1 includes a clocked inverter 442 rendered active in response to complementary activation signals ROWS and /ROWS activated according to the access timing related to a row to receive and invert a redundancy determination signal REIN output from a redundancy determination circuit, a latch circuit 444 for retaining the output of clocked inverter 442, a clocked inverter 446 rendered active in response to complementary activation signal COLS and /COLS activated according to the access timing related to a column to receive and invert redundancy determination signal REIN, and a latch circuit 448 for retaining the output of clocked inverter 446.

Clocked inverter 442 includes P channel MOS transistors 450 and 452 connected in series between a power supply node and a node 431*a* to receive activation signal /ROWS and redundancy determination signal REIN at respective gates, and N channel MOS transistors 456 and 454 connected in series between a ground node and node 431*a* to receive activation signal ROWS and redundancy determination signal REIN at respective gates. The potential of the signal of node 431*a* corresponds to the row related replacement signal.

Clocked inverter 446 includes P channel MOS transistors 458 and 460 connected in series between the power supply node and a node 433*a* for receiving activation signal /COLS and redundancy determination signal REIN at respective gates, and N channel MOS transistors 464 and 462 connected in series between the ground node and node 433*a* for receiving activation signal COLS and redundancy determination signal REIN at respective gates. The potential of the signal at node 433*a* corresponds to the column related replacement signal.

The structure of MUX2 and MUX of FIG. 12 is similar to that of the above-described MUX1. Therefore, description thereof will not be repeated.

FIG. 14 is a circuit diagram for describing a structure of redundancy determination circuit 436*a* of FIG. 11.

Referring to FIG. 14, redundancy determination circuit 436*a* includes an address program unit PROG1 receiving complementary address signals A0, /A0, A1, /A1, A2, /A2, A3, and /A3 from the address bus for coupling a common node NCOM1 to the ground potential when a predetermined address is not input, a row/column identify unit PROG2 set indicating whether the redundancy memory array to be replaced is related to a row or a column for coupling common node NCOM1 to the ground potential at the timing when an array not set is activated, and a P channel MOS transistor 486 rendered active according to a precharge signal /FURE to couple common node NCOM1 to the power supply potential.

Redundancy determination circuit 436*a* further includes an inverter 490 for receiving and inverting the potential of common node NCOM1, a P channel MOS transistor 488 for coupling common node NCOM1 to the power supply potential according to the output of inverter 490, and an inverter 492 for receiving and inverting the output of inverter 490. The output of inverter 492 is applied to multiplexer MUX1 as redundancy determination signal REIN.

Address program unit PROG1 includes program units 498–512 connected in parallel between common node NCOM1 and the ground node to receive address signals A0, /A0, A1, /A1, A2, /A2, A3, and /A3, respectively.

Row/column identification unit PROG2 includes program units 493–496 connected in parallel between common node NCOM1 and the ground node for receiving activation signals ROWS, /ROWS, COLS, and /COLS, respectively.

Figure 15:
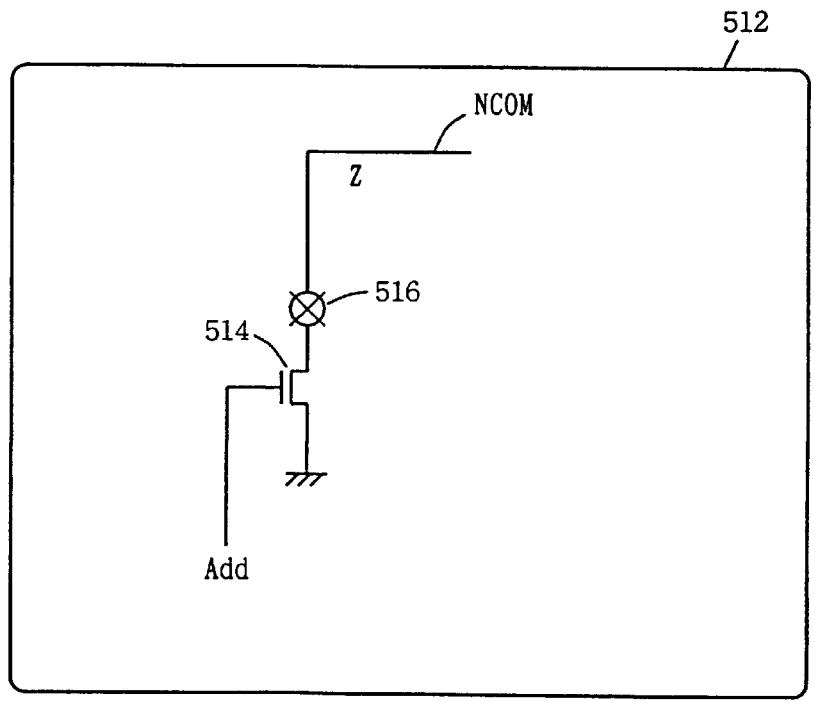
FIG. 15 is a circuit diagram showing the structure of a programming element PROG1 of FIG. 14.

FIG. 15 is a circuit diagram showing a structure of program unit 512 of FIG. 14.

Referring to FIG. 15, program unit 512 includes a fuse element 516 and an N channel MOS transistor 514 connected in series between common node NCOM and the ground node. N channel MOS transistor 514 receives address signal Add at its gate.

The fuse element used in setting an address is blown out by a laser beam and the like or by conducting a current flow to break the connection.

Each of program units 493–510 of FIG. 14 has a structure similar to that of program unit 512. Therefore, description thereof will not be repeated.

FIG. 16 is an operation waveform diagram for describing the redundant address transmission according to the structure of FIG. 11.

Referring to FIGS. 14 and 16, a row access is issued from the control circuit generating an internal control signal at time t1. In response, a row flag FLAG is activated in the bank at time t2.

At time t3, precharge signal /FURE applied to the redundancy determination circuit is cancelled and redundancy determination is effected by a redundancy determination signal FUEX. Since the fuse element in program unit 493 to which activation signal ROWS is applied is blown out, common node NCOM1 is not coupled to the ground potential at the accessed timing by row/column identification unit PROG2.

When the address set at address program unit PROG1 matches the received address, common node NCOM1 will not be coupled to the ground potential by program unit PROG1. Therefore, the potential of common node NCOM1 attains an H level, whereby redundancy determination signal REIN is output as the determination result to multiplexer MUX1. At the same time, the determination result is latched and retained after the determination result is transmitted by signal ROWS that sends the result to the row side.

At time t4, spare main word line SMWL is rendered active when the redundant row array in the row related redundant unit is used according to the latched determination result information.

The operation subsequent to time t5 corresponds to the access to a column.

At time t5, an access to a column is issued from the control circuit that generates an internal control signal. In response, the column flag is activated at the bank unit at time t6.

At time t7, precharge signal /FURE applied to the redundancy determination circuit is cancelled. Redundancy determination is effected by redundancy determination signal FUEX. Comparison with the contents set at row/column identification unit PROG2 and address program unit PROG1 is preformed to output the determination result.

At the same time, the determination result is latched and retained after being transmitted by signal COLS that transmits the result to the column side. At time t8, spare column line SYS is rendered active when a redundant column array in the column related redundant unit is to be used according to the latched determination result information.

According to the above-described structure, a common redundancy determination circuit can accommodate both the usage of a row related redundant unit and a column related redundant unit to allow reduction in the number of redundancy determination circuits. Therefore, the area of the semiconductor memory device can be reduced.

Second Embodiment

FIG. 17 is a block diagram for describing the arrangement of a redundancy determination circuit according to a second embodiment of the present invention.

The second embodiment corresponds to the case where a redundancy determination circuit is shared by a plurality of banks.

Referring to FIG. 17, memory bank 100*b* is provided, in addition to the structure described with reference to FIG. 11. Row related spare activation signal lines 522*a*–522*c* and column related spare activation signal lines 524*a*–524*c* are also provided corresponding to memory bank 100*b*. Redundancy determination circuits 437a–437c provided instead of redundancy determination circuits 436a–436c are also connected to spare activation signal lines 522a–522c and 524a–524c via a multiplexer unit E2. Multiplexer unit E2 has a structure similar to that of multiplexer unit E1 of FIG. 12. The remaining structure is similar to that of FIG. 11. Therefore, description thereof will not be repeated.

Figure 18:
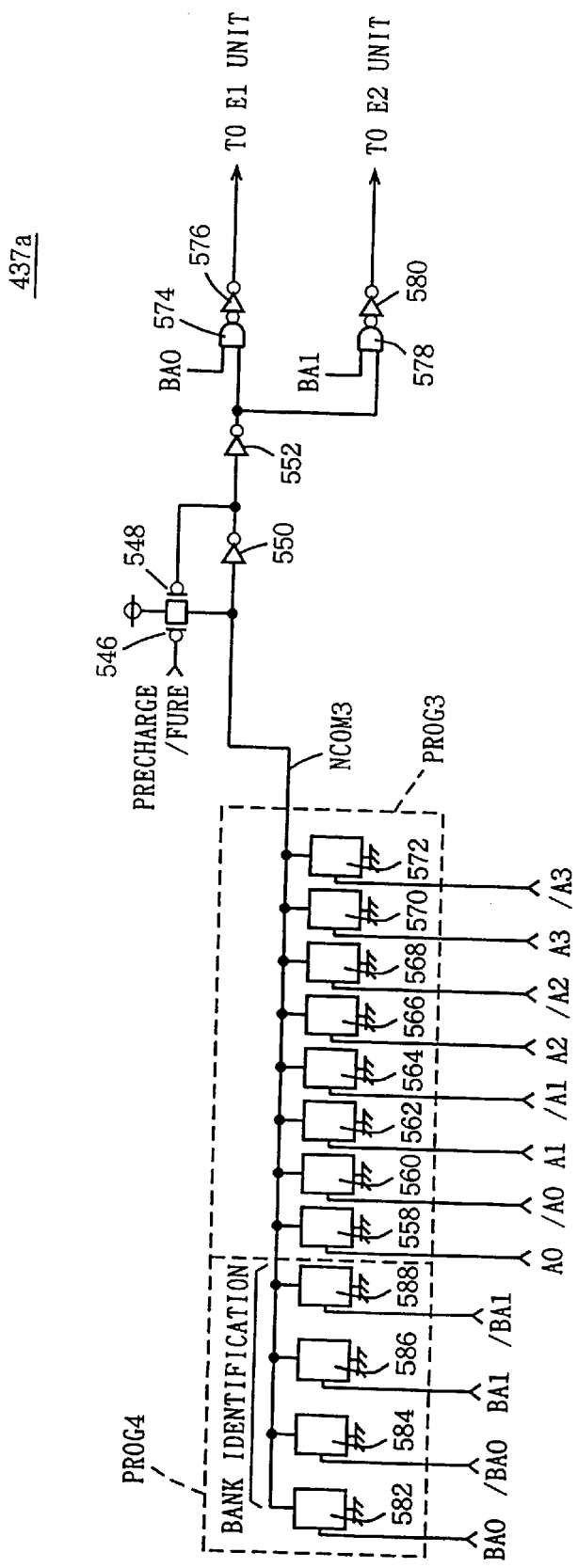
FIG. 18 is a block diagram for describing a structure of a redundancy determination circuit 437a of the second embodiment.

FIG. 18 is a block diagram for describing a structure of a redundancy determination circuit 437a of the second embodiment.

Referring to FIG. 18, redundancy determination circuit 437a includes an address program unit PROG3 receiving complementary address signals A0, /A0, A1, /A1, A2, /A2, A3, and /A3 from the address bus to couple a common node NCOM3 to the ground potential when the set address does not match the input address, and a bank identification unit PROG4 set indicating whether the address to be replaced is the address of bank 0 or bank 1 to couple common node NCOM3 to the ground potential when the set bank address does not match the activated bank address.

Redundancy determination circuit 437a further includes a P channel MOS transistor 546 rendered active in response to precharge signal /FURE to couple common node NCOM3 to the power supply potential, an inverter 550 for receiving and inverting the potential of common node NCOM3, a P channel MOS transistor 548 for coupling common node NCOM3 to the power supply potential according to the output of inverter 550, an inverter 552 for receiving and inverting the output of inverter 550, a NAND circuit 574 for receiving the output of inverter 552 and a bank 0 activation signal BA0, an inverter 576 for receiving and inverting the output of NAND circuit 574 to provide the inverted signal to a multiplexer unit, a NAND circuit 578 for receiving the output of inverter 552 and a bank 1 activation signal BA1, and an inverter 580 for receiving and inverting the output of NAND circuit 578 to provide the inverted signal to the multiplexer unit. The outputs of inverters 576 and 580 are applied to units E1 and E2 of FIG. 17.

Address program unit PROG3 includes program units 558–572 connected in parallel between common node NCOM3 and the ground node to receive address signals A0, /A0, A1, /A1, A2, /A2, A3, and /A3.

Bank identification unit PROG4 includes program units 582–588 connected in parallel between common node NCOM3 and the ground node for receiving activation signals BA0, /BA0, BA1, and /BA1.

The structure of each of program units 558–572 and 582–588 is similar to that of program unit 512 shown in FIG. 15. Therefore, description thereof will not be repeated.

When bank 0 is selected, the fuse element in the program unit that receives activation signal BA0 is blown out. When bank 1 is selected, the fuse element in the program unit that receives activation signal BA1 is blown out.

The operation will be described briefly hereinafter. First, an access is issued to a bank from the control circuit that generates the internal control signal. Precharge signal /FURE applied to the redundancy determination circuit corresponding to the bank unit is cancelled. If the bank receiving access is set in the bank identification unit, common node NCOM3 will not be coupled to the ground potential by bank identification unit PROG4. When the address set at program unit PROG3 matches the received address, program unit PROG3 will not couple common node NCOM3 to the ground potential. Therefore, the potential of common node NCOM3 attains an H level. By the function of NAND circuits 574 and 578 receiving the bank activation signal, the replacement designating signal is transmitted only to the bank subjected to access.

Since an address signal is supplied by a common address bus to each bank, the above-described structure can accommodate the usage of a redundant unit provided in a plurality of banks by a common redundancy determination circuit. The area of the semiconductor memory device can be further reduced since the number of redundancy determination circuits is reduced.

Third Embodiment

Figure 19:
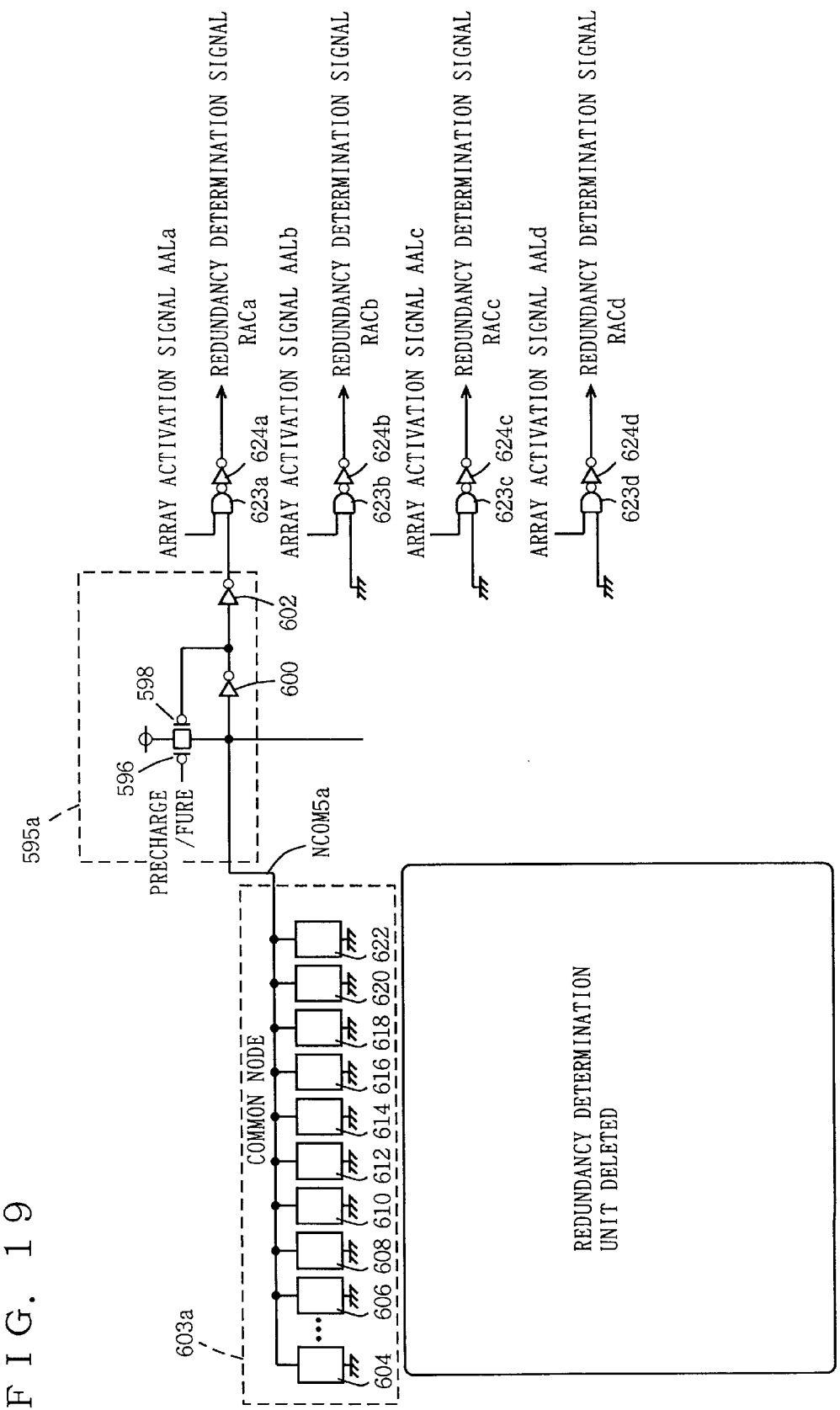
FIG. 19 is a block diagram for describing a structure of a redundancy determination circuit according to a third embodiment of the present invention.

FIG. 19 is a block diagram for describing a structure of a redundancy determination circuit according to a third embodiment of the present invention.

Referring to FIG. 19, the redundancy determination circuit of the third embodiment includes an address program unit 603a receiving complementary address signals from the address bus not to couple a common node NCOM5a to the ground potential when a predetermined set address is input, a retain circuit 595a activated according to precharge signal /FURE to couple common node NCOM5a to the power supply potential and retaining the potential of common node NCOM5a at an H level when address program unit 603a does not couple the common node to the ground potential, a NAND circuit 623a receiving the output signal of retain circuit 595a and an activation signal AALa of the memory block where the redundant memory array is provided, and an inverter 624a receiving and inverting the output of NAND circuit 623a to provide the inverted signal as a redundancy determination signal RACa to a corresponding redundant memory array.

The redundancy determination circuit further includes NAND circuits 623b–623d receiving activation signals AALb, AALc, and AALd of a memory block in which a corresponding redundant memory array is provided at respective first inputs and the ground potential at respective second inputs, and inverters 624b–624d receiving and inverting the outputs of NAND circuits 623b–623d to provide the inverted signal as redundancy determination signals RACb, RACb, and RACd, respectively, to a corresponding redundant memory array. The redundancy determination signal output from inverters 624b–624d is always inactive.

Address program unit 603a includes program units 604–622 connected in parallel between respective common nodes to which a predetermined address is input and the ground node. Each structure of program units 604–622 is similar to that of program unit 512 of FIG. 15. Therefore, description thereof will not be repeated.

Retain circuit 595a includes a P channel MOS transistor 596 rendered active according to precharge signal /FURE to couple a common node NCOM5a to the power supply potential, an inverter 600 for receiving and inverting the potential of common node NCOM5a, a P channel MOS transistor 598 coupling common node NCOM5a to the power supply potential according to the output of inverter 600, and an inverter 602 receiving and inverting the output of inverter 600.

In general, at the early stage of development of a new semiconductor device, the completion of a chip is often not sufficient. There are unstable factors during the fabrication process, and the production yield is often unstable. It is therefore desirable to use all redundant memory arrays at the beginning of the development process. However, when the fabrication process becomes stable and the completion of the chip is high enough, it is rare that many redundant memory arrays are used simultaneously in one chip.

Modification of the array unit of a redundant memory array implies modification of the memory cell array unit. By just increasing or reducing the number of redundancy determination circuits including a large fuse element and rendering an unused redundant memory array inactive, modification can be carried out in a short period of time when the production becomes stable to allow reduction in cost.

The need arises for a semiconductor memory device that has a great number of redundancy determination circuits at the early stage of development to allow usage of many redundant memory arrays simultaneously while allowing unrequired redundancy determination circuits to be easily removed in the actual production stage to reduce the chip size.

Figure 20:
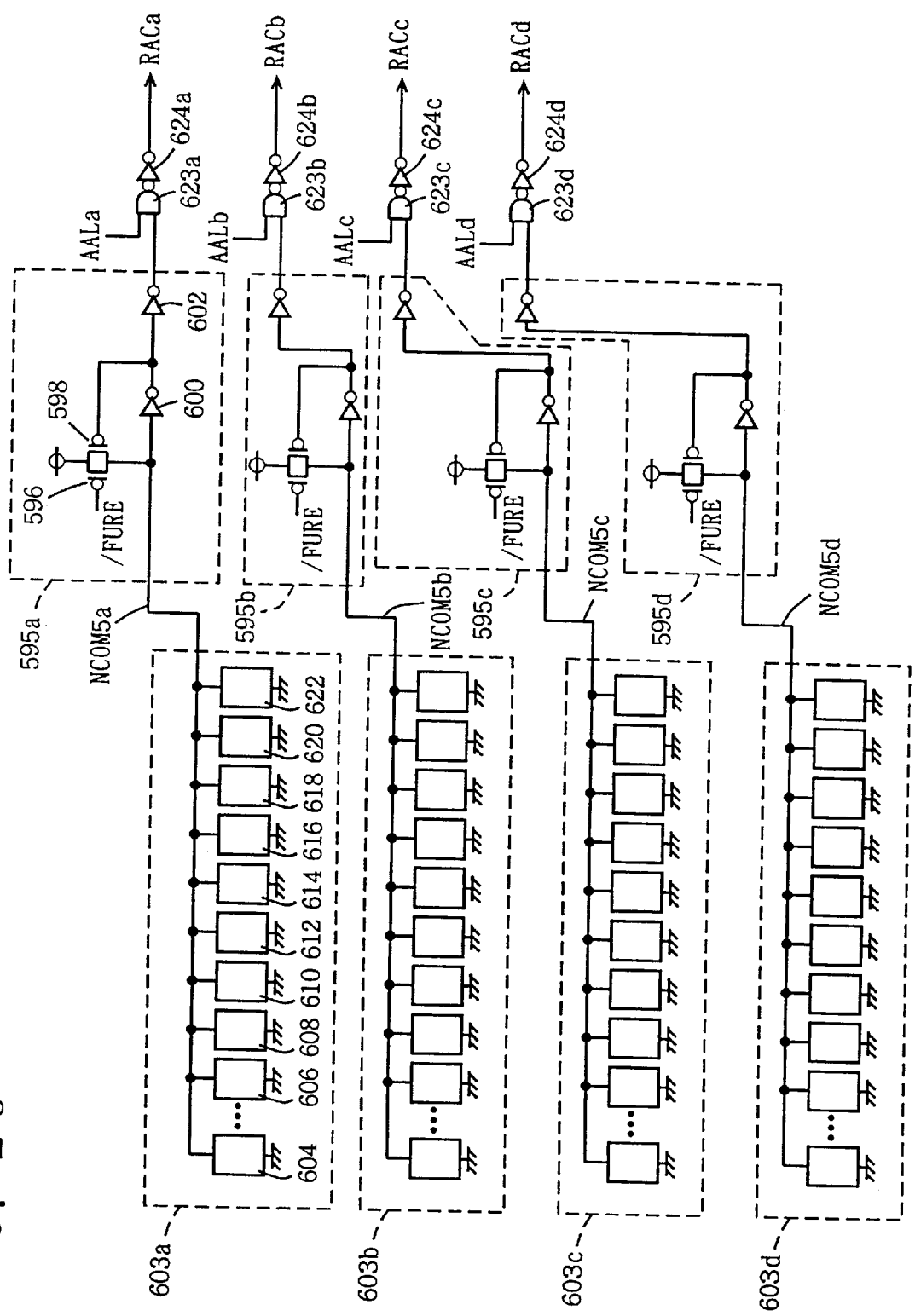
FIG. 20 is a block diagram for describing a structure of a redundancy determination circuit of the third embodiment at an early stage of development.

FIG. 20 is a block diagram for describing a structure of a redundancy determination circuit according to the third embodiment at the early stage of development.

Referring to FIG. 20, the redundancy determination circuit at an early stage of development includes, in addition to the structure shown in FIG. 19, address program units 603b–603d receiving complementary address signals from the address bus not to couple common nodes NCOM5b–NCOM5d respectively to ground potential when a predetermined set address is input, and retain circuits 595b–595d rendered active according to precharge signal /FURE to couple common nodes NCOM5b–NCOM5d respectively to the power supply potential and retaining the potential of the common node at the H level when address program units 603b–603d do not couple the common node to the ground potential.

NAND circuits 623b–623d have their second inputs connected to the outputs of retain circuits 595b–595d, respectively, instead of the ground potential.

The structure of address program units 603b–603d and retain circuits 595b–595d is similar to that of address program unit 603a and retain circuit 595a, respectively, of FIG. 19. Therefore, description thereof will not be repeated.

Figure 21:
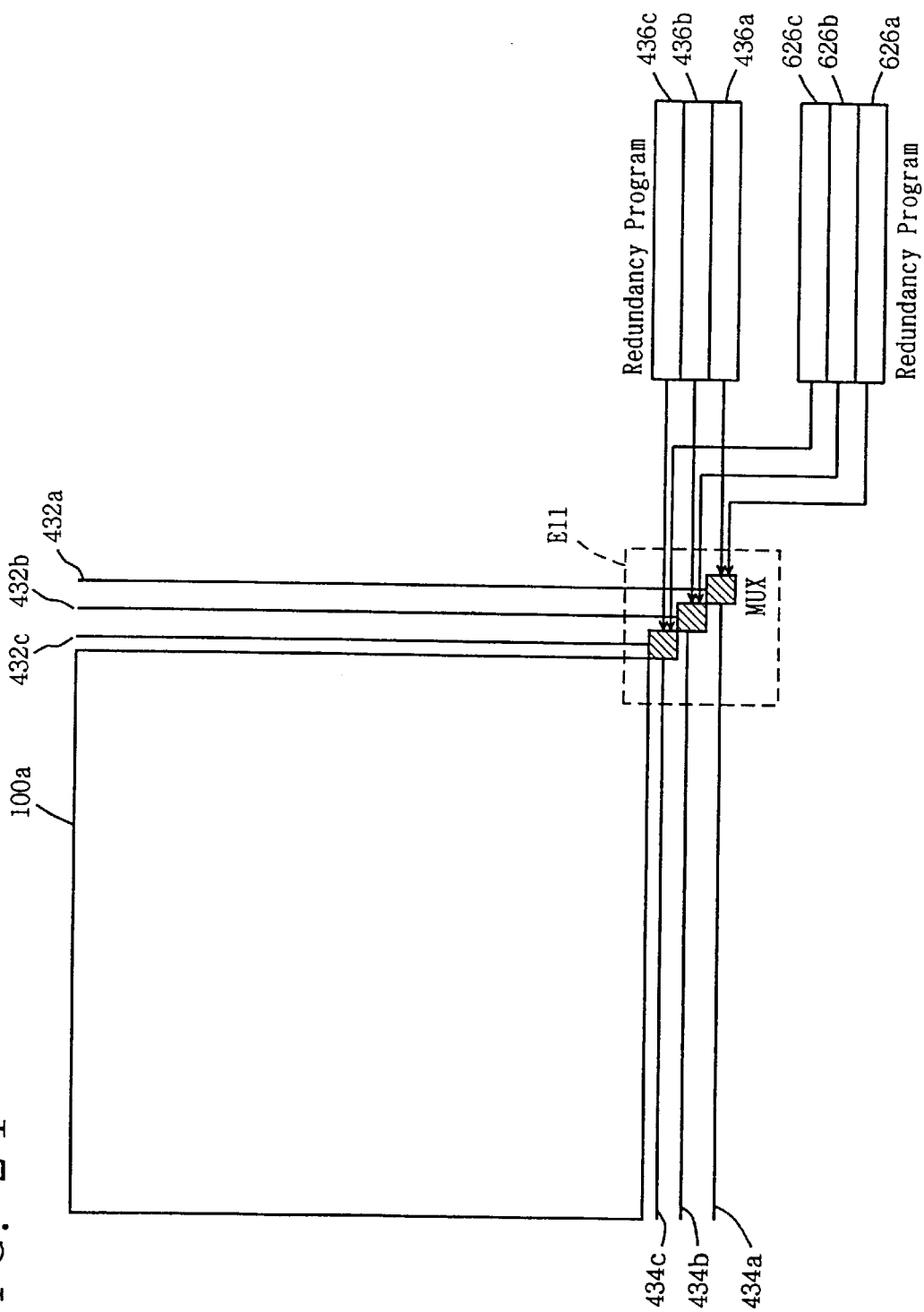
FIG. 21 is a schematic block diagram for describing an arrangement of a redundancy determination circuit at an early stage of development.

FIG. 21 is a block diagram for describing the arrangement of the redundancy determination circuit at the early stage of development.

Referring to FIG. 21, row related spare activation signal lines 432a–432c and column related spare activation signal lines 434a–434c are provided with respect to memory bank 100a. Redundancy determination circuit 436a–436c are assigned with a row related replacement address. When a corresponding address is specified, spare activation signal lines 432a–432c are activated via multiplexer unit E11.

Redundancy determination circuits 626a–626c are assigned with a column related replacement address. When a corresponding address is specified, spare activation signal lines 434a–434c are activated via multiplex unit E11.

Figure 22:
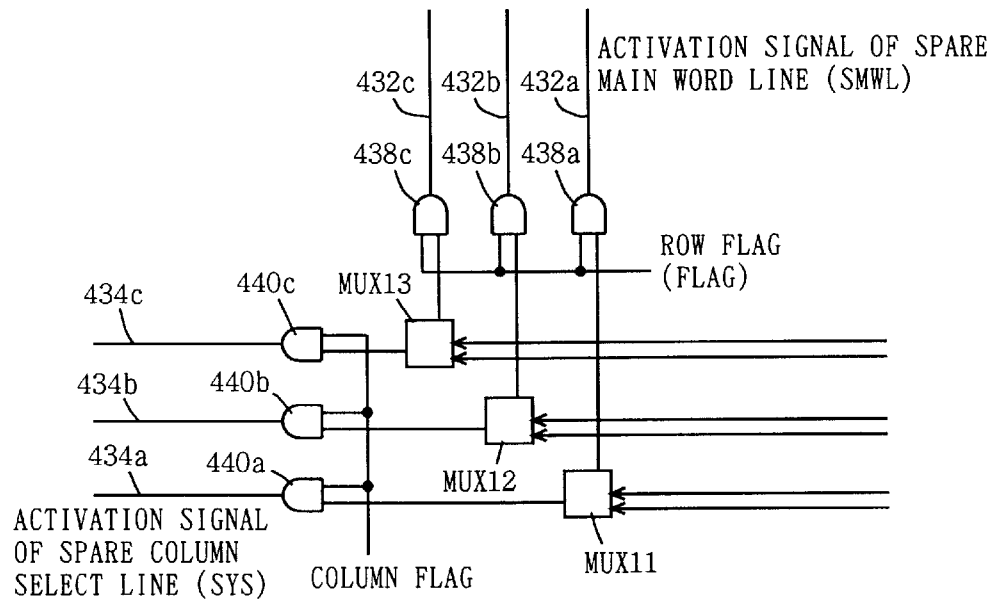
FIG. 22 is an enlargement view of the E11 portion of FIG. 21.

FIG. 22 shows an enlargement of multiplex unit E11 of FIG. 21. Referring to FIG. 22, multiplex unit E11 includes multiplexers MUX11, MUX12 and MUX13 receiving a redundancy determination signal output from redundancy determination circuits 436a–436c at respective first inputs and a redundancy determination signal output from redundancy determination circuits 626a–626c at respective second inputs, instead of multiplexers MUX1, MUX2 and MUX3, in multiplex unit E1 of FIG. 12.

The column related replacement signal output from multiplexers MUX11, MUX12 and MUX13 is input to AND circuits 440a, 440b, and 440c, respectively. The row related replacement signal output from multiplexers MUX11, MUX12 and MUX13 is applied to AND circuits 438a, 438b and 438c, respectively.

The remaining elements are similar to those shown in FIG. 12. Therefore, description thereof will not be repeated.

Figure 23:
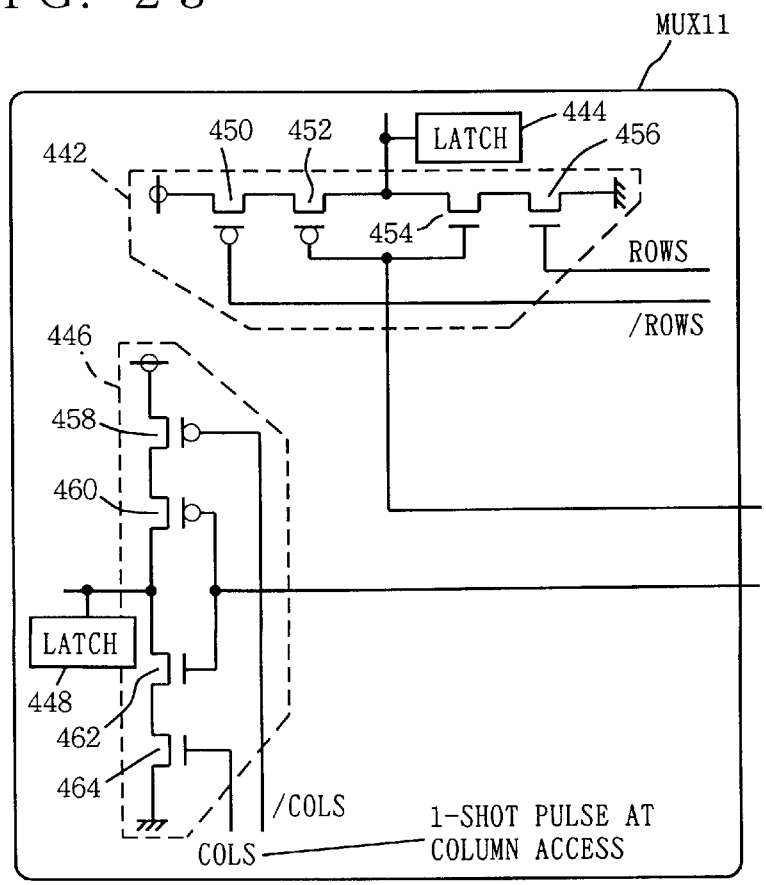
FIG. 23 is a circuit diagram showing a structure of a MUX 11 of FIG. 22.

FIG. 23 is a circuit diagram showing a structure of multiplexer MUX11 of FIG. 22.

Referring to FIG. 23, multiplexer MUX11 differs from multiplexer MUX1 of FIG. 13 in that the input of clocked inverter 442 is separated from the input of clocked inverter 446, clocked inverter 442 receives a redundancy determination signal output from redundancy determination circuit 436a, and clocked inverter 446 receives a redundancy determination signal from redundancy determination circuit 626a. The remaining elements are similar to those shown in FIG. 13. Therefore, description thereof will not be repeated.

The number of redundancy determination circuits can easily be increased while still including multiplexer MUX1 by separating the input unit of that multiplexer. The needs at the early stage of development can be satisfied. By providing such a structure including a multiplexer at the early stage of development, the number of redundancy determination circuits can be reduced easily when production becomes stable to reduce the chip size.

Fourth Embodiment

Figure 24:
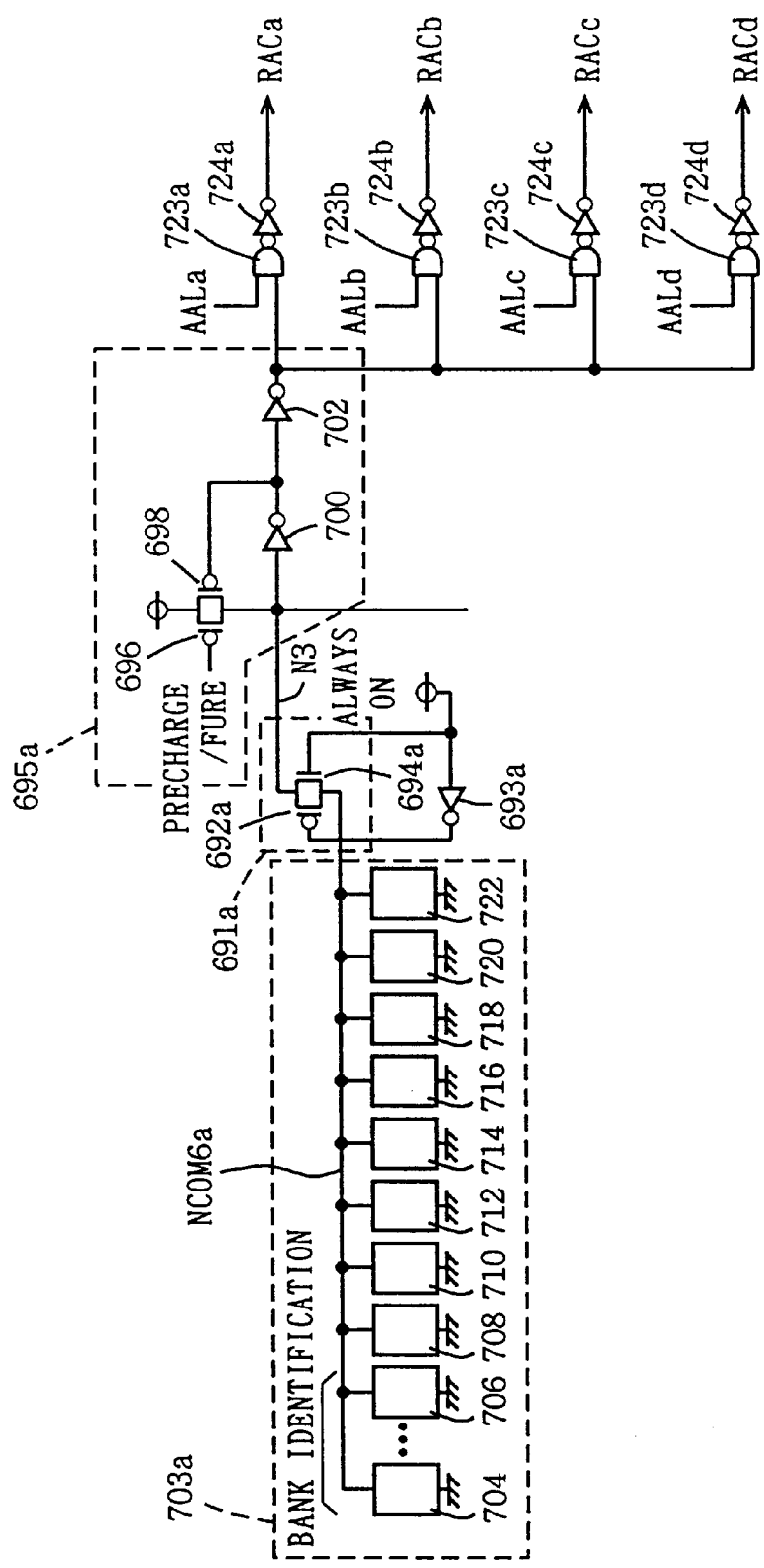
FIG. 24 is a block diagram for describing a structure of a redundancy determination circuit according to a fourth embodiment of the present invention.

FIG. 24 is a block diagram for describing a structure of a redundancy determination circuit according to a fourth embodiment of the present invention.

In the previous third embodiment, a portion of the redundant memory array is not used and the redundancy determination circuit provided corresponding to the unused redundant memory array is deleted to reduce the chip size at the time of mass production.

However, it may be better to use in common a redundancy determination circuit between banks rather than disabling usage of the incorporated redundant memory array. This provides the advantage of allowing repair of the chip even in the case where the defective location is gathered at one bank.

Referring to FIG. 24, the redundancy determination circuit of the fourth embodiment includes an address program unit 703a receiving complementary address signals from the address bus and a bank activation signal to couple a common node NCOM6a to the ground potential when an address other than the set address of a set bank is input, a switch circuit 691a for connecting common node NCOM6a with a node N3, a retain circuit 695a rendered active according to precharge signal /FURE to couple node N3 to the power supply potential and retaining the potential of common node N3 at an H level when address program unit 703a does not couple common node NCOM6a to the ground potential, a NAND circuit 723a receiving the output signal of retain circuit 695a and an activation signal AALa of the memory block in which the redundant memory array is provided, and an inverter 724a receiving and inverting the output of NAND circuit 723a to output the inverted signal as a redundancy determination signal RACa to a corresponding memory array.

The redundancy determination circuit further includes a NAND circuit 723b receiving the output signal of retain circuit 695a and activation signal AALb of the memory block where the redundant memory array is provided, an inverter 724b receiving and inverting the output of NAND circuit 723b for providing the inverted signal as redundancy determination signal RACb to a corresponding redundant memory array, a NAND circuit 723c receiving the output signal of retain circuit 695a and an activation signal AALc of the memory block where the redundant memory array is provided, an inverter 724c receiving and inverting the output of NAND circuit 723c for providing the inverted signal as a redundancy determination signal to the redundant memory array, a NAND circuit 723d receiving the output signal of retain circuit 695a and an activation signal AALd of the memory block where the redundant memory array is provided, and an inverter 724d receiving and inverting the output of NAND circuit 723d for providing the inverted signal as a redundancy determination signal to a corresponding redundant memory array.

Address program unit 703a includes program units 704–722 connected in parallel between respective common nodes to which a predetermined address is input and the ground node. The structure of each of program units 704–722 is similar to that of program unit 512 of FIG. 15. Therefore, description thereof will not be repeated.

Switch circuit 691a includes a P channel MOS transistor 692a connected between common node NCOM6a and node N3, and an N channel MOS transistor 694a connected between common node NCOM6a and node N3. N channel MOS transistor 694a has its gate fixed to the power supply potential. The output of inverter 693a to which the power supply potential is applied at its input is provided to the gate of P channel MOS transistor 692a. In other words, P channel MOS transistor 692a and N channel MOS transistor 694a are always conductive.

Retain circuit 695a includes a P channel MOS transistor 696 rendered active according to precharge signal /FURE to couple node N3 to the power supply potential, an inverter 700 for receiving and inverting the potential of node N3, a P channel MOS transistor 698 coupling node N3 to the power supply potential according to the output of inverter 700, and an inverter 702 receiving and inverting the output of inverter 700.

The operation will be described now.

First, an access to a bank is issued from the control circuit that generates an internal control signal. Precharge signal /FURE applied to the redundancy determination circuit corresponding to the accessed bank is cancelled. When the bank that is accessed is set in the bank identification unit and a set address is received, common node NCOM6a attains an H level. This replacement designation signal is transmitted only to the bank that is accessed by the function of NAND circuits 723a–723d receiving the bank activation signal.

Figure 25:
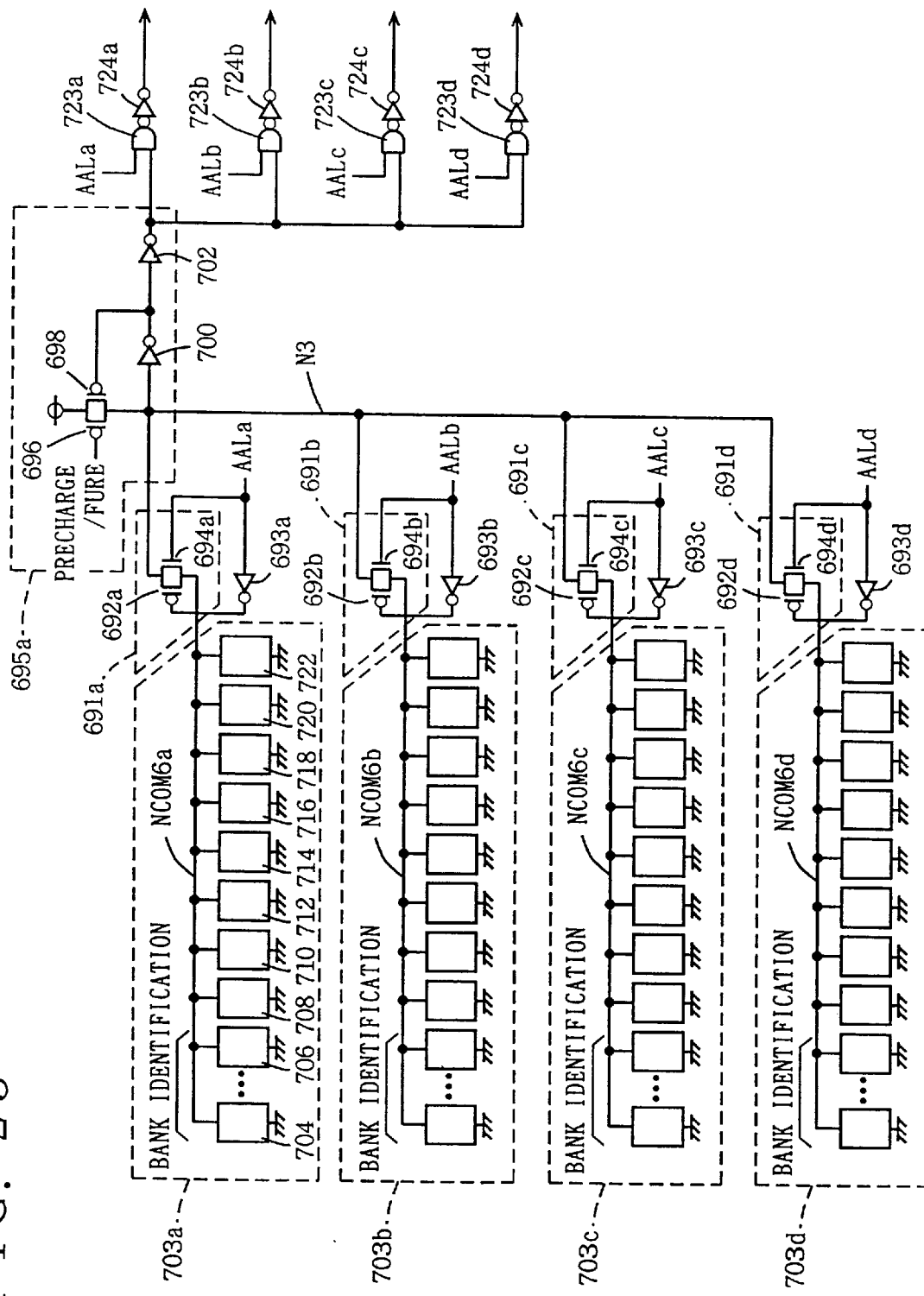
FIG. 25 is a block diagram for describing a structure of a redundancy determination circuit according to the fourth embodiment at an early stage of development.

FIG. 25 is a block diagram for describing a structure of a redundancy determination circuit of the fourth embodiment at an early stage of development.

The redundancy determination circuit at the early stage of development includes, in addition to the structure shown in FIG. 24, an address program unit 703b receiving complementary address signals from the address bus and a bank activation signal to disconnect a common node NCOM6b from the ground potential when the set address is applied to the specified bank, a switch circuit 691b for connecting common node NCOM6b with node N3, an address program unit 703c receiving complementary address signals from the address bus and the bank activation signal to disconnect a common node NCOM6c from the ground potential when a set address is input to the specified bank, a switch circuit 691c for connecting common node NCOM6c with node N3, an address program unit 703d receiving complementary address signals from the address bus and a bank activation signal to disconnect a common node NCOM6d from the ground potential when a set address is input to the specified bank, and a switch circuit 691d for connecting common node NCOM6d with node N3.

Each of address program units 703b–703d has a structure similar to that of address program unit 703a. Therefore, description thereof will not be repeated.

Switch circuit 691a includes a P channel MOS transistor 692a and an N channel MOS transistor 694a connected in parallel between common node NCOM6a and node N3.

Activation signal AALa is applied to the gate of N channel MOS transistor 694a. The gate of P channel MOS transistor 692a receives the inverted output of inverter 693a to which activation signal AALa is applied. More specifically, when the bank specified in program units 704–706 that effects bank identification in address program unit 703a is activated by activation signal AALa, P channel MOS transistor 692a and N channel MOS transistor 694a are rendered conductive.

Switch circuit 691b includes a P channel MOS transistor 692b and an N channel MOS transistor 694b connected in parallel between common node NCOM6b and node N3.

Activation signal AALb is applied to the gate of N channel MOS transistor 694b. The gate of P channel MOS transistor 692b receives the inverted output of inverter 693b to which activation signal AALb is applied. More specifically, when the bank set at program units 704–706 that effects bank identification in address program unit 703b is rendered active by activation signal AALb, P channel MOS transistor 692b and N channel MOS transistor 694b are rendered conductive.

Switch circuit 691c includes a P channel MOS transistor 692c and an N channel MOS transistor 694c connected in parallel between common node NCOM6c and node N3.

The gate of N channel MOS transistor 694c receives activation signal AALc. The gate of P channel MOS transistor 692c receives the inverted output of inverter 693c to which activation signal AALc is applied. More specifically, when the bank set at program units 704–706 effecting bank identification in address program unit 703c is activated by activation signal AALc, P channel MOS transistor 692c and N channel MOS transistor 694c are rendered conductive.

Switch circuit 691d includes a P channel MOS transistor 692d and an N channel MOS transistor 694d connected in parallel between common node NCOM6d and node N3.

Activation signal AALd is applied to the gate of N channel MOS transistor 694d. The gate of P channel MOS transistor 692d receives the inverted output of inverter 693d to which activation signal AALd is applied. More specifically, when the bank specified at program units 704–706 that effects bank identification in address program unit 703d is activated by activation signal AALd, P channel MOS transistor 692d and N channel MOS transistor 694d are rendered conductive.

The remaining elements are similar to those of FIG. 24. Therefore, description thereof will not be repeated.

Now, the operation will be described briefly.

First, access is issued to a bank from the control circuit that generates an internal control signal. Precharge signal /FURE applied to the redundancy determination circuit corresponding to the bank unit is cancelled. If the accessed bank is programmed in any of the bank identification units of address program units 703a–703d, any of switch circuits 691a–691d is rendered conductive, whereby node N3 is connected to any of common nodes NCOM6a–NCOM6d. For example, when the address set at program unit 703a is received, common node NCOM6a attains an H level. This replacement designation signal is transmitted only to the bank that is accessed by the function of NAND circuits 723a–723d receiving the bank activation signal.

Therefore, a plurality of redundant memory arrays can be used by means of a plurality of address program units at the early stage of development. Thus, many more chips can be repaired.

In contrast to the previous third embodiment in which the redundant memory array is partially rendered inactive in the mass production stage, the structure of the fourth embodiment provides the advantage that one of the redundant memory arrays residing in a plurality of banks can be rendered active by one redundancy determination circuit in the mass production stage. Therefore, many more chips can be repaired by the redundant memory array than in the case of the third embodiment.

The difference in the redundancy determination circuit between the stage of mass production and the early stage of development will be described hereinafter with reference to block diagrams.

Figure 26:
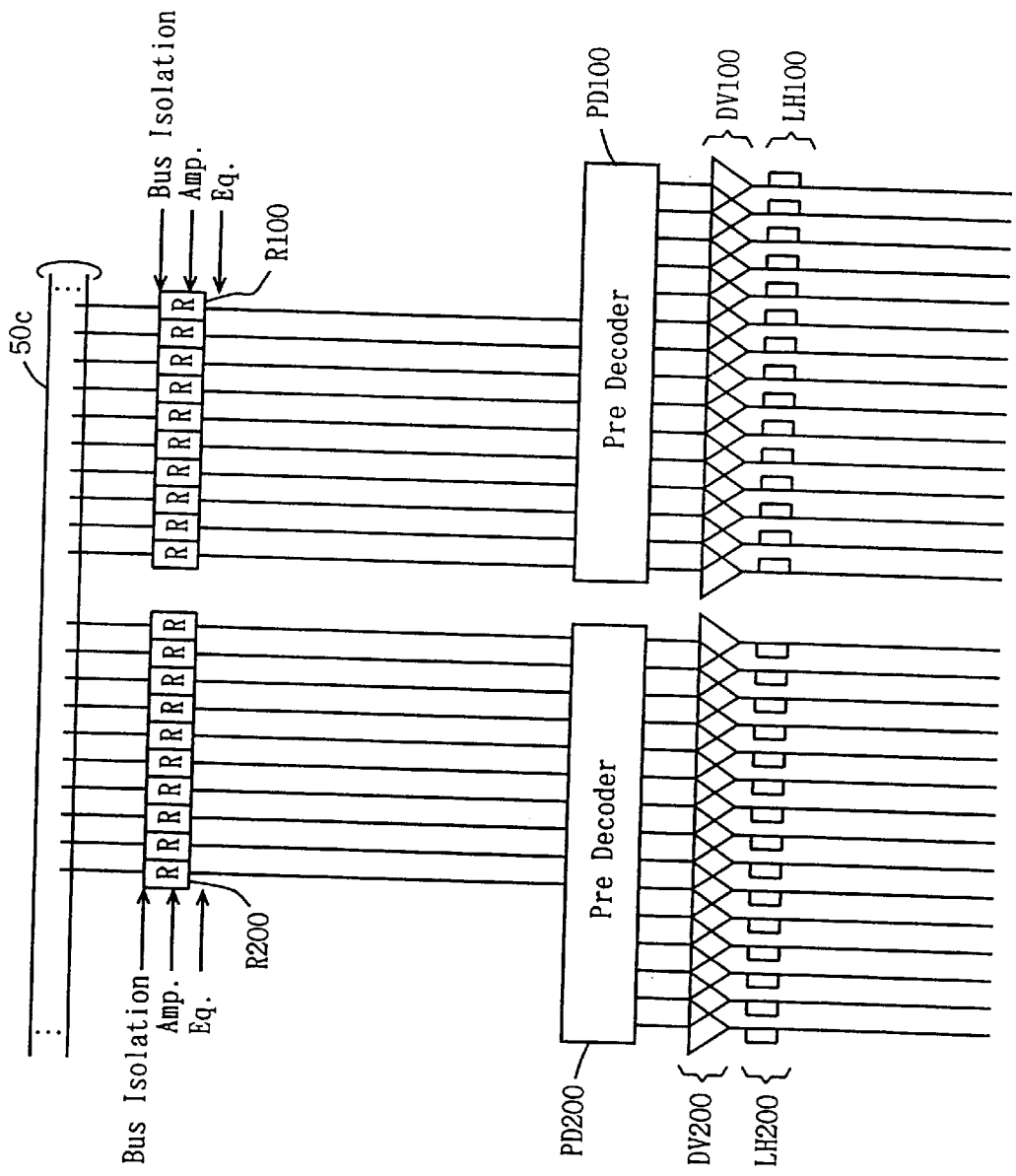
FIG. 26 is a schematic block diagram showing a structure of a row predecoder unit of the fourth embodiment at a mass production stage.

FIG. 26 is a schematic block diagram showing a structure of a row predecoder unit of the fourth embodiment at a mass production stage.

Referring to FIG. 26, amplify circuits R100 and R200 provided corresponding to banks 0 and 1, respectively, are rendered active according to a bank access to amplify the address signal transmitted via address data bus 50c. The output from amplify circuits R100 and R200 is applied to predecoders PD100 and PD200, respectively. The predecoded result is applied to respective driver circuits DV100 and DV200.

The output from driver circuits DV100 and DV200 is retained by level holding circuits LH100 and LH200, respectively, to be output to a row predecoder line of a corresponding bank.

Figure 27:
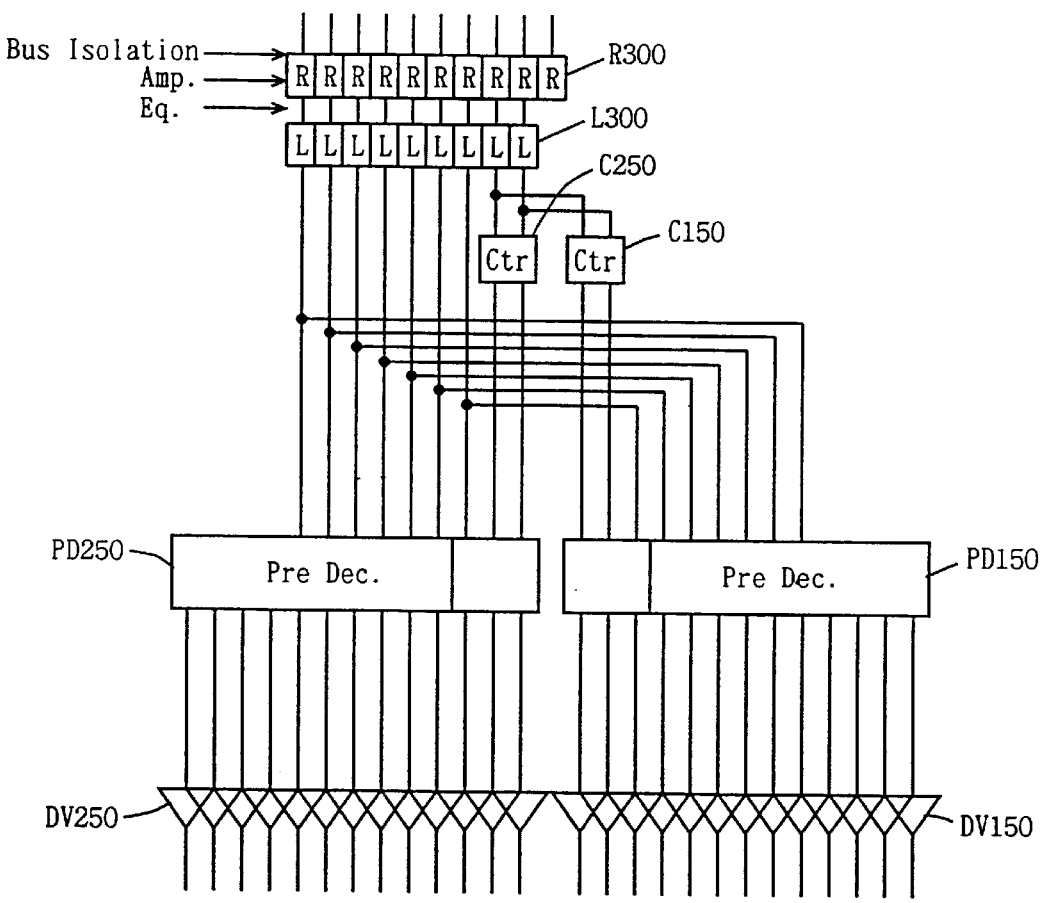
FIG. 27 is a schematic block diagram showing a structure of a column predecoder circuit of the fourth embodiment at a mass production stage.

FIG. 27 is a schematic block diagram showing a structure of a column predecoder unit of the fourth embodiment at a mass production stage.

Referring to FIG. 27, an amplify circuit R300 is provided corresponding to bank 0. Amplifier circuit R300 is rendered active according to a bank access to amplify the address signal transmitted via address data bus 50c. The output from amplify circuit R300 is retained by a latch circuit R300, and then applied to predecoders PD150 and PD250. The predecoded result from predecoders PD150 and PD250 is applied to driver circuits DV150 and DV250, respectively. The output of latch circuit L300 is partially provided to counter circuits C150 and C250 that counts for a burst operation.

The output of driver circuits DV150 and DV250 is output to a column predecoder line of a corresponding bank.

Circuitry similar to that of FIG. 27 is provided with respect to bank 1.

Figure 28:
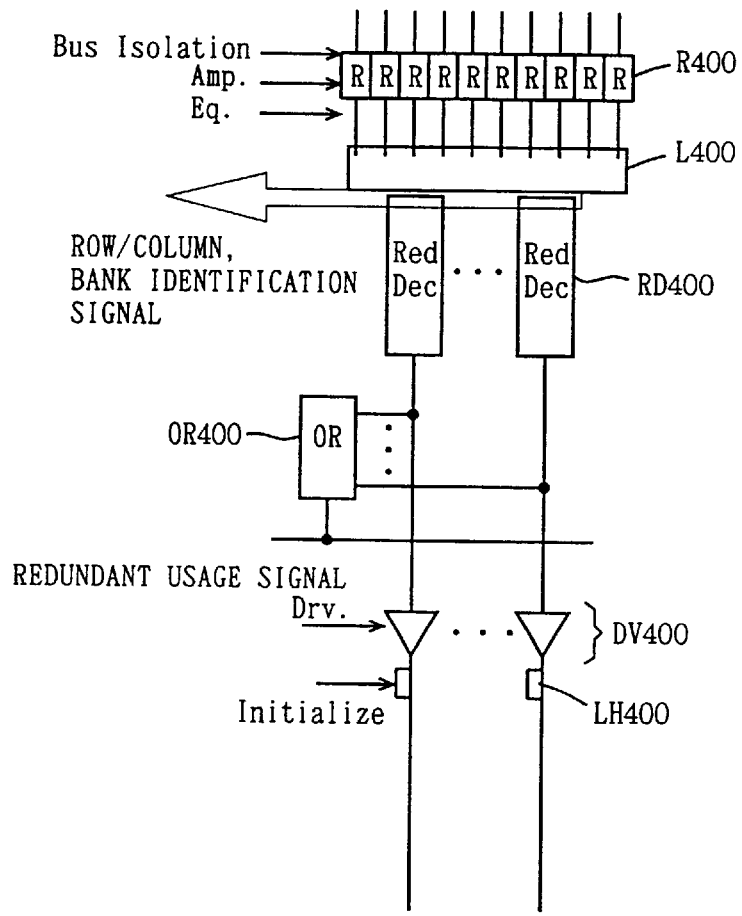
FIG. 28 is a schematic block diagram showing a structure of a redundancy control dedicated unit of the fourth embodiment at a mass production stage.

FIG. 28 is a schematic block diagram showing a structure of a redundancy dedicated control unit of the fourth embodiment at a mass production stage.

This redundancy dedicated control unit is provided corresponding to two banks, i.e. the row and column redundant memory array of banks 0 and 1.

Referring to FIG. 28, an amplify circuit R400 is provided corresponding to banks 0 and 1, and rendered conductive according to the bank access to amplify the address signal transmitted via address data bus 50c. A latch circuit L400 retains the output of amplify circuit R400. The output from latch circuit L400 is applied to a redundancy determination circuit RD400. As a result, a redundancy activation signal is applied to driver circuit DV400. When any redundancy activation signal is rendered active, a row/column identification signal indicating whether the current address is a row address or a column address, and a bank identification signal indicating which bank the current specified bank is output.

The output from driver circuit DV400 is retained by a level holding circuit LH400 to activate the redundant memory array of respective corresponding banks.

The output of redundancy determination circuit RD400 is also applied to an OR circuit OR400. When access is effected to the replaced memory array, a hit signal from OR circuit OR400 is output to render the output of a corresponding predecoder inactive.

Figure 29:
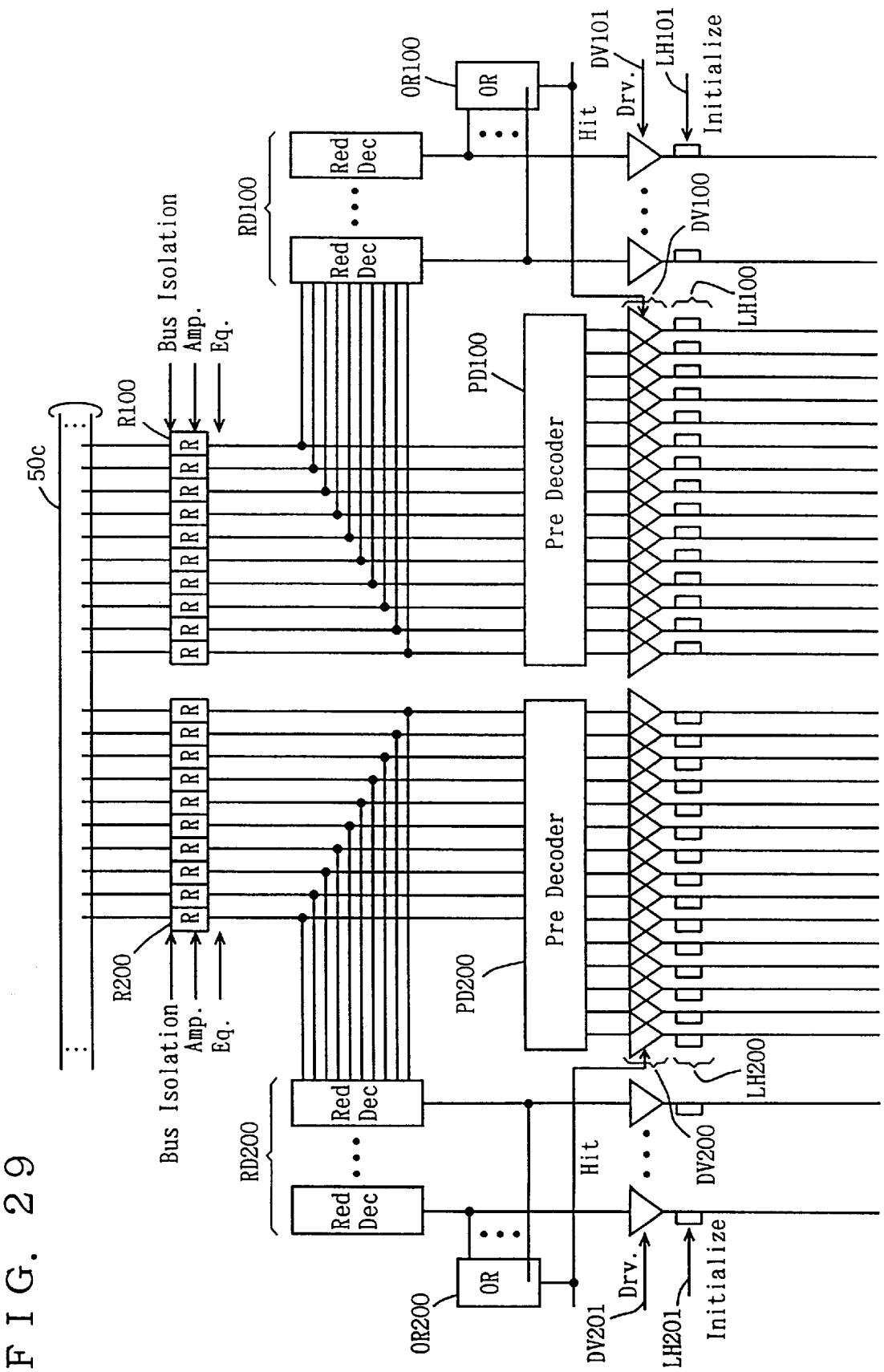
FIG. 29 is a schematic block diagram showing a structure of a row redundancy determination circuit unit and a row predecoder unit of the fourth embodiment at an early stage of development.

FIG. 29 is a schematic block diagram showing a structure of a row-oriented redundancy determination circuit unit and a row predecoder unit of the fourth embodiment at the early stage of development.

The difference lies in that a row-oriented redundancy determination circuit is provided for each bank in addition to the structure of FIG. 26.

Referring to FIG. 29, amplify circuits R100 and R200 provided corresponding to banks 0 and 1, respectively, are rendered active according to the bank access to retain the address signal transmitted through address data bus 50c. The output of amplify circuits R100 and R200 is applied to redundancy determination circuits RD100 and RD200, respectively, and also to predecoders PD100 and PD200, respectively. The predecoded result is applied to respective driver circuits DV100 and DV200.

The output from driver circuits DV100 and DV200 is retained by level holding circuits LH100 and LH200, respectively, to be output to a row predecoder line of a corresponding bank.

The output of redundancy determination circuits RD100 and RD200 is applied to driver circuits DV101 and DV201, respectively, to be retained by level holding circuits LH100 and LH200, respectively. The output of level holding circuits LH100 and LH200 render the main word line active. The output of redundancy determination circuits RD100 and RD200 is also applied to OR circuits OR100 and OR200, respectively. When the spare main word line is rendered active, a hit signal is output to render the output of predecoders PD100 and PD200 inactive.

Figure 30:
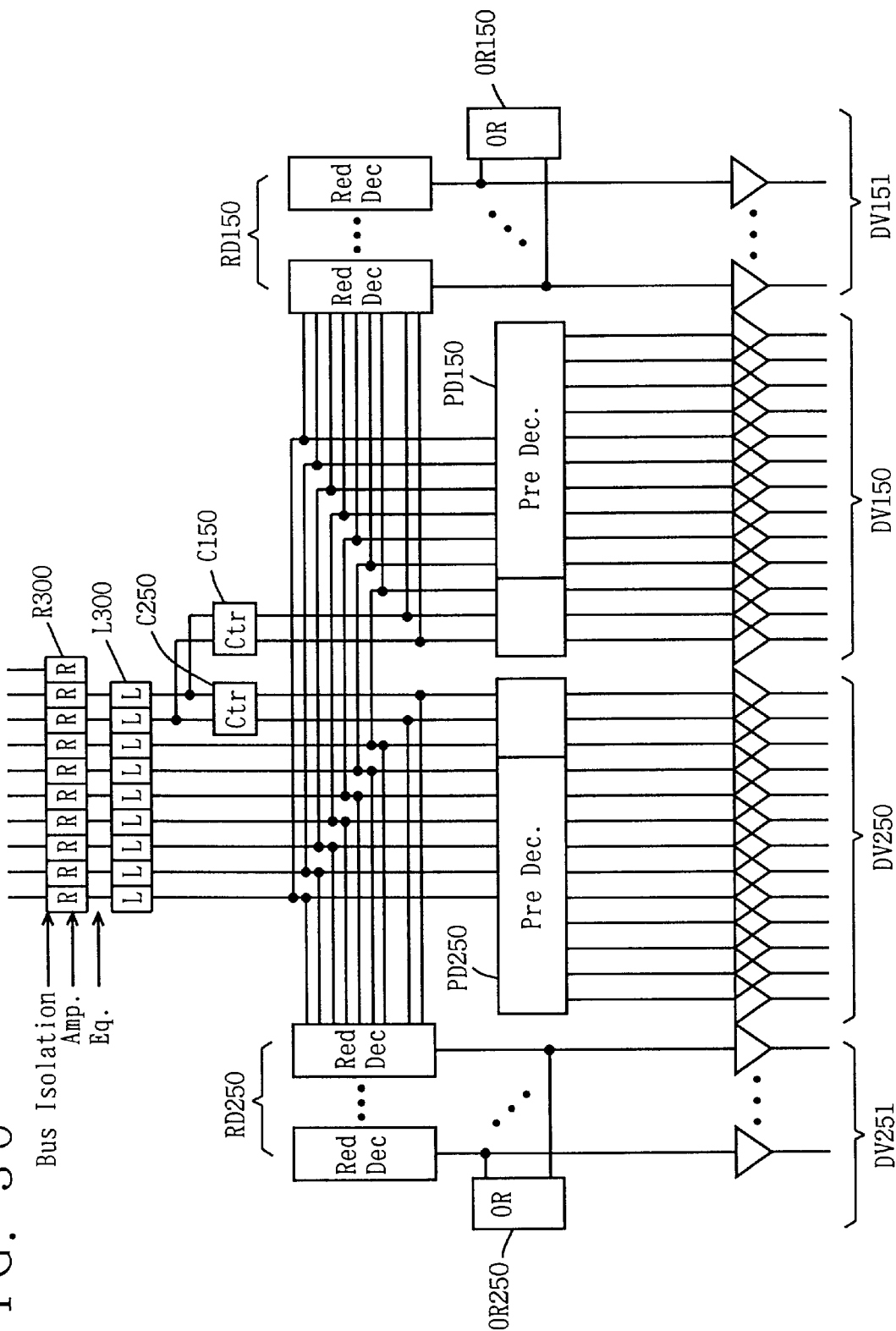
FIG. 30 is a schematic block diagram showing a structure of a column redundancy determination circuit unit and a column predecoder unit of the fourth embodiment at an early stage of development.

FIG. 30 is a schematic block diagram showing a structure of a column-oriented redundancy determination circuit unit and column predecoder unit of the fourth embodiment at the early stage of development.

Referring to FIG. 30, an amplify circuit R300 is provided corresponding to bank 0. Amplify circuit R300 is rendered active according to the bank access to amplify the address signal transmitted through address data bus 50c. The output of amplify circuit R300 is retained by a latch circuit L300 and applied to redundancy determination circuits RD150 and RD250 and also to predecoders PD150 and PD250. The predecoded result from predecoders PD150 and PD250 is applied to driver circuits DV150 and DV250, respectively. The output of latch circuit L300 is partially applied to counter circuits C150 and C250 to count for a burst operation.

The output from driver circuits DV150 and DV250 is output to a column predecoder line of a corresponding bank.

The output of redundancy determination circuit RD150 and RD250 is applied to driver circuits DV151 and DV251, respectively. The output of driver circuits DV151 and DV251 activates the spare column line. The output of redundancy determination circuits RD150 and RD250 is applied to OR circuits OR150 and OR250, respectively. When the spare column line is rendered active, a hit signal is issued to render the output of predecoders PD150 and PD250 inactive.

Circuitry similar to that of FIG. 30 is provided with respect to bank 1. The arrangement of the redundancy determination circuit on a chip in a semiconductor memory device will be described in comparison between the early stage of development and the mass production stage.

Figure 31:
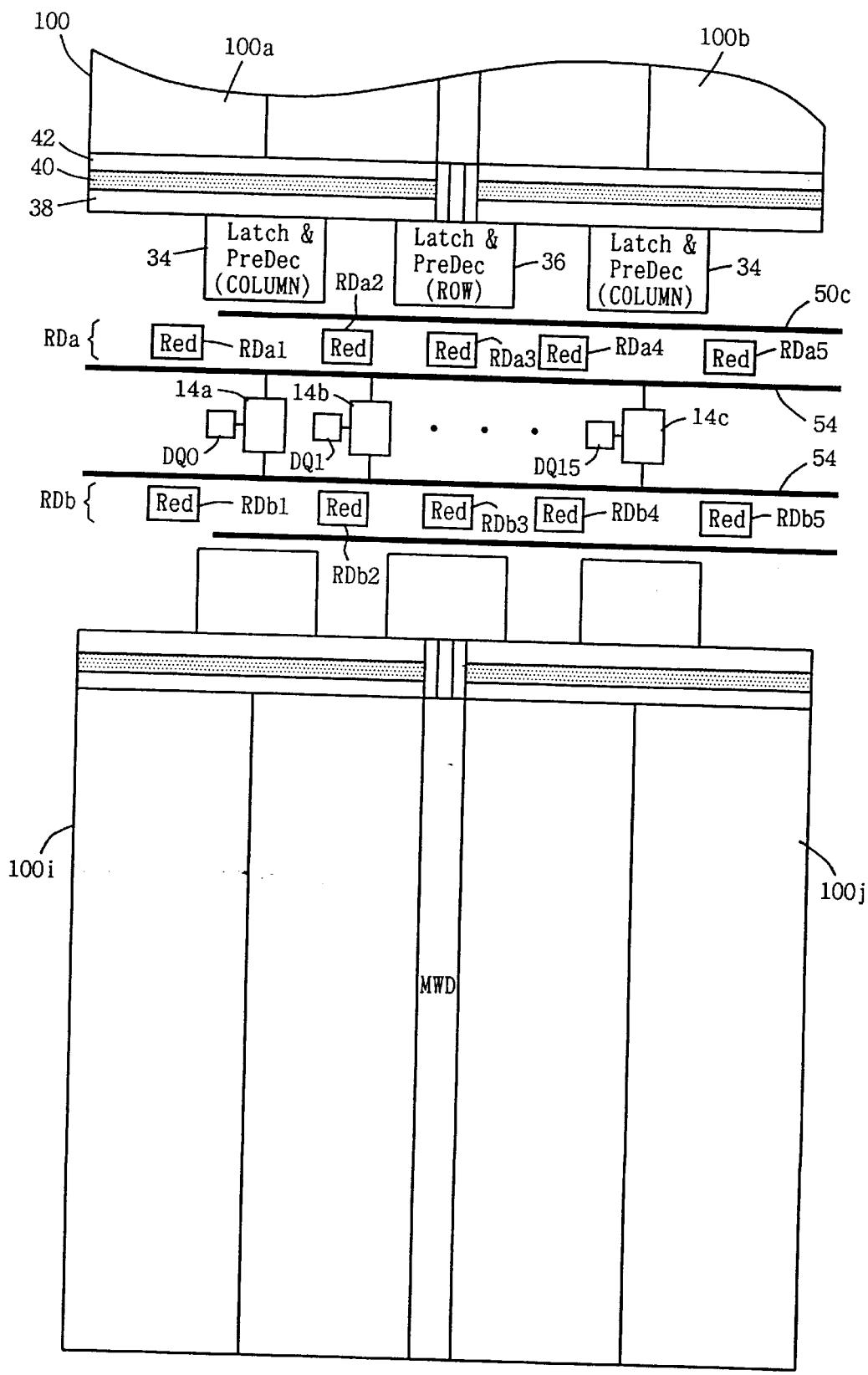
FIG. 31 is a schematic block diagram showing an arrangement of a redundancy determination circuit unit for a row and column of the fourth embodiment at an early stage of development.

FIG. 31 is a schematic block diagram showing an arrangement of row-oriented and column-oriented redundancy determination circuit units of the fourth embodiment at the early stage of development.

FIG. 31 shows the enlargement of the region sandwiched by memory blocks 100a and 100i of FIG. 1. Elements corresponding to those of FIG. 1 have the same reference characters allotted, and description thereof will not be repeated.

At the early stage of development, the semiconductor memory device of FIG. 31 includes redundancy determination circuit groups RDa1–RDa5 provided corresponding to banks 100a and 100b, and redundancy determination circuit groups RDb1–RDb5 provided corresponding to banks 100i and 100j. Redundancy determination circuits RDa1 and RDa2 are provided corresponding to column predecoder 34 of bank 100a. Redundancy determination circuits RDa4 and RDa5 are provided corresponding to column predecoder 34 of bank 100b. Redundancy determination circuit RDa3 is provided corresponding to row predecoder 34 that is provided common to banks 100a and 100b. Similarly, redundancy determination circuits RDb1 and RDb2 are provided corresponding to the column predecoder of bank 100i. Redundancy determination circuits RDb4 and RDb5 are provided corresponding to the column predecoder of bank 100j. Redundancy determination circuit RDb3 is provided corresponding to the row predecoder that is provided common to banks 100i and 100j.

Figure 32:
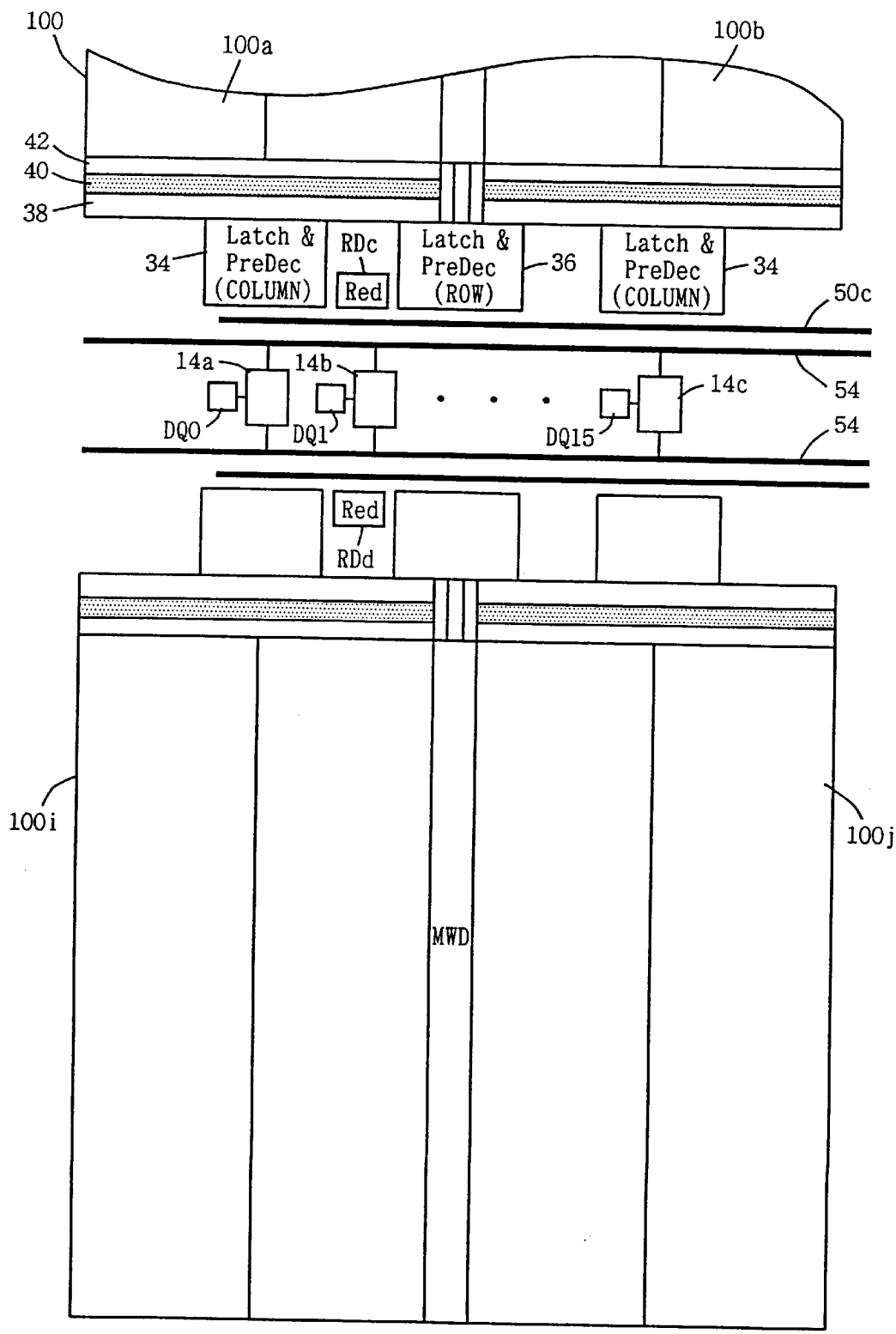
FIG. 32 is a schematic block diagram showing an arrangement of a redundancy determination circuit unit for a row and column of the fourth embodiment at a mass production stage.

FIG. 32 is a schematic block diagram showing the arrangement of row-oriented and column-oriented redundancy determination circuit units of the fourth embodiment at the mass production stage.

The structure of FIG. 32 differs from the structure of FIG. 31 in that a redundancy determination circuit RDc is provided instead of redundancy determination circuit group RDa and that a redundancy determination circuit RDd is provided instead of redundancy determination circuit group RDb.

Redundancy determination circuit RDc is provided common to banks 100a and 100b for both rows and columns. Redundancy determination circuit RDd is provided common to banks 100i and 100j for both rows and columns.

It is appreciated that the chip size can be reduced than that of FIG. 31 by reducing the number of redundancy determination circuits by the common usage of the redundancy determination circuit at the mass production stage.

Figure 33:
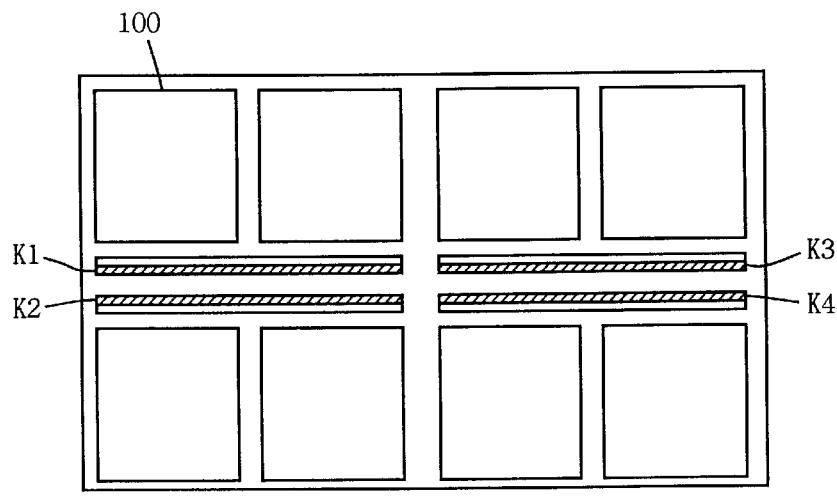
FIG. 33 is a schematic block diagram showing an arrangement of a redundancy determination circuit unit for a row and column on a chip according to the fourth embodiment at an early stage of development.

FIG. 33 is a schematic block diagram showing the arrangement of row-oriented and column-oriented redundancy determination circuit units of the fourth embodiment at the early stage of development.

Referring to FIG. 33, the redundancy determination circuit group is arranged in regions K1–K4 at the center area in the direction of the shorter side of the chip. By reducing the number of redundancy determination circuits at the mass production stage, the area corresponding to regions K1–K4 can be reduced. In other words, the length of the chip in the shorter side direction can be reduced.

By the above-described structure of the fourth embodiment, the chip repair rate can be improved at the development stage whereas circuit modification directed to reduction in chip area can be carried out at a short time in the mass production stage.

Fifth Embodiment

Figure 34:
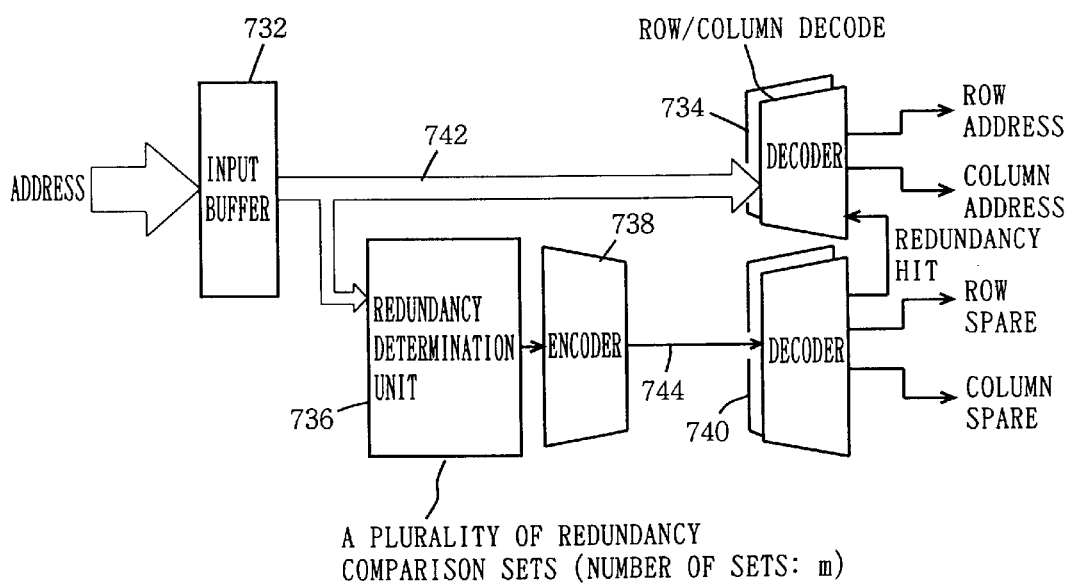
FIG. 34 is a schematic diagram for describing a structure of a redundancy determination circuit according to a fifth embodiment of the present invention.

FIG. 34 is a schematic diagram for describing a structure of a redundancy determination circuit according to a fifth embodiment of the present invention.

In contrast to the previous first to fourth embodiments in which the redundancy determination circuit including a fuse element is located in the neighborhood of each bank including the redundant memory array, the redundancy determination circuits of the fifth embodiment are gathered together at a site remote from each bank (for example in the proximity of an input buffer receiving an externally applied address).

Referring to FIG. 34, the semiconductor memory device of the fifth embodiment includes an input buffer 732 for receiving an externally applied address, an address bus 742 to which an address from input buffer 732 is applied, and a row/column decoder 734 receiving and decoding the address from address bus 742 to output a row address/column address to each memory bank. Address bus 742 may be an address bus through which a row address and a column address are transmitted in common as described in the first to fourth embodiments, or address buses that transmit a row address and a column address, respectively.

The semiconductor memory device further includes a redundancy determination unit 736 comparing the address received from address bus 742 with a plurality of specified replacement addresses to determine whether redundancy replacement is to be effected or not, an encoder 738 for encoding the determination signal output from redundancy determination unit 736, a replacement signal bus 744 receiving an encoded determination signal, and a spare decoder 740 receiving the determination signal from replacement signal bus 744 to activate a row related spare select signal line or a column related spare select signal line.

Figure 35:
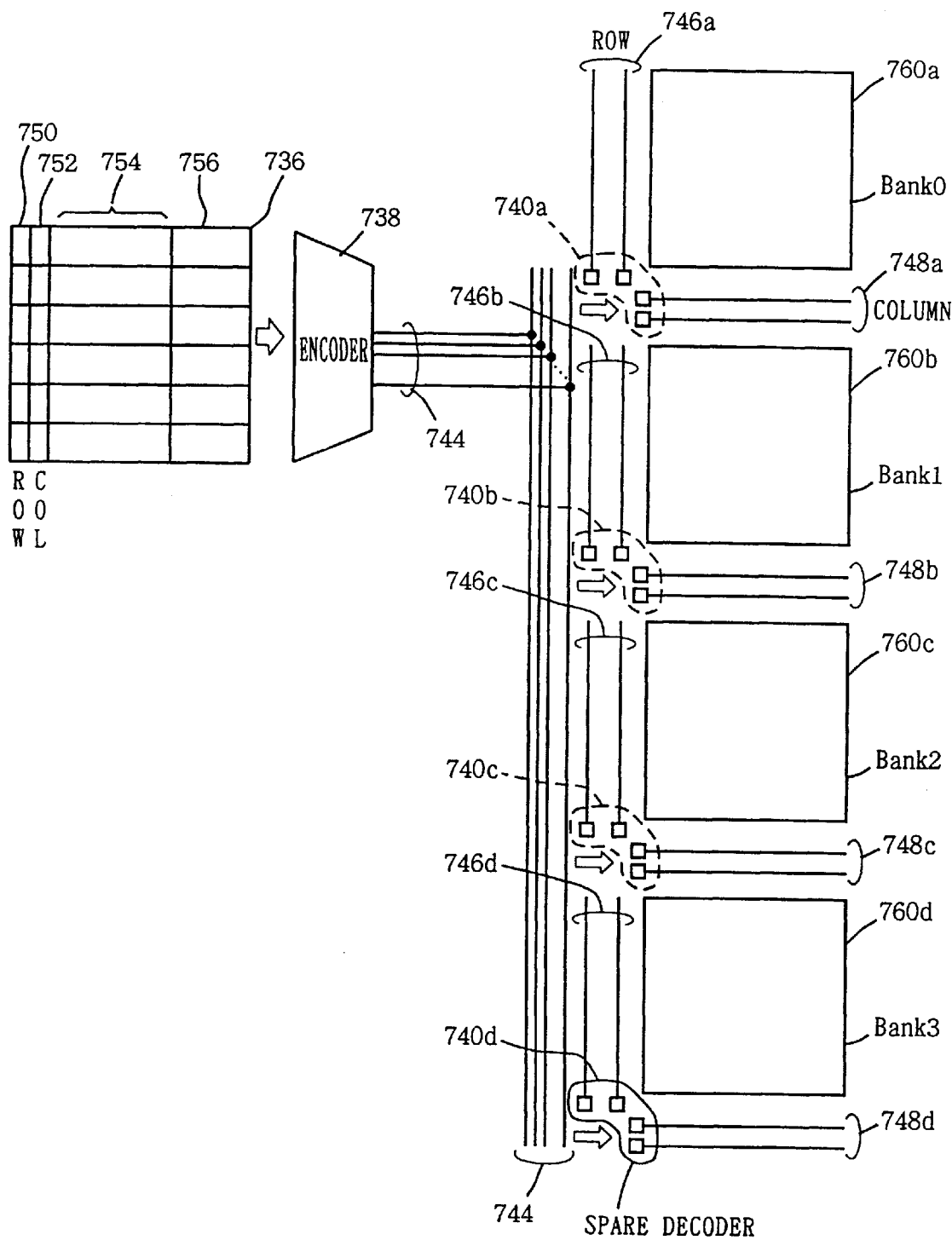
FIG. 35 is a schematic block diagram for describing connection between a redundancy determination circuit and a memory bank in the fifth embodiment.

FIG. 35 is a schematic block diagram for describing connection between a redundancy determination circuit and a memory bank according to the fifth embodiment.

For the sake of simplification, FIG. 35 shows a structure with four memory banks 760a, 760b, 760c and 760d.

The semiconductor device of the fifth embodiment includes a redundancy determination unit 736 receiving an externally applied address to carry out redundancy determination, an encoder 738 for receiving and encoding the output of redundancy determination unit 736, a replacement signal bus 744 to which encoder 738 outputs a redundancy determination result, spare decoders 740a, 740b, 740c and 740d provided corresponding to memory banks 760a, 760b, 760c an 760d, respectively, to decode the replacement address from replacement bus 744, and row related spare select signal lines 746a, 746b, 746c and 746d.

The semiconductor memory device further includes column related spare select signal lines 748a, 748b, 748c and 748d provided corresponding to memory banks 760a, 760b, 760c and 760d, respectively.

Redundancy determination unit 736 includes a program unit 750 for setting a row access, a program unit 752 for setting a column access, a program unit 754 for setting an address, and a program unit 756 for specifying which bank has the redundant array to be used. FIG. 35 shows that 6 sets of replacement addresses can be set in redundancy determination unit 736.

Figure 36:
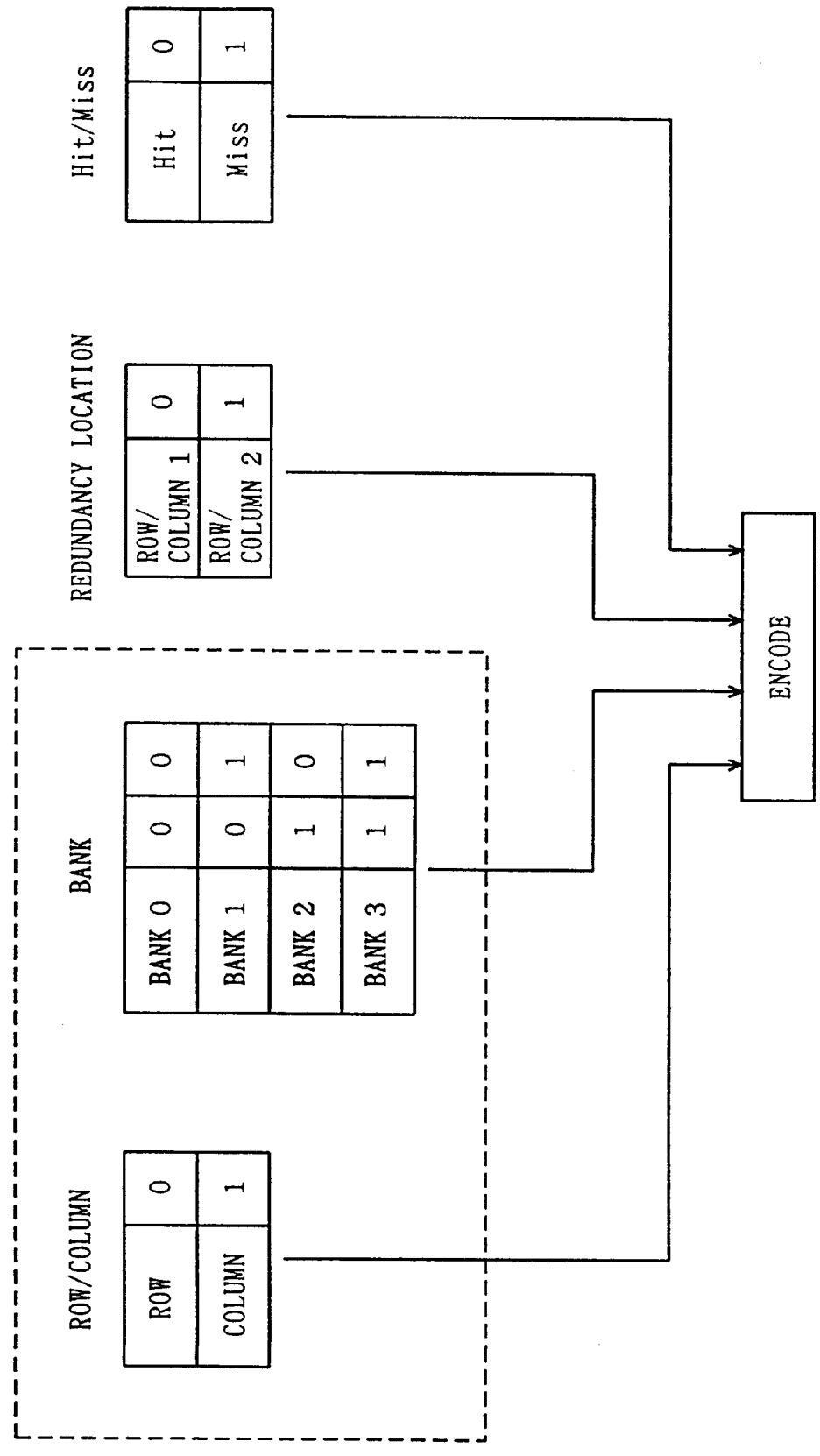
FIG. 36 is a diagram for describing an example of encoding in the fifth embodiment.

FIG. 36 is a diagram for describing an example of encoding in the fifth embodiment.

FIG. 36 shows the contents of an encoded redundancy determination signal having a total of 5 bits, i.e. 1 bit for setting definition of row access or column access, two bits used for defining which bank has the redundant memory array to be used, 1 bit for redundancy location, and 1 bit as a hit signal. It is to be noted that the signal defining a row or column access and the signal indicating the bank address do not have to be included in the replacement bus since they are applied to each bank together with the address.

Also, since there are a total of 16 spare select signal lines, two lines for the row and two lines for the column with respect to each bank, 4 bits to represent the location thereof and one bit for transmitting a hit signal, i.e., a total of 5 bits, can be transmitted through the replacement bus.

In the above-described case where the redundancy determination units are arranged together and remote from each memory bank, the number of lines for the replacement bus can be reduced by encoding the determination signal and transmitting the signal to the spare decoder of each bank. Thus, the chip size can be reduced.

Sixth Embodiment

According to a sixth embodiment of the present invention, a structure associated with redundancy determination where an input address is applied to a semiconductor memory device through packet communication will be described hereinafter.

Figure 37:
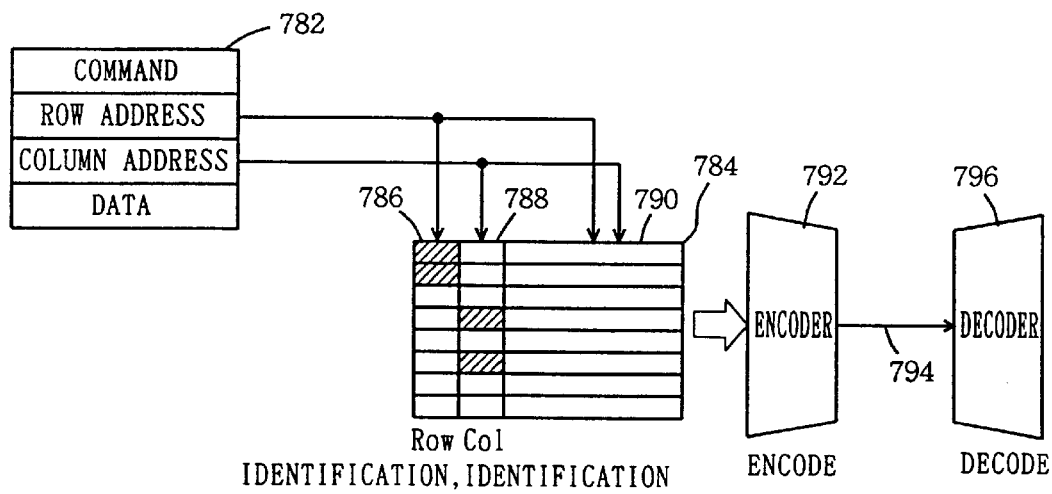
FIG. 37 is a schematic block diagram for describing a structure of a redundancy determination circuit according to a sixth embodiment of the present invention.

FIG. 37 is a schematic block diagram for describing a structure of a redundancy determination circuit according to the sixth embodiment.

Referring to FIG. 37, a packet 782 including a command, a row address, a column address, and data is applied to the semiconductor memory device. The semiconductor memory device of the sixth embodiment includes a redundancy determination unit 784 receiving packet 782, an encoder 792 for encoding the determination result output from redundancy determination unit 784, a bus 794 for transmitting the determination result to the neighborhood of each bank, and a decoder 796 for receiving and decoding the encoded determination result from bus 794. Decoder 796 activates the spare select signal line that selects the redundant memory array provided in each bank.

Redundancy determination unit 784 includes a row identification unit 786 indicating that the set address is a row address, a column identification unit 788 indicating that the set address is a column address, and an address set unit 790 for setting the row address or column address to be replaced. 8 sets of redundancy addresses are set in FIG. 37. The first and second addresses from the top are set as row addresses. The fourth and sixth addresses are set as column addresses.

Figure 38:
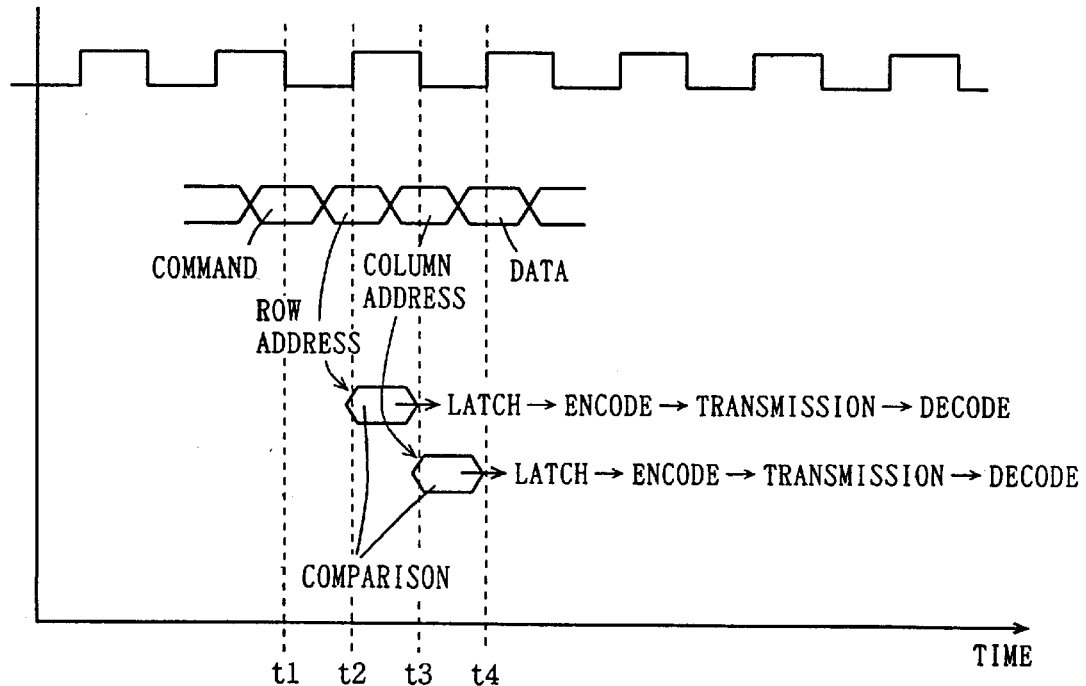
FIG. 38 is an operation waveform diagram for describing an operation of the redundancy determination circuit of FIG. 37.

FIG. 38 is an operation waveform diagram for describing the operation of the redundancy determination circuit of FIG. 37.

Referring to FIGS. 37 and 38, a command is input to the semiconductor memory device at the falling edge of the clock at time t1 when an externally applied command is input.

At time t2, a row address is input at the rising edge of the clock. In response, each address in address set unit 790 having the specification of a row address in row identification unit 786 of redundancy determination unit 784 is compared with the input address. In the case of an address to be replaced, the steps of latching, encoding, transmitting, and decoding are carried out, whereby the redundant memory array corresponding to the specified bank is activated.

At time t3, a column address is input at the falling edge of the clock. In response, each address in address set unit 790 having the specification of a column address in column identification unit 788 in redundancy determination unit 784 is compared with the input address. In the case of an address to be replaced, the steps of latching, encoding, transmitting, and decoding are carried out, whereby the redundant memory array corresponding to the specified bank is activated.

The redundancy determination unit is divided into the redundancy determination unit that compares the input row address and the redundancy determination unit that compares the column address for implementation of a comparison operation. The time required to precharge the common node of each address comparison unit can be reduced to allow high speed operation.

A modification set forth in the following is allowed.

Figure 39:
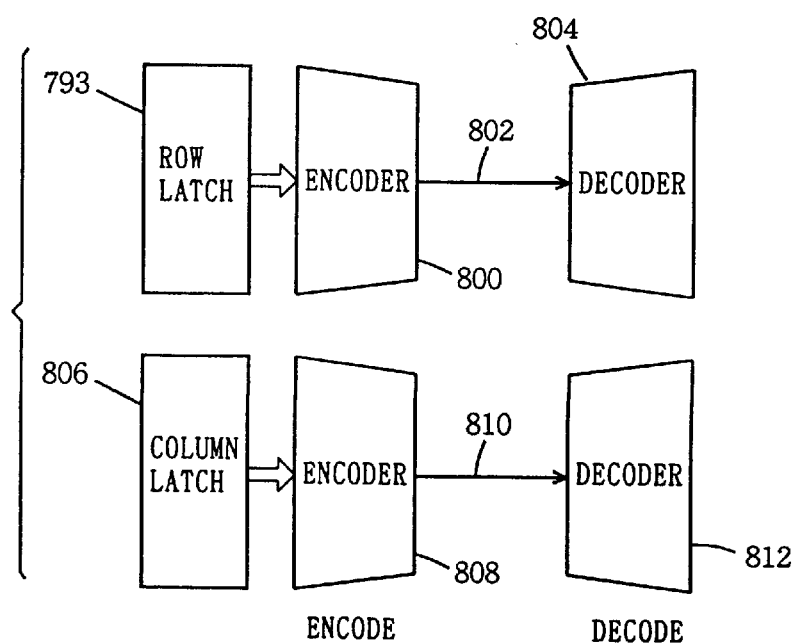
FIG. 39 is a simplified diagram for describing a modification of the sixth embodiment.

FIG. 39 is a diagram for describing a modification of the sixth embodiment.

As shown in FIG. 39, the redundancy determination result of the row address can be latched at the current stage by a row latch 793, encoded by a row replacement encoder 800, transmitted through row replacement bus 802, and decoded by a row replacement decoder 804 of each bank, whereas the redundancy determination result of the column address is, independent of the row address, latched by a column latch 806 at the current stage, encoded by a column replacement encoder 808, transmitted through a column replacement bus 810, and decoded by a column replacement decoder 812 of each bank.

Seventh Embodiment

Figure 40:
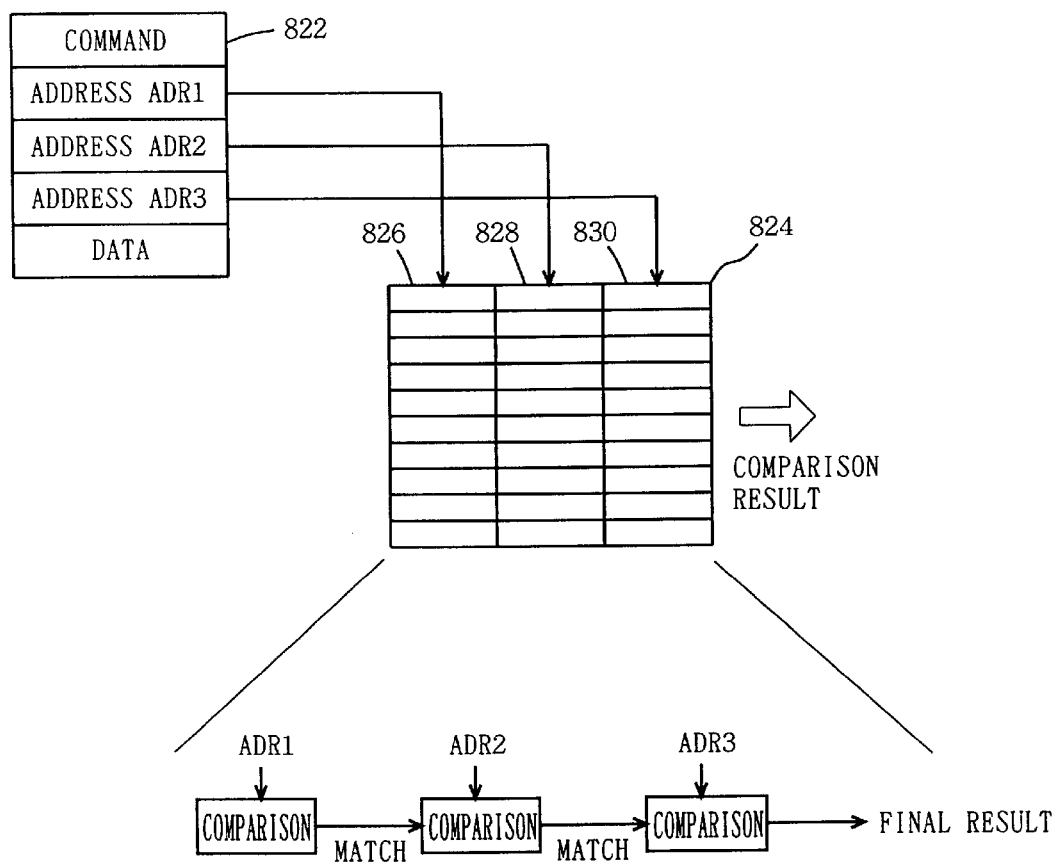
FIG. 40 is a schematic block diagram for describing a structure of a redundancy determination circuit according to a seventh embodiment of the present invention.

FIG. 40 is a schematic block diagram for describing a structure of the redundancy determination unit according to a seventh embodiment of the present invention.

The seventh embodiment differs from the sixth embodiment in that one address is divided into a plurality of data and input by packet communication.

Referring to FIG. 40, a packet 822 including a command, address, and data is applied to the semiconductor memory device. The address in packet 822 is divided into three regions. Assuming that the address corresponds to 13 bits, the most significant 3 bits are input as address ADR1, the more significant fourth to eighth bits are input as an address ADR2, and the least significant 5 bits are input as an address ADR3. Redundancy determination unit 824 includes an address set unit 826 for setting address ADR1, and an address set unit 828 for setting address ADR2, and an address set unit 830 for setting address ADR3.

First, address ADR1 is compared with the set content of address set unit 826. When there is an address matching the set content, then address ADR2 is compared with the set content of address set unit 828. When the set address matches, then address ADR3 is compared with the set content of address set unit 830. When the set content matches address ADR3, a result designating redundancy replacement is output.

Figure 41:
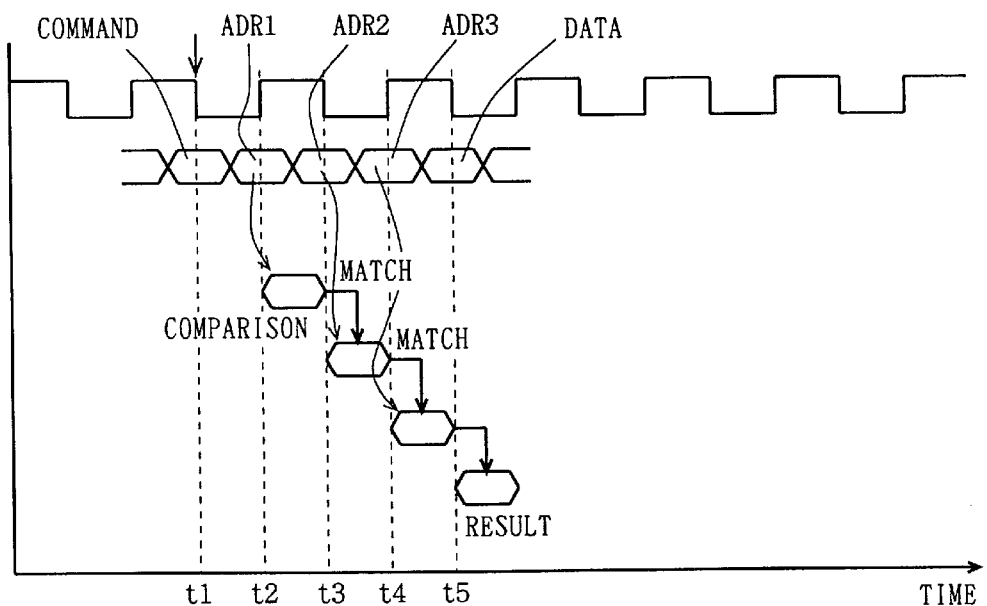
FIG. 41 is an operation waveform diagram for describing an operation of the redundancy determination circuit of FIG. 40.
Figure 42:
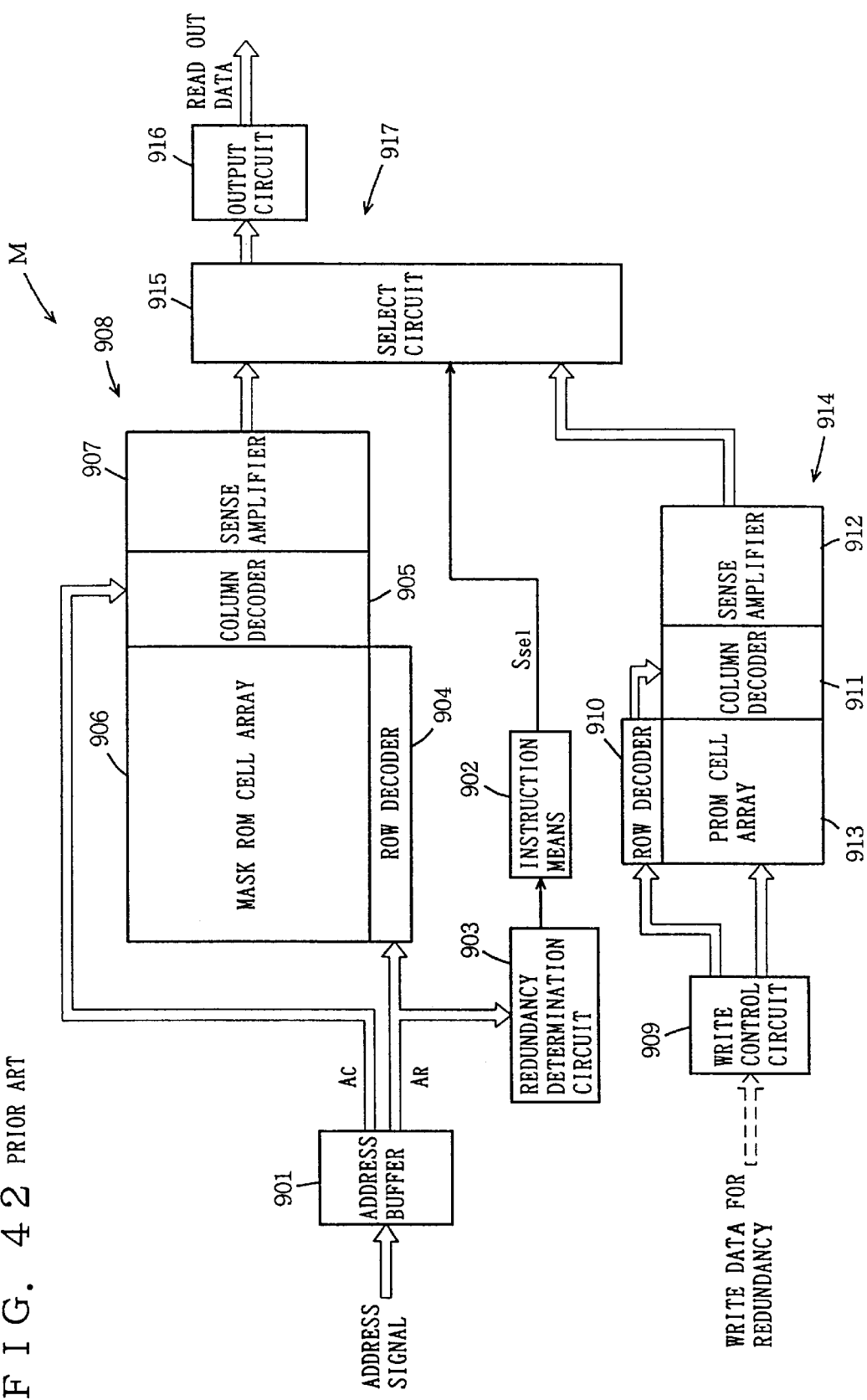
FIGS. 42, 43 and 44 are first, second, and third examples, respectively of a semiconductor memory device with a conventional redundant memory cell.
Figure 43:
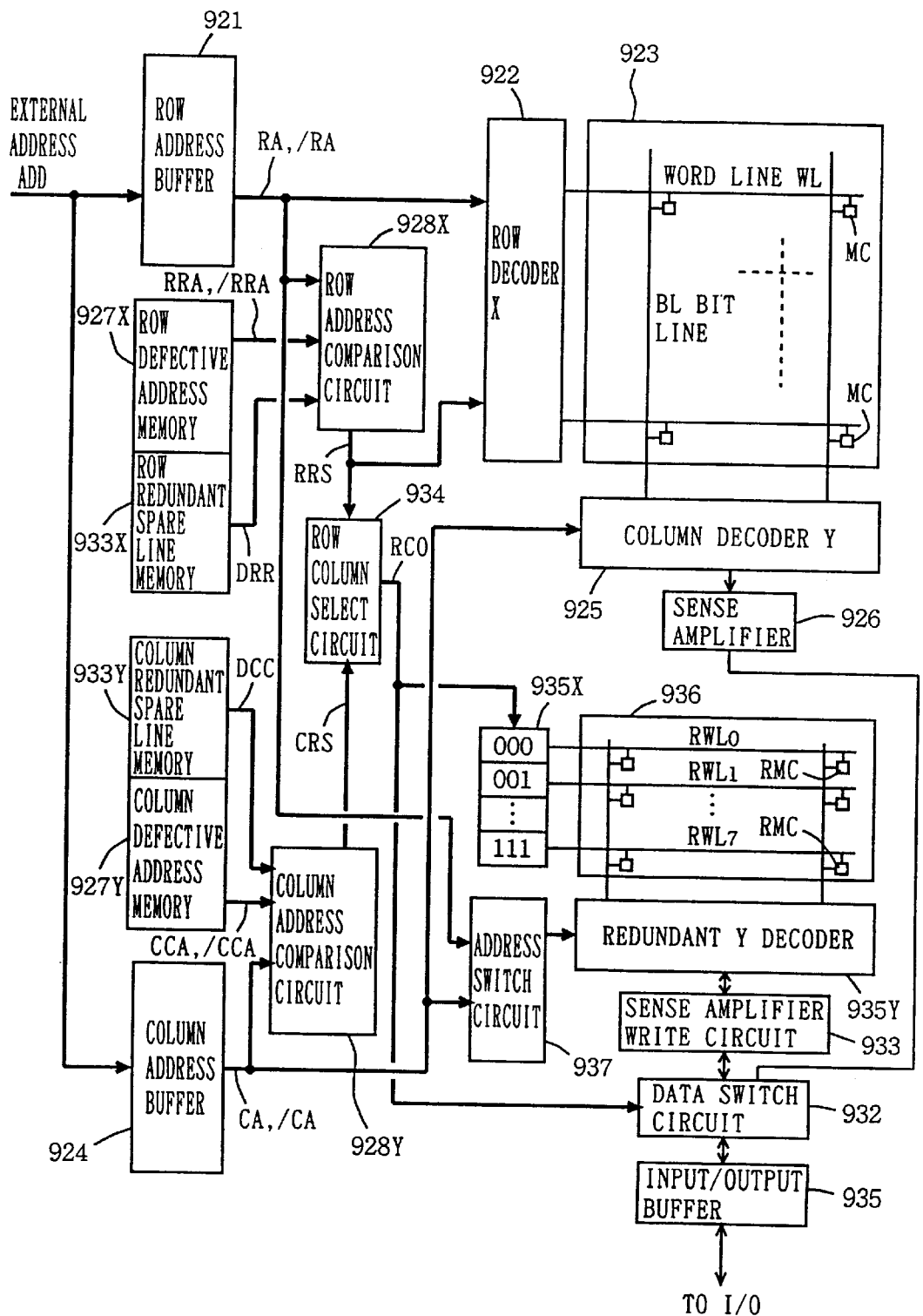
Figure 44:
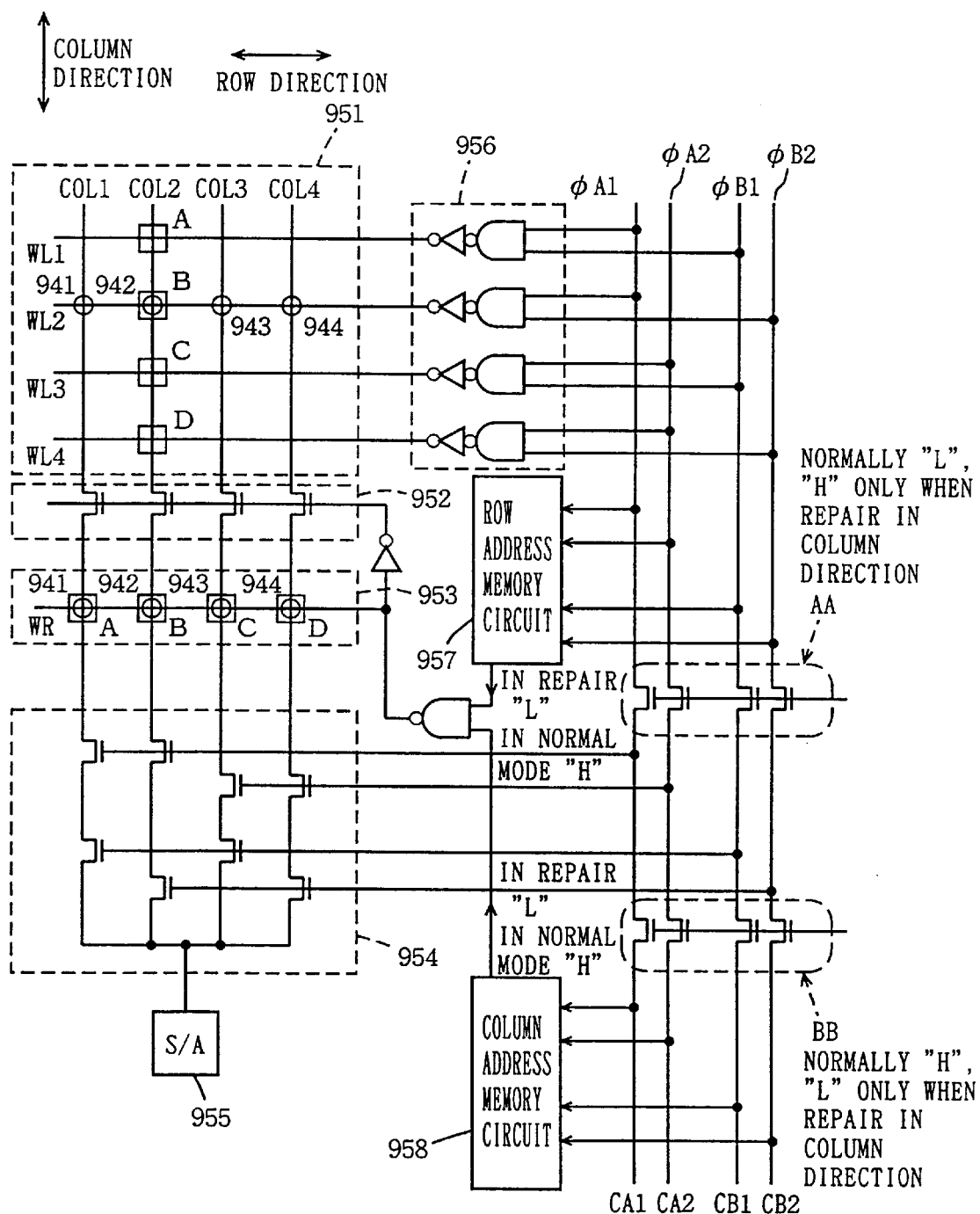

FIG. 41 is an operation waveform diagram for describing the operation of the redundancy determination unit of FIG. 40.

Referring to FIGS. 40 and 41, an external command is input. At time t1, a command is input to the semiconductor memory device at the falling edge of the clock.

At time t2, address ADR1 corresponding to the most significant 3 bits is input at the rising edge of the clock. Then, the set address of address set unit 826 is compared with address ADR1. When the comparison matches, then a comparison between address ADR2 input at the falling edge of the clock with the set address of address set unit 828 is carried out at time t3. When the comparison matches, then a comparison is carried out between address ADR3 input at the rising edge of the clock and the set address of address set unit 830 at time t4. When the comparison matches, redundancy determination unit 824 outputs a signal that activates a corresponding redundant memory array as the result.

In the case where an address is divided and input, replacement with a redundant memory array can be effected by sequentially comparing the divided addresses and providing an activation signal of a corresponding redundant memory array and a hit signal when all the comparison results match.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a plurality of memory cell blocks each including a plurality of regular memory cells;
    a redundant memory cell; and
    a redundancy determination circuit provided in common to at least two of said plurality of memory cell blocks and controlled by a block signal for discriminating from said at least two of said plurality of memory cell blocks, to activate a select operation of the redundant memory cell when an address signal matches a preset defective address in said plurality of regular memory cells.

2. The semiconductor memory device according to claim 1, wherein
    said plurality of regular memory cells are arranged in rows and columns;
    said semiconductor memory device comprises a redundant row of redundant memory cells including the redundant memory cell; and
    the block signal associated with a row address signal.

3. The semiconductor memory device according to claim 1, wherein
    said plurality of regular memory cells are arranged in rows and columns;
    said semiconductor memory device comprises a redundant column of redundant memory cells including the redundant memory cell; and
    the block signal associated with a column address signal.

4. The semiconductor memory device according to claim 1, wherein
    said plurality of memory cell blocks respectively constitute a plurality of banks; and
    the block signal is included in a bank address signal.

5. A semiconductor memory device comprising:
    a plurality of memory cell blocks each including regular memory cells and redundant memory cells;
    a plurality of program circuits each for programming a defective address in the regular memory cells and comparing an address signal with the defective address;
    an encoder for changing an accessed block in response to the comparison results of said plurality of program circuits; and
    a plurality of decoders provided corresponding to said plurality of memory cell blocks, each for decoding an output from said encoder and selecting the redundant memory cell in a corresponding memory cell block according to the decoding result.

6. A semiconductor memory device comprising:
    a plurality of memory cell blocks each including a plurality of regular memory cells arranged in rows and columns and a redundant row of redundant memory cells; and
    a redundancy determination circuit provided in common to at least two of said plurality of memory cell blocks and controlled by a block signal for discriminating from said at least two of said plurality of memory cell blocks, to activate a select operation of the redundant row when an address signal matches a preset defective address in said plurality of regular memory cells.

7. A semiconductor memory device comprising:
    a plurality of memory cell blocks each including regular memory cells and redundant memory cells;
    a plurality of program circuits each for programming a defective address in the regular memory cells and comparing an address signal with the defective address;
    a logic circuit for changing an accessed block in response to the comparison results of said plurality of program circuits; and
    a plurality of decoders provided corresponding to said plurality of memory cell blocks, each for decoding an output from said logic circuit and selecting the redundant memory cell in a corresponding memory cell block according to the decoding result.

8. A semiconductor memory device comprising:
    a plurality of memory cell blocks each including regular memory cells and redundant memory cells;
    a redundancy determination unit including a redundancy program circuit for programming a defective address in the regular memory cells and comparing an address signal with the defective address;
    an encoder for changing an accessed block in response to the comparison results of said redundancy determination unit; and
    a plurality of decoders provided corresponding to said plurality of memory cell blocks, each for decoding an output from said encoder and selecting the redundant memory cell in a corresponding memory cell block according to the decoding result.

9. The semiconductor memory device according to claim 8, wherein said redundancy program circuit includes a setting unit holding information designating said corresponding memory cell block.

10. The semiconductor memory device according to claim 8, wherein said redundancy memory cells are arranged in rows and columns,
    said redundancy program circuit including
    a row setting unit holding information designating one of said rows, and
    a column setting unit holding information designating one of said columns.

11. The semiconductor memory device according to claim 8, wherein said redundancy memory cells are arranged in rows and columns,
    said redundancy program circuit including a row/column setting unit holding information designating which of said redundant memory cell in said row and said redundant memory cell in said column is to be used.

12. A semiconductor memory device comprising:
- a plurality of memory blocks of which stored data is accessible according to an external signal transmitting information including first and second extraction codes;
- a plurality of redundancy units for operating in place of a defective portion present in said plurality of memory blocks; and
- a redundancy determination unit determining usage of said plurality of redundancy units, including a plurality of first program units and a plurality of second program units,
- said redundancy determination unit extracting a first portion from said plurality of first program units according to said first extraction code and extracting a second portion from said plurality of second program units according to said second extraction code, and determining one of said plurality of redundancy units corresponding to said external signal according to said extracted first and second portions.

13. The semiconductor memory device according to claim 12, wherein
- each of said plurality of memory blocks includes a plurality of memory cells arranged in rows and columns,
- said plurality of redundancy units are divided into first and second groups,
    - said first group including a plurality of redundant rows used as a replacement for a portion of said rows,
    - said second group including a plurality of redundant columns used as a replacement for a portion of said columns,
- said plurality of second program units are provided corresponding to respective said plurality of first program units,
- said first extraction code is an identification code indicative of difference between a row and a column,
- said second extraction code is an address identification code indicative of one of a row address and a column address.

14. The semiconductor memory device according to claim 13, wherein
- said external signal includes a first address firstly transmitted and a second address secondly transmitted,
- said first extraction code specified in the transmitting order of said first and second addresses,
- said second extraction code is specified by said first and second addresses,
- said plurality of second program units are provided corresponding to respective said plurality of first program units, and
- said redundancy determination unit identifies a program unit which is said second program unit corresponding to said extracted first portion and belongs to said extracted second portion, and selects from said first group a redundant row corresponding to said identified program unit when said first extraction code indicates a row, and selects from said second group a redundant column corresponding to said identified program unit when said first extraction code indicates a column.

15. The semiconductor memory device according to claim 14, wherein
- said first address is a row address, and
- said second address is a column address.

16. The semiconductor memory device according to claim 12, wherein said plurality of first and second program units store information corresponding to said defective portion in a non-volatile manner.

17. The semiconductor memory device according to claim 12, wherein said redundant determination unit carries out extraction of said first portion from said plurality of first program units according to said first extraction code in a first operation cycle, and carries out extraction of said second portion from said plurality of second program units in a second operation cycle initiated after said first operation cycle.

18. The semiconductor memory device according to claim 17, wherein
- said external signal includes an address signal having a plurality of signal bits,
- said first extraction code corresponds to a first portion among said plurality of signal bits,
- said second extraction code corresponds to a second portion differing from said first portion among said plurality of signal bits.

* * * * *